United States Patent [19]

Cassidy et al.

[11] Patent Number: 5,343,426

[45] Date of Patent: Aug. 30, 1994

[54] DATA FORMATER/CONVERTER FOR USE WITH SOLID-STATE DISK MEMORY USING STORAGE DEVICES WITH DEFECTS

[75] Inventors: Charles Cassidy; Paul Kemp, both of Northboro, Mass.

[73] Assignee: Digital Equipment Corporation, Maynard, Mass.

[21] Appl. No.: 897,164

[22] Filed: Jun. 11, 1992

[51] Int. Cl.$^5$ .............................................. H03M 13/00
[52] U.S. Cl. ........................... 365/189.02; 365/189.08; 365/230.06; 365/239; 371/37.1; 395/425
[58] Field of Search ...................... 365/189.02, 189.08, 365/230.06, 239; 371/37.1, 10.1; 395/425

[56] References Cited

U.S. PATENT DOCUMENTS

| | | | |
|---|---|---|---|
| 4,680,701 | 7/1987 | Cochran | 365/194 |
| 4,727,509 | 2/1988 | Johnson et al. | 395/425 |
| 5,077,737 | 12/1991 | Leger et al. | 371/10.1 |
| 5,107,503 | 4/1992 | Riggle et al. | 371/37.1 |

OTHER PUBLICATIONS

"Bus Size Independent Architecture", IBM TDB, vol. 28, No. 8, Jan./1986, pp. 3579–3581.
W. Wesley Peterson and E. J. Weldon, Jr., Error–Correcting Codes, Second Edition, 1972, pp. 262–317 & 350–373, The Massachusetts Institute of Technology.
LSI Logic Corporation, L64710 8-Error Correcting Reed–Solomon Codec Preliminary, 1990, pp. 242–243.
Peter Alfke, et al., The Programmable Gate Array Data Book, 1989, pp. 1122 01–1122 02, XILINX.

*Primary Examiner*—Eugene R. LaRoche
*Assistant Examiner*—Viet Q. Nguyen
*Attorney, Agent, or Firm*—Denis G. Maloney; Albert P. Cefalo

[57] ABSTRACT

A computer system includes a main memory that is able to make use of DRAM memory devices having a relatively high level of bad cells (hard faults). An EDC circuit is provided which uses combinatorial logic to perform a BCH code type of error detection and correction. A primary feature is the recognition that due to use of high density integrated circuits—gate arrays—it is no longer necessary to use sequential logic to decode the multiple-bit error correcting codes. An EDC with 128-bits of data and a check bit field 41-bits wide, using a BCH code, constructed in ASIC sea-of-gates technology using about 87,000 logic gates, can correct 5-bits in error and can detect 6-bits in error. By using multiple-bit EDC in the controller for main memory, it is no longer necessary that all DRAM devices be ostensibly "perfect." A certain density of non-functional memory cells can be tolerated, yet the memory system will still return perfect data. The added cost of multiple-bit EDC, including the added cost of extra storage for the check bits and the EDC circuit itself, is more than compensated by reduced cost of the DRAMs. In a addition the computer system includes a solid-state disk type memory for a computer system is able to make use of DRAM memory devices having a relatively high level of bad cells (hard faults). An EDC circuit is employed to perform a Reed-Solomon code type of error detection and correction. A primary feature is the recognition that it is no longer necessary that all DRAM devices be ostensibly "perfect." A certain density of non-functional memory cells can be tolerated, yet the memory system will still return perfect data. The added cost of multiple-bit EDC, including the added cost of extra storage for the check bits and the EDC circuit itself, is more than compensated by reduced cost of the DRAMs. A preferred data formatter circuit to convert between symbol and word data is also described.

6 Claims, 21 Drawing Sheets

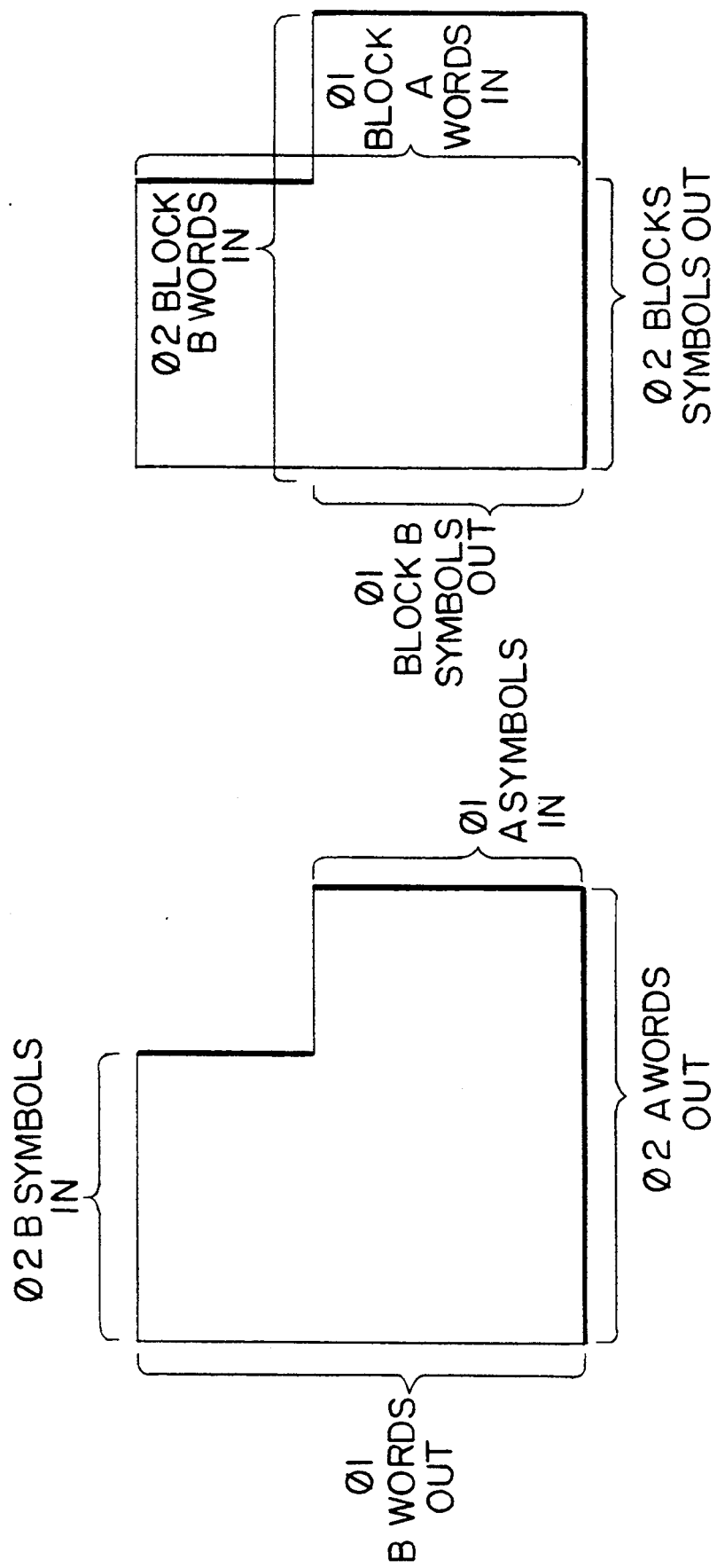

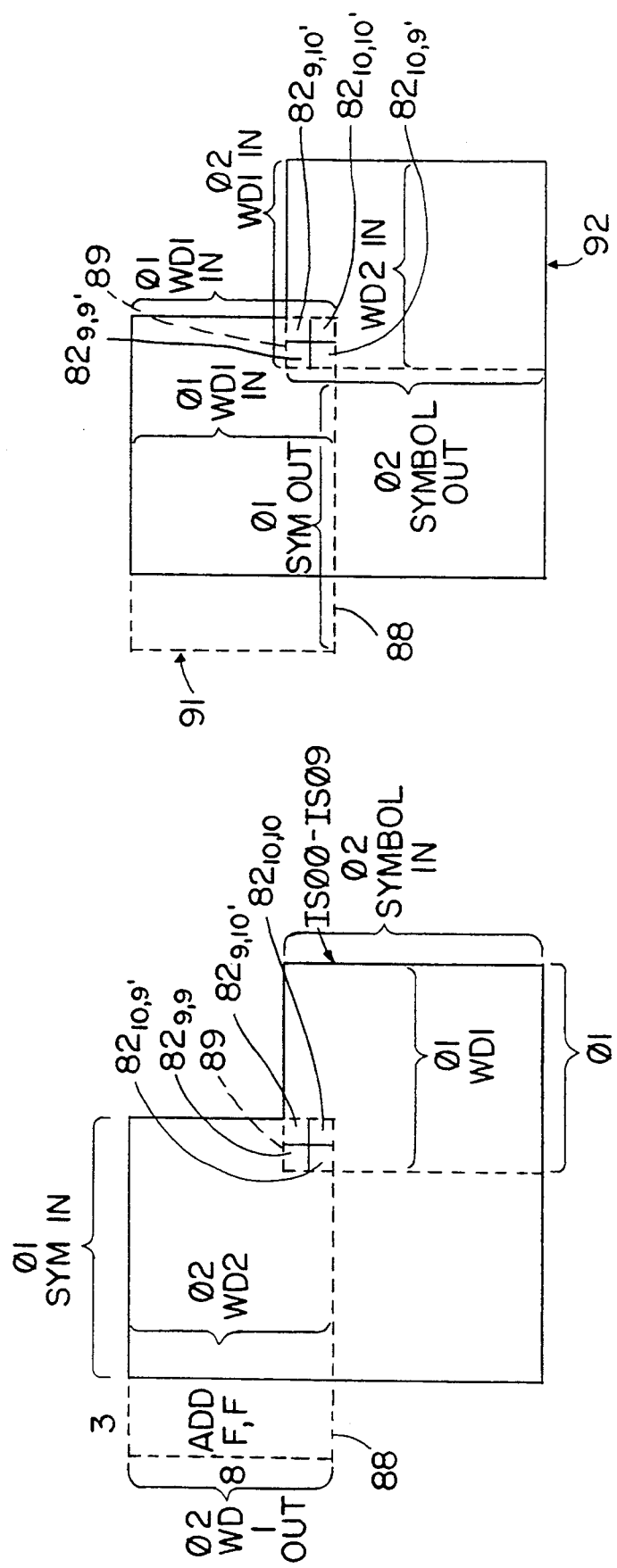

DATA FORMATER/CONVERTER FOR USE WITH SOLID-STATE DISK MEMORY USING STORAGE DEVICES WITH DEFECTS

BACKGROUND OF THE INVENTION

This invention relates generally to data storage systems for computers, and more particularly to a solid-state disk memory storage system.

As it is known in the art computer systems generally use several types of memory systems. For example, computer systems generally use so called main memory comprised of semiconductor devices typically having the attribute that the devices can be randomly written to and read from with comparable and very fast access times and thus are commonly referred to as random access memories. However, since semiconductor memories are relatively expensive, other higher density and lower cost memories are often used. For example, other memory systems include magnetic disk storage systems. With magnetic disk storage systems generally access times are in the order of tens of milliseconds whereas main memory the access times are in the order of hundreds of nanoseconds. Disk storage is used to store large quantities of data which can be sequentially read into main memory as needed. Another type of disk like storage is solid state disk storage. Solid state disk storage is comprised of solid state memories memory devices which are accessed as though they were magnetic disks. One advantage over magnetic disk however is that they are much faster than magnetic disk memory systems. So called solid state disks memory systems are also more expensive than magnetic disk devices.

As it is also known in the art, memory systems including the aforementioned solid state disk memory storage system traditionally use storage devices with no "hard" faults. That is, the system is constructed to account for temporary or "soft" errors, but if the storage device has a hard or permanent fault, the device is replaced, or addressing is configured to map around the hard or permanent fault location. Since dynamic memory devices, DRAMs, are susceptible to radiation-induced soft failures, simple error detection and correction techniques are often used to withstand single-bit per word errors. Such non-permanent failures can be "scrubbed" by writing the corrected data back into the memory location. In such a memory system, the typical failure mechanism is the combination of a hard error and a soft failure in the same memory location.

In the DRAM manufacturing process, any given lot yields some percentage, typically large but less than 100%, of devices with no defects. The bulk of the failing devices have only a single storage location that is defective, although many other failures that affect more than one location are possible. The failing devices are typically sent to a crasher and destroyed, although some uses for devices in digital audio have developed, i.e., so-called Audio RAMs.

Several methods have been proposed to allow the use of DRAMs having defective bits. For example, in U.S. Pat. No. 4,992,984, a method of identifying and mapping around bad locations is disclosed. The overhead imposed by the need for finding the faults and then translating addresses for mapping around faulty locations in a memory results in lower performance in the overall system.

A goal of semiconductor integrated circuit designers for many years has been so-called "wafer scale integration." Enormous economies could result from using an entire wafer in undivided form, rather than scribing and breaking into individual chips, then packaging the chips. However, the likelihood of an entire wafer having no defective cells is minuscule, so some mechanism is needed to account for defective parts of the wafer. Usually, the method of accounting for defects is to locate the defective cells by testing, then mapping around the defects. That is, the addresses of the defective locations are stored in the memory system, as in a section of non-volatile memory, and attempts to access these locations are mapped to spare locations.

A technique of this type was disclosed by Anamartic, Ltd. for dealing with wafer-scale memories. The technique is to break the memory into subsections, called "tiles," where the size of a tile is a tradeoff between overhead circuitry and the amount of storage lost in the case of a memory fault (typical sizes are 8 KB to 64 KB ). The memory system includes sufficient spare tiles so that a given capacity can be guaranteed in the face of errors. Each tile contains logic that can be used to disable that tile if a fault is found in the tile. This configuration logic is set up on initialization from a map that is stored in a non-volatile media such as magnetic disk or EEPROM.

Error correcting codes have been used in memory sub-systems to enhance the reliability of memory. That is, ostensibly perfect memory elements have associated failure rates (usually soft errors caused by alpha particle hits in DRAMs) which could cause the memory system to return faulty data, if it were not for the error correcting code. The Hamming code single bit error correction normally used in memory has the virtue that it is not too complex to implement in a way that minimizes its impact on memory performance, while substantially improving the main memory reliability.

Often in memory systems complex error correcting techniques are used. In particular so called non-binary block codes such as a Reed Solomon code is used. With these codes data are grouped in "symbols" which are data from several data words such as the $i^{th}$ bit of N words. Data formatters are used to convert from data word format to symbol format. One problem is that such formatters are not generally configurable. With solid state disk it often occurs that different DRAM's are used in a disk.

SUMMARY OF THE INVENTION

In accordance with the present invention a data formatting apparatus includes, an array of memory elements arranged in a first plurality of rows and a second plurality of columns, each of said memory elements further including, a plurality of memory cells and a multiplexer having at least two inputs, an output terminal coupled to the memory cells and a control terminal fed by control signals for selectively coupling one of said inputs to said output wherein cells in a first column of said second plurality of columns having a input to said multiplexer of said cells coupled to an external terminal of said array and with succeeding columns of said cells having a first input of the multiplexer coupled to a corresponding cell in a succeeding one of said columns of cells and with cells in a first row of said first plurality of rows having an input to said multiplexer of said cells coupled to an external terminal of said array and with succeeding rows of said cells having a first input of the multiplexer coupled to a corresponding cell in a succeeding one of said rows of cells. The formatting apparatus further includes means for providing said control signals to each of said multiplexers to chose which input of said multiplexer is coupled to the memory cell. With such an arrangement a data formatter that can convert data between word or symbol format is provided. The formatter can be used on various configurations of memory devices and can be reconfigured as necessay.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

FIG. 8 is a diagram which shows the relationship of FIG. 8A–8F;

FIGS. 15A–15D are diagrammatical representations of the array for various formatter functions.

DESCRIPTION OF THE PREFERRED EMBODIMENTS

Figure 1:
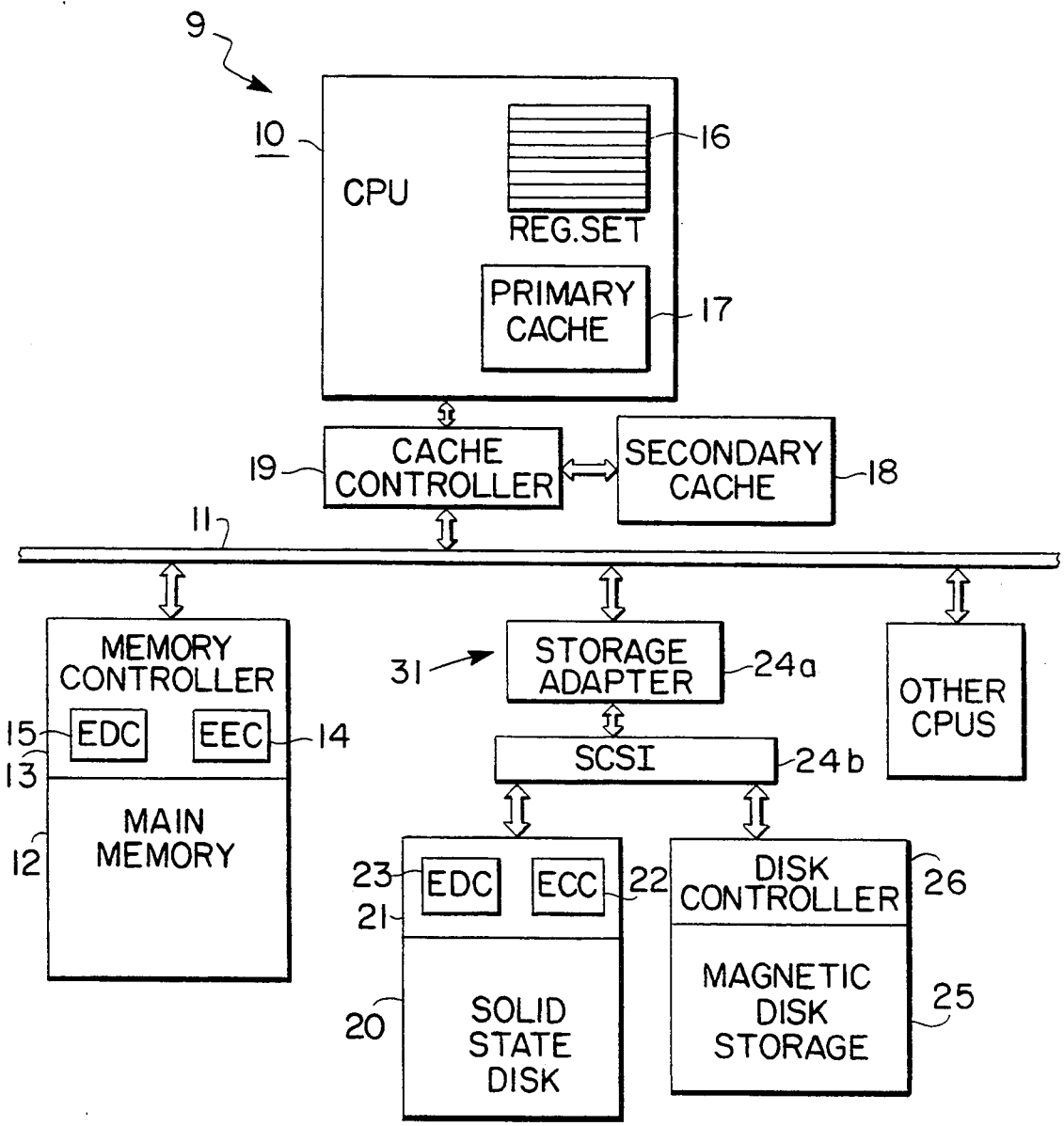
FIG. 1 is a block diagram of a computer system which uses a memory arrangement according to one embodiment of the invention.
Figure 2:
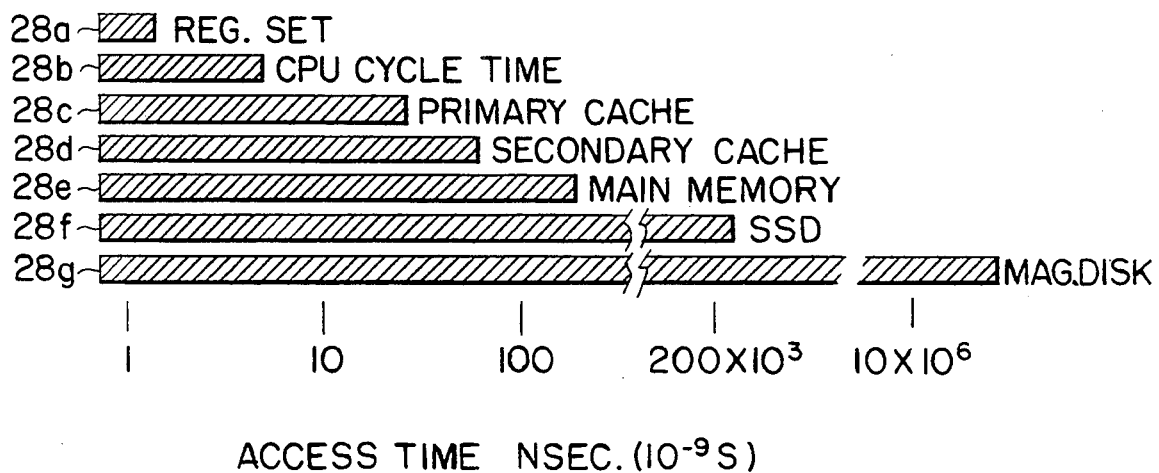
FIG. 2 is a diagram of access times for various parts of the hierarchical memory of the system of FIG. 1.

Referring to FIG. 1, a computer system 9 is shown to include a CPU 10, usually constructed in a single integrated circuit chip, coupled by a system bus 11 to a main memory 12. A memory controller 13 handles the interface between the system bus 11 and the main memory 12. Read and write requests are sent by the CPU 10 to the memory via the bus 11.

In particular, the main memory 12 is comprised of semiconductor memory devices. The main memory is an example of a memory apparatus which can be characterized as comprised of storage locations which should return during a read cycle, true or correct data. Illustrative examples of devices which can be used in such a memory apparatus includes random access memory devices (RAM) whether so-called "dynamic" (DRAM) or "static" (SRAM). They can be volatile or nonvolatile types such as the emerging ferroelectric based memory devices. For other types of memory systems not using RAM, the devices could include programmable devices, such as PROMs, EPROMs and in particular flash EEPROMs (flash electrical erasable programmable read only memories). Other types of memory include ROM (read only memory). Other memory technologies could also be included such as magnetic bubble, CCD (charge coupled devices), and CDROM.

In the following discussion DRAMs for use in a computer are used as an example although other memory devices for other memory systems could also be used. Further, the memory system does not need to be directly associated with a computer CPU. For example, high definition television and graphics processors could also use an embodiment of the memory system.

The memory controller 13 may include an error correcting code (ECC) circuit 14 to add ECC check bits to the data being stored, in response to a write request, before this data is written to the DRAM arrays of the main memory 12, in a manner so that the DRAM devices used in the main memory 12 may contain hard faults. Upon receiving a read request, the controller 13 causes reading of data and ECC bits from the memory 12, and these pass through an EDC circuit 15 to detect errors caused by faulty bits in the memory 12 and to correct these bits before true data is sent back to the CPU 10 on bus 11. The memory hierarchy of the CPU, as discussed below, includes a register set 16, an on-chip primary cache 17, and an off-chip secondary cache 18 operated by a cache controller 19.

The computer 9 further includes a bus interface 31 including a main storage adapter 24a and a standard interconnect such as a Small Computer System Interconnect (SCSI) 24b typically used to interface main storage sequential access memories such as disks to bus 11. Here the storage adapter 24a and SCSI 24b interface a solid-state disk 20 operated by a disk controller 21 and a magnetic disk 25 operated by a disk controller 26 to the CPU via the bus 11. Blocks of write data from the CPU 10 pass through storage adapter 24a and SCSI 24b to an ECC circuit 22 in the controller 21. The data are stored in the solid state disk along with ECC check bits generated in the circuit 22. Blocks of read data and check bits from the disk 20 pass through an EDC circuit 23 where errors are detected and corrected as will be described. An EDC circuit 23 and the ECC circuit are here used as described in U.S. Pat. No. 5,107,503 assigned to Digital Equipment Corporation and incorporated herein by reference. The solid-state disk 20 further includes banks of semiconductor memories here dynamic random access memories (DRAMs). The "disk memory" provided by these banks of DRAMs is partitioned to define storage sectors and optionally "tracks" so that a magnetic disk is simulated. Data is stored as sequential blocks rather than as randomly addressed bytes or words. The response time of the solid-state disk to read and write requests however is orders of magnitude faster than a mechanical-driven magnetic disk. Here the banks of DRAMs used to provide the solid state disk 20 may be comprised of DRAM devices which have a rather high level of faulty bits, i.e., hard errors.

As also mentioned above the computer 9 includes bulk storage in the form of the magnetic disk 25, operated by the disk controller 26. While, the magnetic disk 25 is generally less expensive than the solid state disk 20 it is also slower. The solid state disk 20 therefore is used as a cache of a subset of pages of data from the magnetic disk, or pages of data may be swapped between the solid-state and magnetic disks as needed by the tasks executing on the CPU, but in either event the object is to store those data blocks most likely to be used by the CPU in the solid-state disk so access to those data blocks by the CPU will be faster than storing on or retrieving, from the magnetic disk 25.

The CPU 10 of the system of FIG. 1 may be, for example, of the VAX TM architecture as described by Levy and Eckhouse in "Computer Programming and Architecture: The VAX", 2nd Ed., Digital Press, 1989. A single-chip CPU of the VAX architecture is disclosed in U.S. Pat. No. 5,006,980, issued to Sander, Uhler & Brown, assigned to Digital Equipment Corporation, the assignee of this invention. The CPU 10 also may be of an advanced 64-bit RISC architecture. Microprocessor devices of this type are manufactured by Digital Equipment Corporation under the designation or part number "21064." Alternatively, of course, the CPU may be of many other types, such as the Intel 386 or 486 architecture, Motorola 68030 or 68040 architecture, or MIPS R3000 or R4000 RISC architecture, as examples.

The system bus 11 may be any of the standard bus specifications used for any of the many commonly-used CPUs, but in an example embodiment is a VAX bus. That is, the bus 11 may be of the type in which addresses, data and commands or controls are multiplexed on a single hi-directional bus of, for example, 128-bits width, or 64-bits width. Alternatively, separate address, data and control busses may be included in the system bus 11.

The CPU 10 operates with a hierarchy of memory resources of differing speeds. The fastest memory is the most costly, so the hierarchy goes from small amounts of fast, costly memory, down to very large amounts of slow, low-cost memory. The fastest memory is the register set 16 which is pan of the CPU architecture, directly accessible by instructions of the instruction set. The register set, containing perhaps sixteen or thirty-two registers, typically has an access time $28a$ that is within a CPU cycle time $28b$, i.e., accessed in a time which is a fraction of a cycle or a few nanoseconds. The fastest memory accessed as part of the memory space of the CPU is a memory apparatus generally referred to as the primary cache 17 which is on the same chip as the CPU 10. This cache is accessed in a time $28c$ corresponding to one or a few CPU cycles. Memory references not found in the primary cache 17 are sought in the secondary cache 18 accessed via the cache controller 19, and the access time $28d$ of the secondary cache is perhaps several CPU cycles. When a memory reference does not produce a cache hit in the secondary cache 18, the cache controller 19 sends the memory request out on the system bus 11 to the main memory 12, a third example of a memory apparatus. Typically, the response time $28e$ of the main memory 12 is about ten bus cycles, where a bus cycle on the system bus 11 is usually a multiple of a CPU cycle, e.g., three CPU cycles per bus cycle. Thus, the memory 12 is accessed in about thirty CPU cycles in an example embodiment. Accordingly, the latency introduced by the ECC circuit 14 and the EDC circuit 15 should be small compared to the ordinary response time of the main memory 12 without the EDC added, so that the performance of the CPU will not be impaired due to delays in the EDC function.

The memory hierarchy in the system of FIG. 1 also includes the solid-state disk 20 and the magnetic disk 25 mentioned above. Since a virtual memory management system is ordinarily implemented on the CPU 10, a memory reference to a location in virtual memory that is not present in the main memory 12 is handled by accessing a page from disk storage and writing it to memory 12. The access time $28g$ for data in the magnetic disk storage is usually measured in several milliseconds when magnetic disks are used, a million times greater than that of the main memory 12. Another level in the memory hierarchy is therefore provided as the solid state disk 20, accessed through the solid state disk controller 21. Here the solid state disk 20 may be comprised of banks of DRAMs containing faulty bits, and ECC circuit 22 and EDC circuit 23 provide check bits and detect and correct errors in data read from the solid state disk 20. The response time $28f$ of the solid-state disk 20 is only about a small multiple of that of the main memory 12, allowing for the latency due to the EDC function. In an example, the EDC latency is about 100-μsec.

The width of the data path in the bus 11, in a preferred embodiment, is the same as, or a small submultiple of, a cache line in the cache 18, e.g., 64-bits, 128-bits or 256-bits. It is of course preferable if a single read request on the bus 11 will function as a cache fill, replacing an entire cache line in one operation (or at most two read cycles). When a read miss occurs in the cache 18, a memory read request is passed on to main memory 12 via the system bus 11. The line containing the read request location is accessed from main memory and written to the cache 18, with the requested data being sent on to the CPU from this line.

Figure 3:
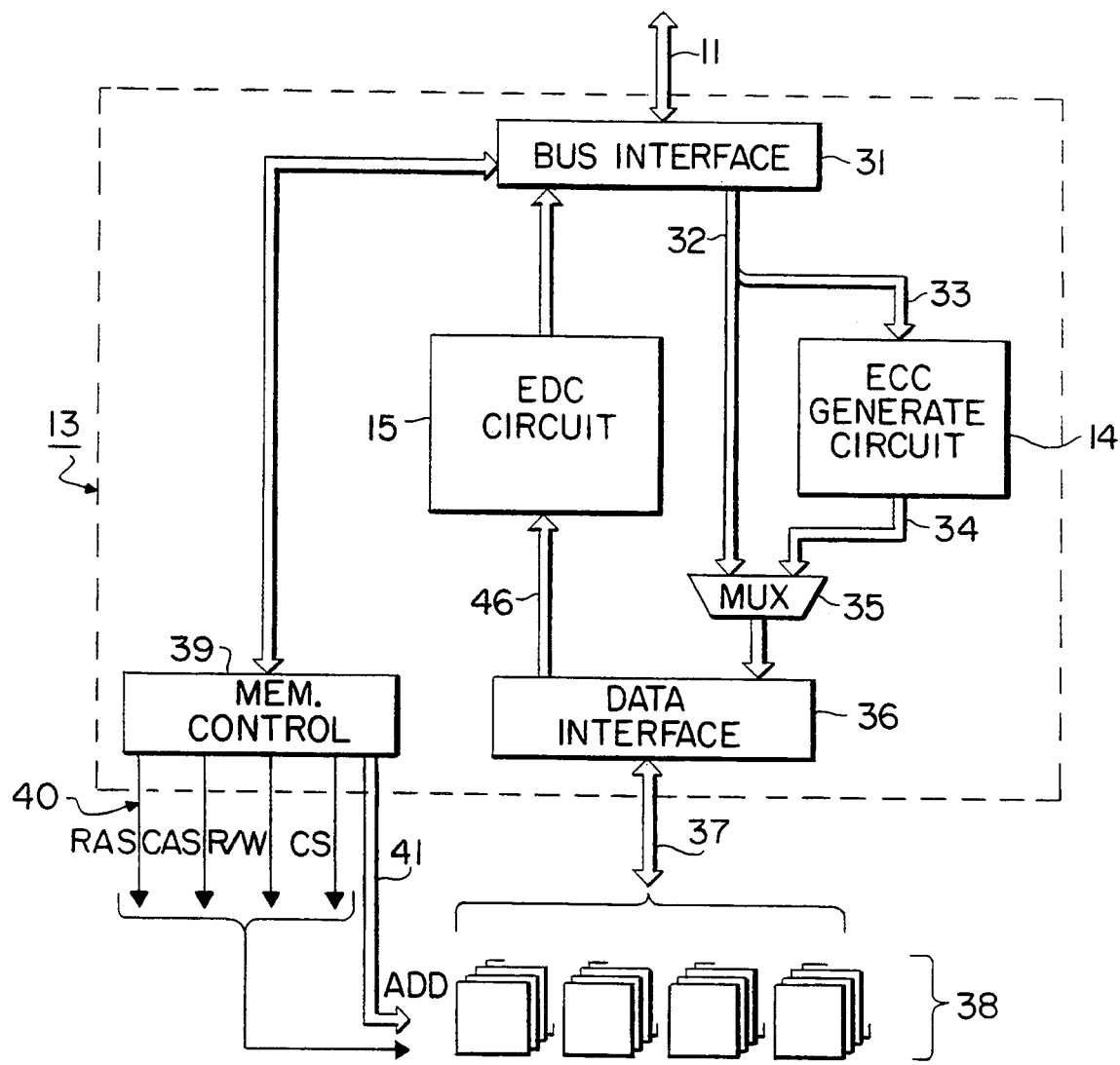
FIG. 3 is a block diagram of a memory controller for a main memory used in the system of FIG. 1.

Referring to FIG. 3, the memory controller 13 for the main memory 12 includes a bi-directional bus interface 31 for coupling to the system bus 11, from which write data is applied by lines 32 to the input 33 of the ECC generate circuit 14. The ECC generate circuit 14 functions to produce check bits on output 34 which are combined with the original data on lines 32 here using multiplexer 35. The ECC circuit is implemented using conventional combinatorial parity tree logic networks. The full write-data block including original data and check bits is applied by bus interface 36 to the read/write data lines 37 going to the DRAM memory banks 38 of the memory 12. Memory control circuit 39 generates memory control signals on row address select (RAS), column address select (CAS), read/write (R/W) and chip select (CS) lines 40 going to the DRAMs. Also, row and column addresses are applied to the banks of DRAMs via the memory controller 39 and lines 41, based on the addresses delivered to the bus interface 31 from bus 11 as parts of the read and write requests from the CPU. In particular, the memory controller 13 is here used to control "main memory." It could also be used to control other memory apparatuses that have relatively fast access times.

An important feature of one embodiment is the ability to do multiple-bit error correction in the EDC circuit 15, using combinatorial logic rather than iterative (sequential) logic. Ordinarily the EDC circuitry used in memory systems in typical computers is so-called SEC/DED or "single error correction, double error detection." The EDC circuit in such case is able to produce corrected data only if no more than a single error is detected, but is able to detect two or more errors and to signal to the CPU that a non-correctable error situation exists so that a fault routine can be entered. Multiple-bit error corrections using binary Bose Chaudhuri Hocquenghem (BCH) codes are discussed in depth in Chapter 9 (p. 269+) of Peterson & Weldon, "Error Correcting Codes," 2nd Edition, MIT Press, 1972. In a preferred embodiment, a 5-bit error correcting, 6-bit error detecting code is employed, with a 128-bit data width plus 41 check bits (ECC bits). That is, the data path width at the lines 32 is 128-bits, and the ECC circuit 14 adds 41-bits, so the lines 37 going to and from the memory 12 are 169-bits wide.

Figure 4:
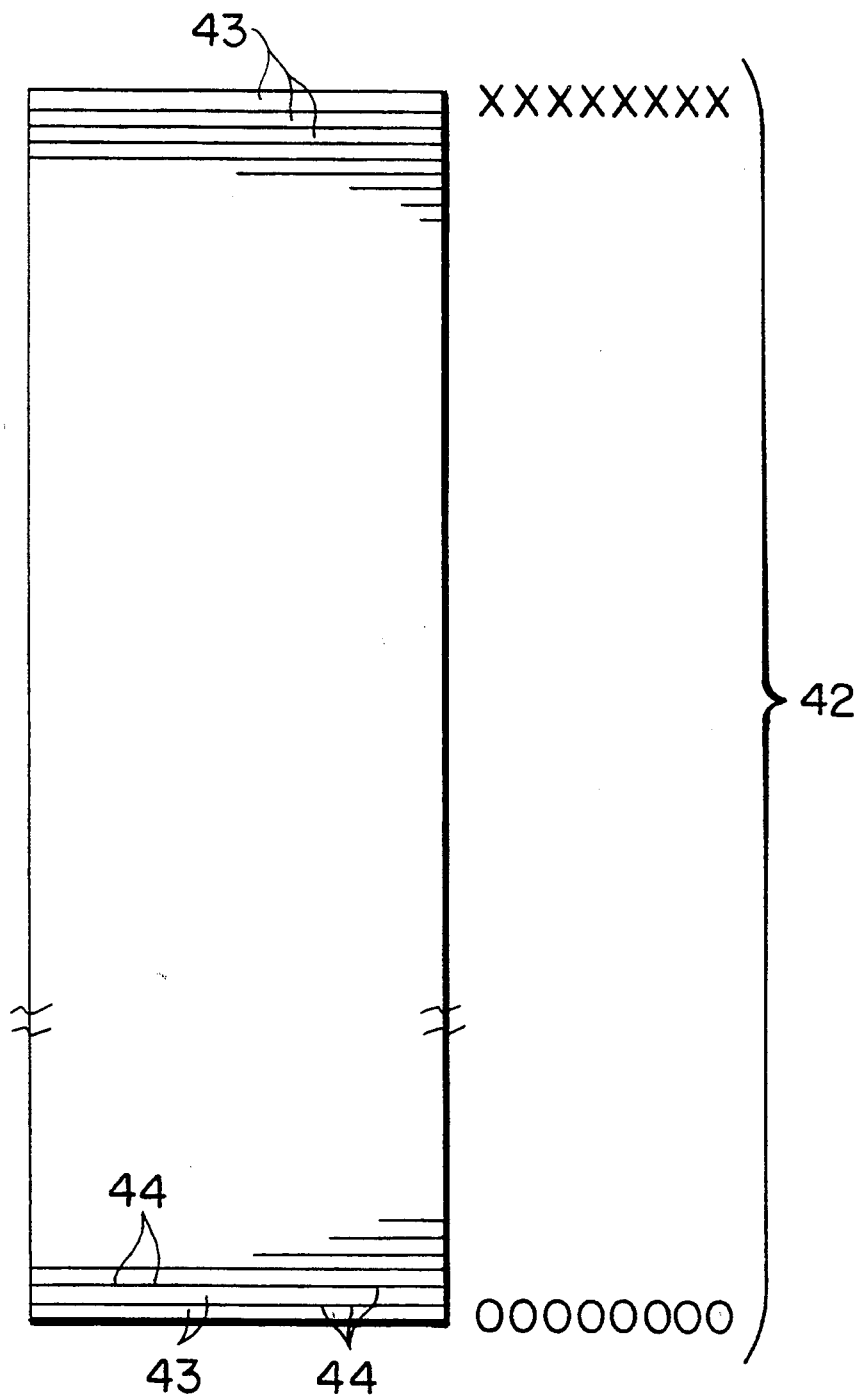
FIG. 4 is a memory map of the memory space of the CPU of the system of FIG. 1.

It is important to note that the 169-bit memory blocks (128-bits of data, 41-bit check bit field) stored in the DRAM banks 38 (FIG. 3) (each representing a cache line or submultiple) at address locations 42 which encompass the entire memory space of the real (physical) memory defined by the configuration of the CPU 10. This memory space 42 is shown in FIG. 4, having memory address locations going from 00000000 to xxxxxxxx, in a linear fashion, where each address increment is populated by a 169-bit location 43 in the memory banks 38. There are no locations 43 skipped or mapped around, even though faulty bits 44 might exist at various places in each location 43. In contrast to most prior constructions, no attempt is made to "map" the addressing to exclude locations 43 having hard faults 44.

To understand the calculations made to provide the check bits and to detect and correct errors in the data it should be pointed out that in the combinatorial logic networks used here in "modulo 2" arithmetic on a bit by bit basis is used. Addition in "modulo 2" is equivalent to a logical "exclusive or" whereas multiplication in "modulo 2" is equivalent to a logical "and".

The code employed for error detecting and correcting in the preferred embodiment uses Galois field arithmetic over $GF(2^8)$. A check bit generator polynomial for the ECC generator 14 is chosen here to be $G_1(x)=x^8+x^5+x^3+x^2+1$, a preferred polynomial from primitive, eighth degree polynomials, because it is somewhat easier for combinatorial multiplication in $GF(2^8)$. Let $\alpha$ be a root of $G_1(x)$. If the generator polynomial for the full code is $G(x)$, then $$G(x) = G_1(x)G_3(x)G_5(x)G_7(x)G_9(x)(x+1)$$

where $G_3(x)$ has $\alpha^3$ as a root $= x^8+x^7+x^5+x+1$
$G_5(x)$ has $\alpha^5$ as a root $= x^8+x^7+x^5+x^4+1$
$G_7(x)$ has $\alpha^7$ as a root $= x^8+x^6+x^3+x^2+1$
$G_9(x)$ has $\alpha^9$ as a root $= x^8+x^6+x^5+x^4+x^2+x+1$ thus, $$G(x) = x^{41}+x^{40}+x^{39}+x^{38}+x^{37}+x^{36}+x^{34}+x^{32}+x^{31}+x^{28}+x^{26}+x^{21}+x^{20}+x^{19}+x^{17}+x^{14}+x^{12}+x^3+x+1$$
(77262416450013 in octal notation).

This generator polynomial is calculated in the standard way for BCH codes as described in Peterson and Weldon. Thus, during a write to main memory data are passed through the ECC circuit 14 a combinatorial logic parity tree network to form error correcting check bits $C_i<40:0>$ which are associated with a particular string or blocks of data bits $D_i<169:41>$. The check bits and data are stored in the DRAM's 38. Each of the data bits $D_i$ are "exclusive or'ed" with others of the data bits in three levels of exclusive or gates. The outputs of the three levels of exclusive or gates are applied to one of 41 parity tree generator circuits to generate the 41 check bits of the check code $C_i$. The exact inputs (i.e. bits of input data) that are applied to each "exclusive or" gate in each bank or level of such gates is given in Appendix I by Tables A-1 through A-6 corresponding to check bits $<40:34>$; $<33:27>$; $<26:20>$; $<19:13>$; $<12:06>$; and $<05:00>$.

During a read operation from the memory 38, the read data $D_i$ and associated code words $C_i$ are applied to an error detection circuit 15 that uses combinatorial logic to correct any errors up to N errors. The maximum number of possible errors that may be corrected (i.e. 2 errors up to 5 and more) depends upon the number of data bits $D_i$, check bits $C_i$ and complexity of the EDC circuit. Here as an example a 5-bit error correcting cyclic, block, binary BCH codes implemented in combinatorial logic is used.

As in normal BCH decoding the following steps are required, in combinatorial logic implemented in the circuit 15:

Step #1-calculate the syndromes $S_1$, $S_3$, $S_5$, $S_7$, $S_9$ (each are eight-bit members of $GF(2^8)$).

Step #2-determine the error location polynomial $$\sigma(x) = x^5 + \sigma_1 x^4 + \sigma_2 x^3 + \sigma_3 x^2 + \sigma_4 x + \sigma_5$$

(for five bit errors) must be calculated.

Step #3-try all data bit locations in $\sigma(x)$ to find if $\sigma$(bit location)=0 to identify bits in error (and toggle these bits).

Step #1 is implemented by conventional parity trees, all combinatorial. In a similar manner as was used to provide the checkbits, a combinatorial logic network (as will be described in conjunction with FIG. 6) is used to calculate the syndromes $S_1$, $S_3$, $S_5$, $S_7$, and $S_9$.

Step #2, calculation of the coefficients of the error location polynomial $\sigma_i$ from the syndromes $S_i$ is discussed in Peterson & Weldon, pp. 283–288, with simplifications for the binary case on pp. 299–301. Preferably, the correcting codes are generated through the ECC circuit 14 over an approximately write cycle-time of the memory apparatus. However, the algorithms given are not combinatorial. Note that iterative solutions require some kind of sequential state machine to implement, resulting in time delays that are not acceptable for main memory applications. To achieve a combinatorial solution, a different method is needed. Starting with the equations given on p. 300 of Peterson & Weldon, for Newton's identities (equations 9.54):

$$S_1 - \sigma_1 = 0$$

$$S_2 - S_1\sigma_1 + 2\sigma_2 = 0$$

$$S_3 - S_2\sigma_1 + S_1\sigma_2 - 3\sigma_3 = 0$$

$$S_4 - S_3\sigma_1 + S_2\sigma_2 - S_1\sigma_3 + 4\sigma_4 = 0$$

etc.

etc.

Now for arithmetic in $GF(2^8)$ we have $S_{2n} = S_n^2$ and addition is the same as subtraction and $$K \cdot \sigma_i = \sigma_i \text{ for } K \text{ odd}$$
$$= 0 \text{ for } K \text{ even}$$

With these changes, every other one of the prior equations becomes redundant. For 5-bit errors all $\sigma_i$ for $i > 5$ are equal to zero. Hence, the equations for the syndromes become (for 5-bit errors):

$$\sigma_1 = S_1$$

$$\sigma_3 + S_1\sigma_2 + S_1^2\sigma_1 = S_3$$

$$\sigma_5 + S_1\sigma_4 + S_1^2\sigma_3 + S_3\sigma_2 + S_1^4\sigma_1 = S_5$$

$$S_1^2\sigma_5 + S_3\sigma_4 + S_1^4\sigma_3 + S_5\sigma_2 + S_3^2\sigma_1 = S_7$$

$$S_1^4\sigma_5 + S_5\sigma_4 + S_3^2\sigma_3 + S_7\sigma_2 + S_1^8\sigma_1 = S_9$$

By theorem 9.11 at p. 300 of Peterson & Weldon, these equations can be solved for both 5-bit and 4-bit errors, but not for fewer errors. Since these are linear equations in the $S_i$ and $\sigma_i$ (the $S_i$ are known) determinants can be used to solve.

For 2-bit and 3-bit errors the equations are:

$$\sigma_1 = S_1$$

$$\sigma_3 + S_1\sigma_2 + S_1^2\sigma_1 = S_3$$

$$S_1^2\sigma_3 + S_3\sigma_2 + S_1^4\sigma_1 = S_5$$

and for 1-bit error:

$$\sigma_1 = S_1$$

The determinants are:

$$A = \begin{vmatrix} S_1 & 0 & 0 & 0 & 1 \\ S_3 & 0 & 1 & S_1 & S_1^2 \\ S_5 & S_1 & S_1^2 & S_3 & S_1^4 \\ S_7 & S_3 & S_1^4 & S_5 & S_3^2 \\ S_9 & S_5 & S_3^2 & S_7 & S_1^8 \end{vmatrix}$$

$$B = \begin{vmatrix} 0 & S_1 & 0 & 0 & 1 \\ 0 & S_3 & 1 & S_1 & S_1^2 \\ 1 & S_5 & S_1^2 & S_3 & S_1^4 \\ S_1^2 & S_7 & S_1^4 & S_5 & S_3^2 \\ S_1^4 & S_9 & S_3^2 & S_7 & S_1^8 \end{vmatrix}$$

$$C = \begin{vmatrix} 0 & 0 & S_1 & 0 & 1 \\ 0 & 0 & S_3 & S_1 & S_1^2 \\ 1 & S_1 & S_5 & S_3 & S_1^4 \\ S_1^2 & S_3 & S_7 & S_5 & S_3^2 \\ S_1^4 & S_5 & S_9 & S_7 & S_1^8 \end{vmatrix}$$

$$D = \begin{vmatrix} 0 & 0 & 0 & S_1 & 1 \\ 0 & 0 & 1 & S_3 & S_1^2 \\ 1 & S_1 & S_1^2 & S_5 & S_1^4 \\ S_1^2 & S_3 & S_1^4 & S_7 & S_3^2 \\ S_1^4 & S_5 & S_3^2 & S_9 & S_1^8 \end{vmatrix}$$

$$E = \begin{vmatrix} 0 & 0 & 0 & 0 & S_1 \\ 0 & 0 & 1 & S_1 & S_3 \\ 1 & S_1 & S_1^2 & S_3 & S_5 \\ S_1^2 & S_3 & S_1^4 & S_5 & S_7 \\ S_1^4 & S_5 & S_3^2 & S_7 & S_9 \end{vmatrix}$$

$$F = \begin{vmatrix} 0 & 0 & 0 & 0 & 1 \\ 0 & 0 & 1 & S_1 & S_1^2 \\ 1 & S_1 & S_1^2 & S_3 & S_1^4 \\ S_1^2 & S_3 & S_1^4 & S_5 & S_3^2 \\ S_1^4 & S_5 & S_3^2 & S_7 & S_1^8 \end{vmatrix}$$

Hence $$\sigma_1 = \frac{E}{F} \quad \sigma_2 = \frac{D}{F} \quad \sigma_3 = \frac{C}{F} \quad \sigma_4 = \frac{B}{F} \quad \sigma_5 = \frac{A}{F}$$

and the error location polynomial for 4-bit and 5-bit errors becomes $$\sigma(x) = x^5 + \frac{E}{F} x^4 + \frac{D}{F} x^3 + \frac{C}{F} x^2 + \frac{B}{F} x + \frac{A}{F}$$

but division is difficult in GF($2^8$) in combinatorial logic, so the equation is multiplied by F (F must be non-zero by theorem #9.11 in Peterson and Weldon):

$$F(\sigma(x)) = Fx^5 + Ex^4 + Dx^3 + Cx^2 + Bx + A$$

Since only the solutions for $\sigma(x)=0$ are of interest, this equation is just as good as the original error location polynomial, and much easier to calculate.

The corresponding determinants for 2-bit and 3-bit errors are:

$$G = \begin{vmatrix} S_1 & 0 & 1 \\ S_3 & S_1 & S_1^2 \\ S_5 & S_3 & S_1^4 \end{vmatrix}$$

$$H = \begin{vmatrix} 0 & S_1 & 1 \\ 1 & S_3 & S_1^2 \\ S_1^2 & S_5 & S_1^4 \end{vmatrix}$$

$$I = \begin{vmatrix} 0 & 0 & S_1 \\ 1 & S_1 & S_3 \\ S_1^2 & S_3 & S_5 \end{vmatrix}$$

$$J = \begin{vmatrix} 0 & 0 & 1 \\ 1 & S_1 & S_1^2 \\ S_1^2 & S_3 & S_1^4 \end{vmatrix}$$

and $$\sigma(x) = x^3 + \frac{I}{J} x^2 + \frac{H}{J} x + \frac{G}{J}$$

or $$J\sigma(x) = Jx^3 + Ix^2 + Hx + G$$

For the 1-bit error case:

$$\sigma(x) = x + S_1$$

Calculating the determinants:

A = $S_1 S_5 S_9$ + $S_3^2 S_9$ + $S_1^3 S_3 S_9$ + $S_1^6 S_9$ + $S_1 S_7^2$ + $S_1^3 S_5 S_7$ + $S_1^2 S_3^2 S_7$ + $S_1^5 S_3 S_7$ + $S_1^8 S_7$ + $S_5^3$ + $S_1^2 S_3 S_5^2$ + $S_1^5 S_5^2$ + $S_1 S_3^3 S_5$ + $S_1^4 S_3^2 S_5$ + $S_1^7 S_3 S_5$ + $S_3^5$ + $S_1^6 S_3^3$ + $S_1^9 S_3^2$ + $S_1^{12} S_3$ + $S_1^{15}$

B = $S_5 S_9$ + $S_1^2 S_3 S_9$ + $S_7^2$ + $S_1^2 S_5 S_7$ + $S_1^4 S_3 S_7$ + $S_1^4 S_5^2$ + $S_1^6 S_3 S_5$ + $S_3^3 S_5$ + $S_1^8 S_3^2$ + $S_1^{14}$

C = $S_1 S_3 S_9$ + $S_1^4 S_9$ + $S_1 S_5 S_7$ + $S_3^2 S_7$ + $S_3 S_5^2$ + $S_1^5 S_3 S_5$ + $S_1^4 S_3^3$ + $S_1^{13}$

D = $S_3 S_9$ + $S_1^3 S_9$ + $S_5 S_7$ + $S_1^5 S_7$ + $S_1 S_3^2 S_5$ + $S_1^2 S_5^2$ + $S_1^4 S_3 S_5$ + $S_3^4$ + $S_1^6 S_3^2$ + $S_1^7 S_5$

E = $S_1 S_3 S_7$ + $S_1 S_5^2$ + $S_1^4 S_7$ + $S_1^3 S_3 S_5$ + $S_1^6 S_5$ + $S_1^2 S_3^3$ + $S_1^8 S_3$ + $S_1^{11}$

F = $S_3 S_7$ + $S_5^2$ + $S_1^3 S_7$ + $S_1^2 S_3 S_5$ + $S_1^5 S_5$ + $S_1 S_3^3$ + $S_1^7 S_3$ + $S_1^{10}$

G = $S_1 S_5$ + $S_3^2$ + $S_1^3 S_3$ + $S_1^6$

H = $S_5 + S_1^2 S_3$

I = $S_1 S_3 + S_1^4$

J = $S_3 + S_1^3$

Thus, Step #2 is reduced to the sub-steps of (a) calculating the determinants, (b) determining how many bits are in error, and (3) selecting a set of the determinants based on the number of errors. Each of these sub-steps can then be implemented in combinatorial logic.

Step #3 requires trying all data bits in $\sigma(x)$ to find $\sigma(\alpha^N)=0$ (for the bits in error). Note that the stored data plus check bits (with no errors) is a code word of the form $$CW(x) = \sum_{i=0}^{40} C_i x^i + \sum_{j=0}^{127} D_j x^{j+41}$$

where the $C_i$ have been chosen so that CW(x) is evenly divisible by G(x). Therefore, we must evaluate $$\sigma(\alpha^N)|_{N=41 \to 168}$$

and test if $\sigma(\alpha^N)$ is zero for that N.

Suppose $K = K_7\alpha^7 + K_6\alpha^6 + K_5\alpha^5 + K_4\alpha^4 + K_3\alpha^3 + K_2\alpha^2 + K_1\alpha$ is a member of GF($2^8$), now $\alpha^N \cdot K$ is given by:

$$\alpha^N \cdot K = f_7(K,N)\alpha^7 + f_6(K,N)\alpha^6 + f_5(K,N)\alpha^5 + \ldots f_1(K,N)\alpha + f_0$$

where $f_i(K,N)$ is one of 255 combinations of sums (modulo 2) of the $K_0 \ldots K_7$ and N is the bit position number (from bit-41 to bit-168 for data) which determines which combination to use.

Figure 5:
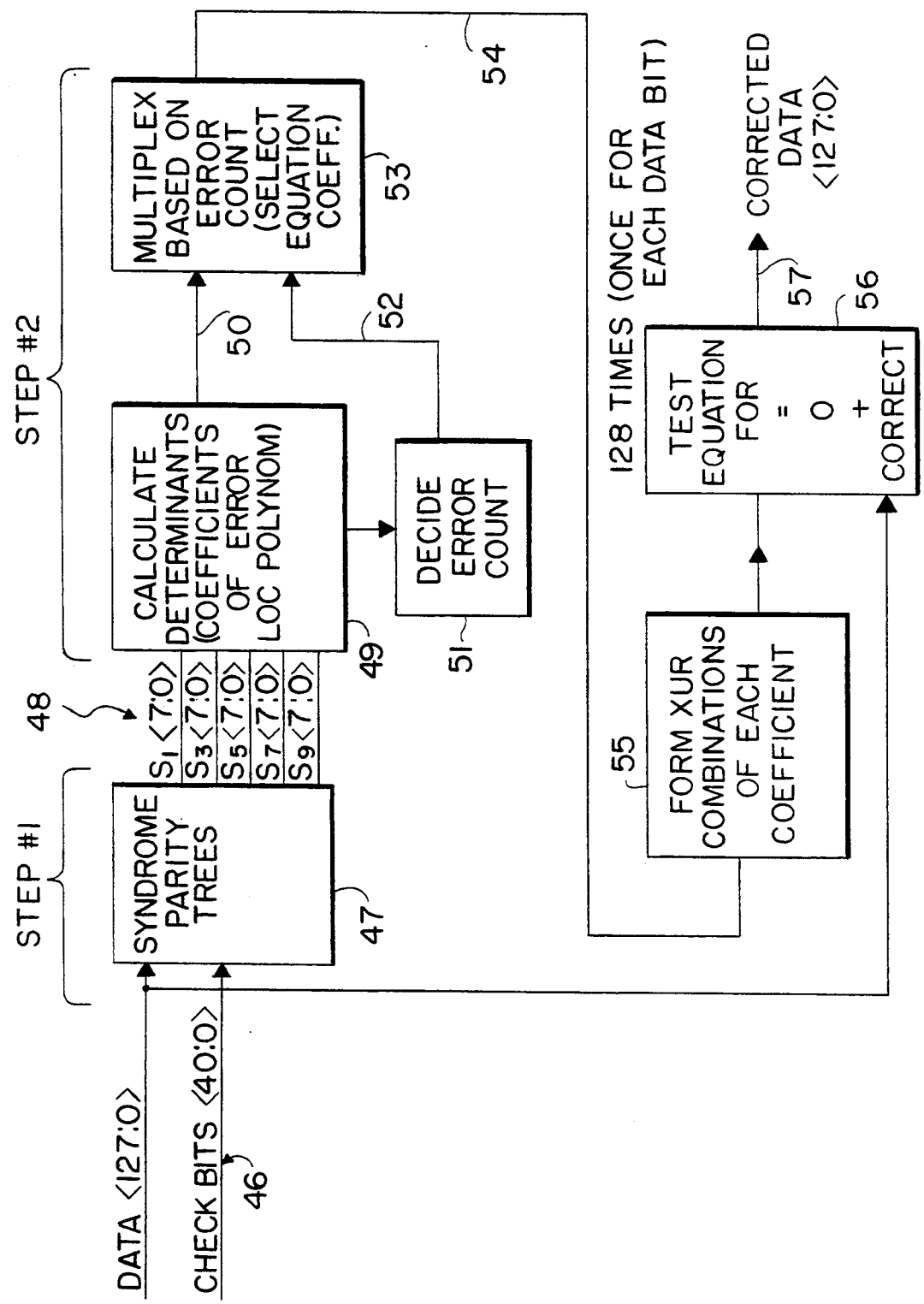
FIG. 5 is a block diagram of an error detection correction (EDC) circuit used in the main memory controller of FIG. 3.

Hence, the block diagram of the EDC mechanism 15 for combinatorial multi-bit correction is shown in FIG. 5. The 169-bit block returned from the memory array 38 in response to a read request appears on input lines 46, with data bits <127:0> and check bits <40:0>. The syndromes are generated in circuit 47 which is constructed of parity trees, implementing Step #1 as discussed above. That is, combinations of selected bits of the 169-bit input produce each 8-bit syndrome. The output of the circuit 47 includes five 8-bit syndromes on lines 48, labelled $S_1<7:0>$, $S_3<7:0>$, $S_5<7:0>$, $S_7<7:0>$, $S_9<7:0>$.

Step #2 is implemented using a logic circuit 49 to calculate the determinants, again merely using combinations of selected bits of the syndromes to produce the values A–J, each of which is 8-bits wide, so the output 50 is fifteen 8-bit values A–J. A logic circuit 51 determines the number of errors. Outputs 50 and 52 from the circuits 49 and 51 are applied to a block of multiplexers 53 that selects equation coefficients based on the error count, producing an output 54.

Step #3 is implemented in a logic circuit 55 which forms exclusive-OR combinations of each coefficient. A logic circuit 56 receives the outputs from the circuit 55, and also the data bits $<127:0>$ from the input 46, and produces corrected data on output 57. That is, coefficients A–J, syndrome S1, and error counts are applied to multiplexer bank 53 which in response to error count chooses coefficients for the error location polynomial $\sigma(x)$. At the output 54 of the multiplexer bank is the proper error location polynomial coefficients A–J, S1 provided on outputs $X_5$, $X_4$, $X_3$, $X_2$, $X_1$, and $X_0$. Equation coefficients (solutions to the determinants) are associated with $X_5$, $X_4$ ... $X_0$ in accordance with the error count as given by Table B below. Unused coefficients are outputted as zeros, "0". The circuit 56 is repeated 128-times, once for each data bit.

TABLE B

| Error Count | $X_5$ | $X_4$ | $X_3$ | $X_2$ | $X_1$ | $X_0$ |
|---|---|---|---|---|---|---|
| 5/4 | F | E | D | C | B | A |
| 3/2 | 0 | 0 | J | I | H | G |
| 1/0 | 0 | 0 | 0 | 0 | 1 | S1 |

A combinatorial logic circuit 55 is used to provide all possible "exclusive or" combinations of the coefficients of $\sigma(x)$. These "exclusive or" combinations represent all possible coefficients of the equation $(\alpha^N \cdot K)$ given above. A combinatorial logic circuit 56 is used to test each bit position by forming the exclusive or of certain combinations of these coefficients of $(\alpha^N \cdot K)$ selected based upon bit position N for an error in bit position N. If the "exclusive-or" of these coefficients is zero "0" than an error in bit position N is indicated. The error in bit position N is corrected by inverting bit (N-41) of data bits $<127:0>$ to provide the corrected bit on output 57.

The error count determined in circuit 51 is based on certain observations. Since $x+1$ is a factor of $G(x)$, an overall parity check of all data and check bits will determine whether there are an odd or even number of bits in error:

For 4-bit and 5-bit errors $F \neq 0$
For 2-bit and 3-bit errors $F = 0$ and $J \neq 0$
For 0-bit and 1-bit errors $F = 0$ and $J = 0$
For 6-bit errors $F \neq 0$ $A \neq 0$ and overall parity indicates an even number of errors In addition:

For no errors—all syndromes=0 and overall parity checks OK
For 1-bit error
$S_1 \neq 0$
$S_3 = S_1^3$
$S_5 = S_1^5 = S_1^2 S_3$
$S_7 = S_1^7 = S_1^2 S_5 = S_1^4 S_3$
$S_9 = S_1^9 = S_1^2 S_7 = S_1^4 S_5 = S_1^2 S_7 = S_1 S_3 S_5$
and overall parity says odd number of errors.

As an example the decoding of multiple bit error correcting codes as described above with combinatorial logic can be accomplished by using high density integrated circuit gate array technology. In particular, for the example described above using 128 bits of data requires a check bit field of 41 bits using a block, cyclic, BCH binary code as described. A combinatorial logic circuit using approximately 87,000 logic gates can be provided to correct 5 bits in error and detect 6 bits in error.

Figure 6:
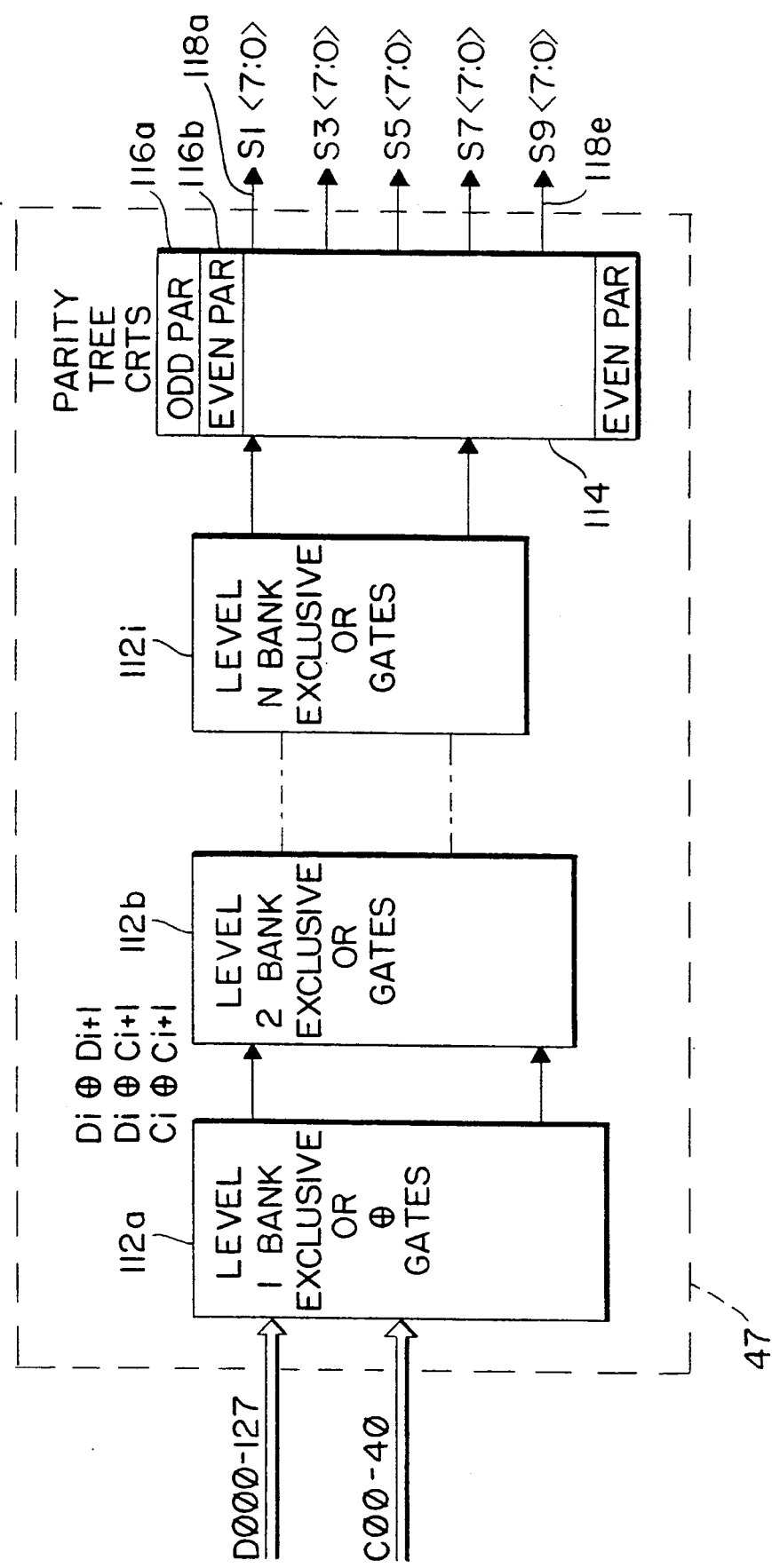
FIG. 6 is a block diagram of a syndrome generator used in the error detection correction (EDC) circuit of FIG. 5.

Referring now to FIG. 6 a circuit to provide syndromes using combinatorial logic is shown to include a plurality of levels of 112a, 112b, . . . 112i of banks of "exclusive or" $\oplus$ gates. The first level or bank 112a is a single deep bank of exclusive or gates which are fed data bits D000-D127 as well as corresponding check-bits C00-C440 and form many combinations of the check-bits and data-bits. The output from the first level 112a of exclusive or gates are thus exclusive or'ed combinations of the data-bits and check-bits. These combinations are fed to a second level of exclusive or gates to form additional combinations by exclusive or'ing the outputs from the previous or first level of exclusive or gates. The outputs from the second level of exclusive or gates are fed to a subsequent level of exclusive or gates here the subsequent level being a third level of exclusive or gates to form exclusive or combinations from the outputs of the preceding level. These outputs are then exclusive or together and fed to a bank of odd and even parity circuits and associated "exclusive or" gates as needed to form the syndromes as $S1<7:0>$, $S3<7:0>$, $S5<7:0>$, $S7<7:0>$ and $S9<7:0>$. It is to be noted that the above nomenclature $S1<7:0>$ corresponds to here the first syndrome S1, bits 7 to 0. Noting that the code word CW(x) is as given above including checkbits $C_i$ and data $D_i$, the data read from the memory will have the same code word plus an error polynomial E(x). Read Data=CW(x)+E(x) The syndromes are thus:

$S_1 = $ Read Data $(\alpha)$ $S_3 = $ Read Data $(\alpha^3)$ $S_5 = $ Read Data $(\alpha^5)$ $S_7 = $ Read Data $(\alpha^7)$ $S_9 = $ Read Data $(\alpha^9)$ Noting that each data and checkbit may or may not contribute to any bit of each syndrome $S_1$, $S_3$, $S_5$, $S_7$, $S_9$ and that each syndrome is an 8-bit member of $GF(2^8)$. Thus, a syndrome may be viewed as a member of $GF(2^8)$ which contains information about the errors and location of errors. The syndromes are logically manipulated in the circuits of FIG. 5 and as will be further described below, to extract the error information in a form which the circuit 56 (FIG. 5) can use to correct any errors.

For the check bits (i=0 to 40) the contribution to a syndrome K is given by $H(i,K)=\alpha^{i \cdot k}$ For the data bits (j=0 to 127) the contribution to syndrome K is given by $H(i,k)=\alpha^{(j+41) \cdot K}$ Each of the H values above is a member of $GF(2^8)$. That is each H is an eight bit vector whose non-zero elements indicate which syndrome bit's parity tree requires that data bit or check bit for an input. The combinations of bits which are exclusive or together are set forth in Appendix II Tables C-1 through C-5 for syndromes $S_1$, $S_3$, $S_5$, $S_7$, and $S_9$ respectively.

Although circuits such as ECC generate circuit 14 are conventional it should be noted that here circuit 14 is implemented using combinatorial logic in a similar manner as the syndrome generator circuit 47, as levels of "exclusive or" gates and "parity tree circuits" (not shown). Again noting that the code word CW(x) is as given above, it should be recalled that CW(x) is evenly divisible by G(x). Accordingly, given $D_j$ (the data bits) $C_i$ the check bits are chosen so that CW(x) is evenly divisible (no remainder) by G(x). Each data bit may or may not contribute to the particular parity tree that provides each check bit. For each data position $D_j$ <127:00> $X^{j+41}$ is divided by G(x). The results are a quotient (which is discarded) and a remainder polynomial of degree 40 or less (since G(x) is of degree 41). The non-zero terms of the remainder polynomial indicate which check bit parity trees should have $D_j$ as an input.

Figure 7:
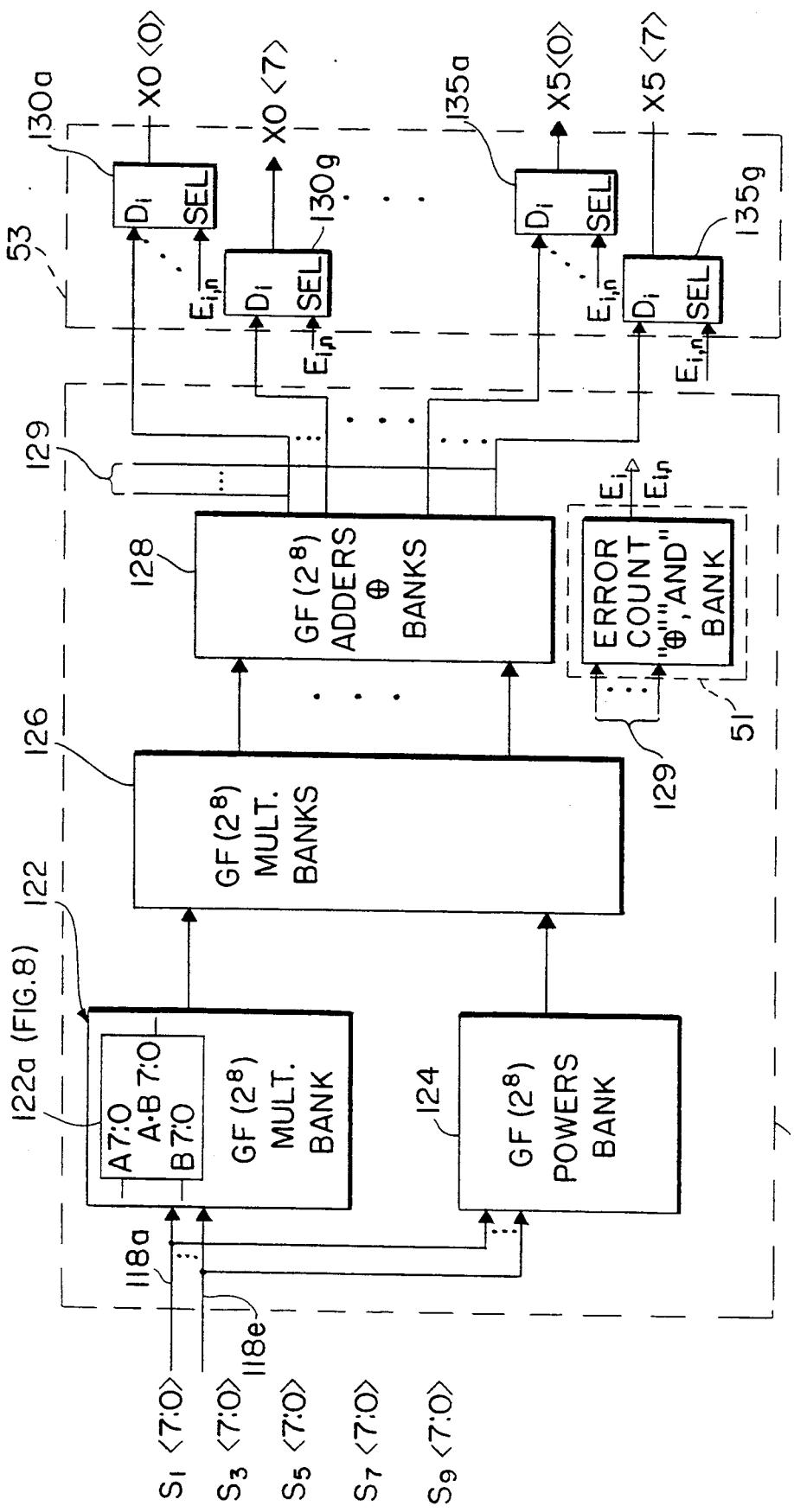
FIG. 7 is a block diagram of a circuit used to calculate coefficients of an error location polynomial in the EDC circuit of FIG. 5.

Referring now to FIG. 7 syndromes S1, S3, S5, S7, S9 are fed to a bank of $GF(2^8)$ multipliers as well as a bank 122 of $GF(2^8)$ "powers" banks 124. The multiplier bank 122 is comprised of a plurality of $GF(2^8)$ multipliers that multiply two inputs on a bit by bit basis providing the product of two inputs here two syndromes illustratively S1 and S3. The multiplier bank 122 has a sufficient number of multipliers such that all necessary multiplications as given by the calculated determinants A-J, mentioned above, are provided.

Similarly, the powers bank 124 is provided to form powers of the syndromes S1, S3, S5, S7, S9 as required by the equations A-J mentioned above. Thus, for example $S1^2$ is required in several of the equations A-J. Equations A-F also require S1 to be raised to other powers. These powers of S1 are provided by using a plurality of circuits which can raise S1 to a power. Similarly, such circuits are also provide to raise others of the syndromes S3, S5, S7, and S9 as necessary to powers. The outputs from the multiplier banks and power banks are fed to a second bank of multipliers to form the product terms in the equations A-J mentioned above. These product terms are fed to a bank 128 of $GF(2^8)$ adders which is comprised of a bank of exclusive or gates to add these selected ones of these terms to form each of the equations A-J mentioned above. Thus, using equation J as an illustrative example a term S3 will be added to the third power of S1 by an element in the adder bank 128.

Circuit 51 is also fed selected products of the syndromes, as shown for the equations discussed above in connection with the technique for determining the error count. The error count circuit is a bank of exclusive or gates and "and" gates and is used to evaluate each of these equations to determine whether the syndromes indicate 1, 2, 3, 4, or 5 or 6 or more bits in error. The bank 51 provides error enable signals $E_1$ to $E_n$. At the output of the adder bank 128 is provided all of the possible equations coefficients for the error location polynomial. Outputs of circuit 128 are thus fed to a bank of multiplexers with each bank of multiplexers having an output representing a coefficient $X_i$ of the error location polynomial $\sigma(X)$. Each coefficient X is 8-bits wide and accordingly the bank 53 of multiplexers comprises a plurality of multiplexers arranged as a first set of multiplexers 130a-130g corresponding to the coefficient X0<7:0> through multiplexers 135a-135g corresponding to coefficient X5 bits <7:0>. The error count circuit 51 provides signals $E_i$ which are fed to the select inputs of each of the multiplexers in bank 53 to choose appropriate ones of the coefficients formed from the $GF(2^8)$ adder bank 128. The coefficients fed through the outputs of the multiplexers in bank 153 are thus determined based upon the error count as described above.

Figure 8A:
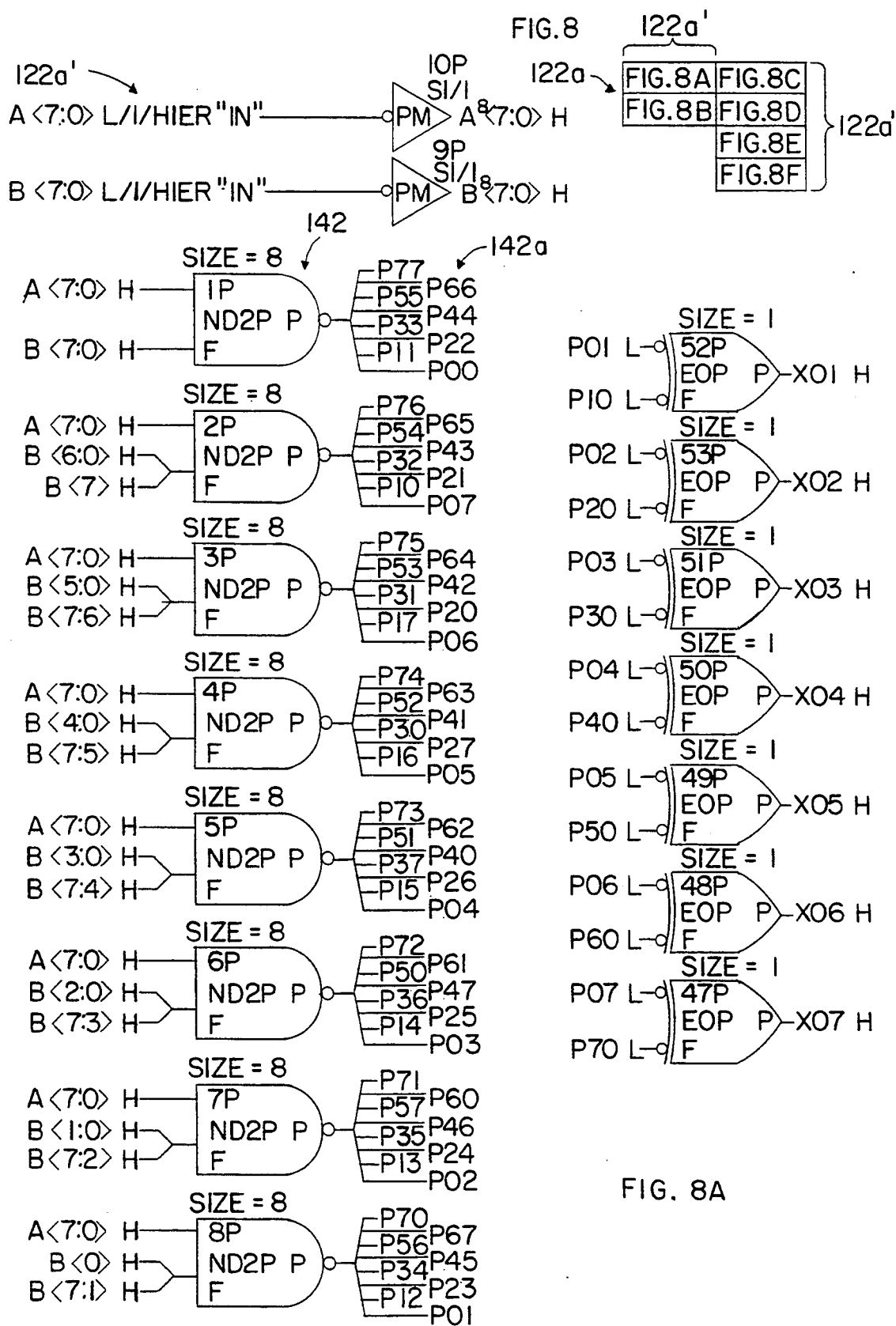
FIGS. 8A–8F are portions of a Galois Field multiplier circuit used as one of the multiplier circuits in a Galois field multiplier bank in the circuit of FIG. 7.
Figure 8B:
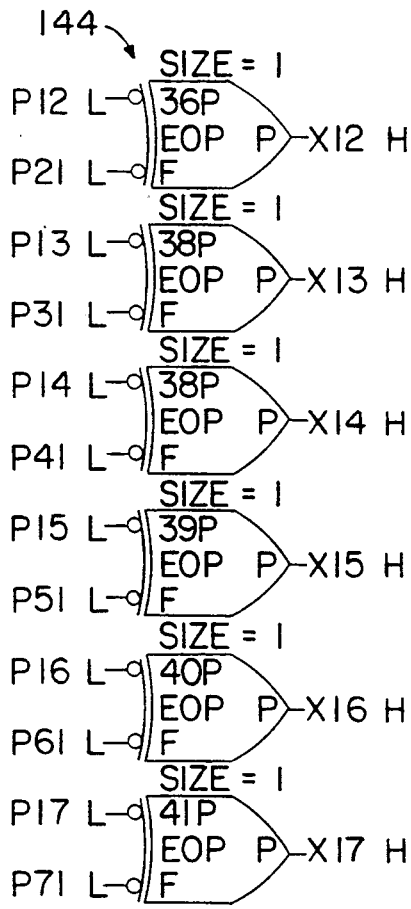
Figure 8B:
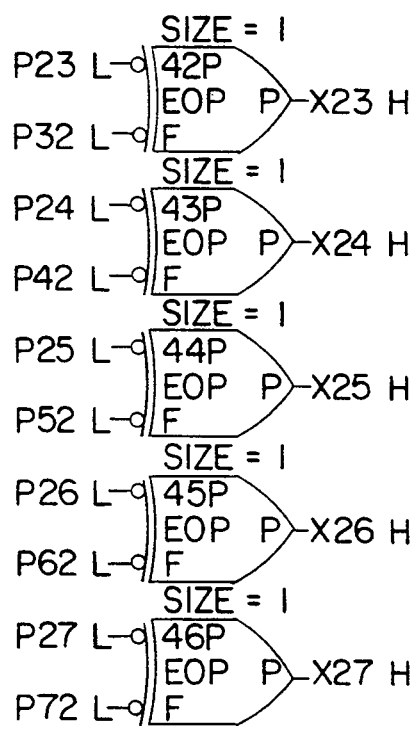
Figure 8B:
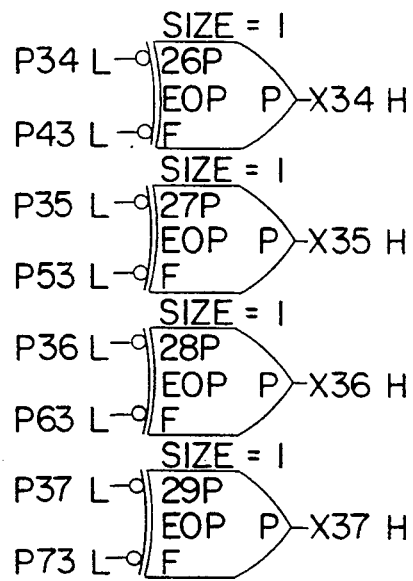
Figure 8B:
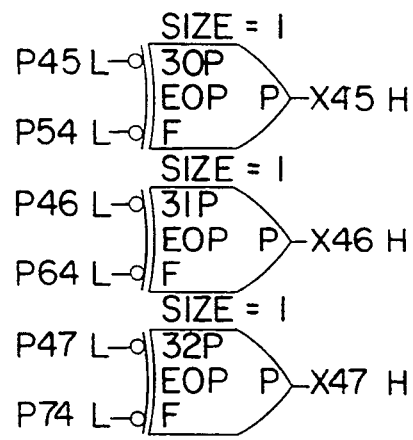
Figure 8B:
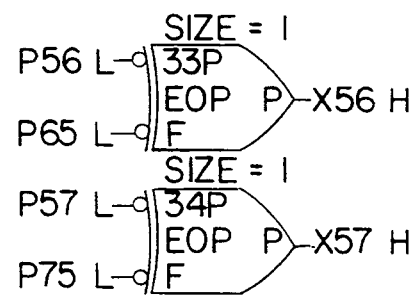
Figure 8B:
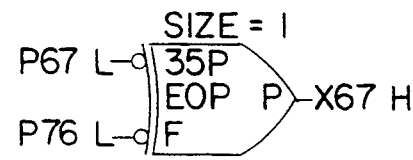
Figure 8C:
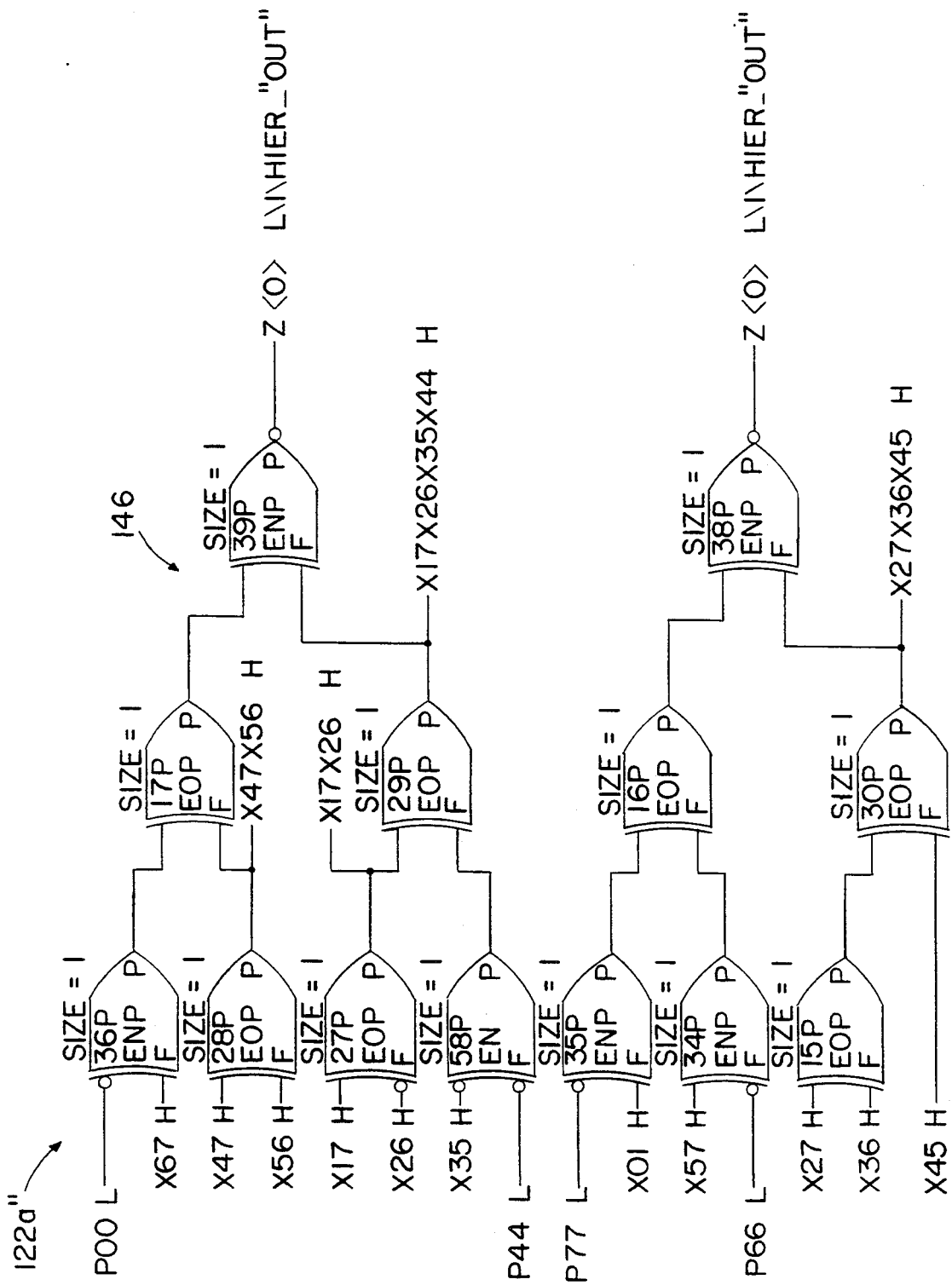
Figure 8D:
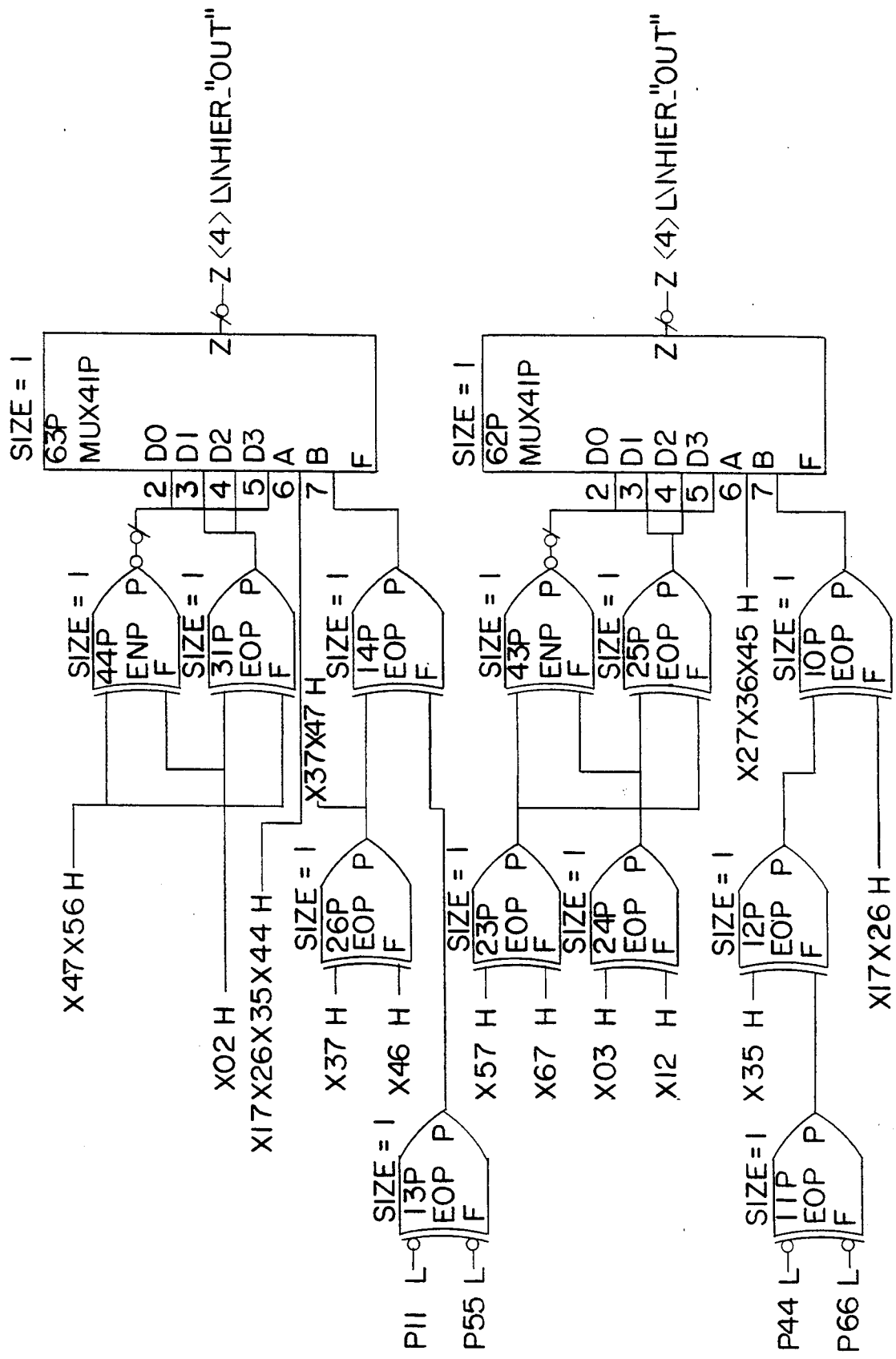
Figure 8E:
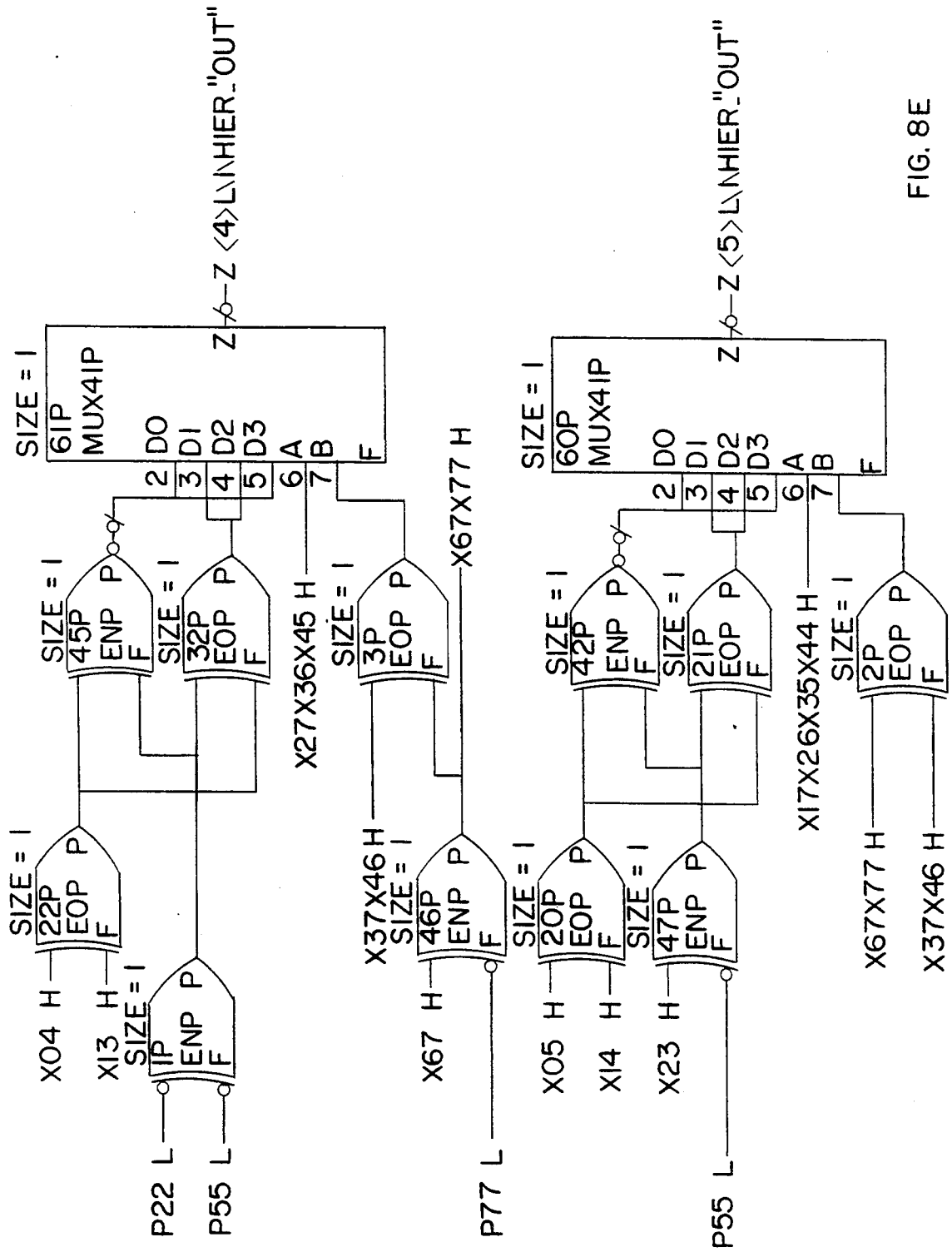
Figure 8F:
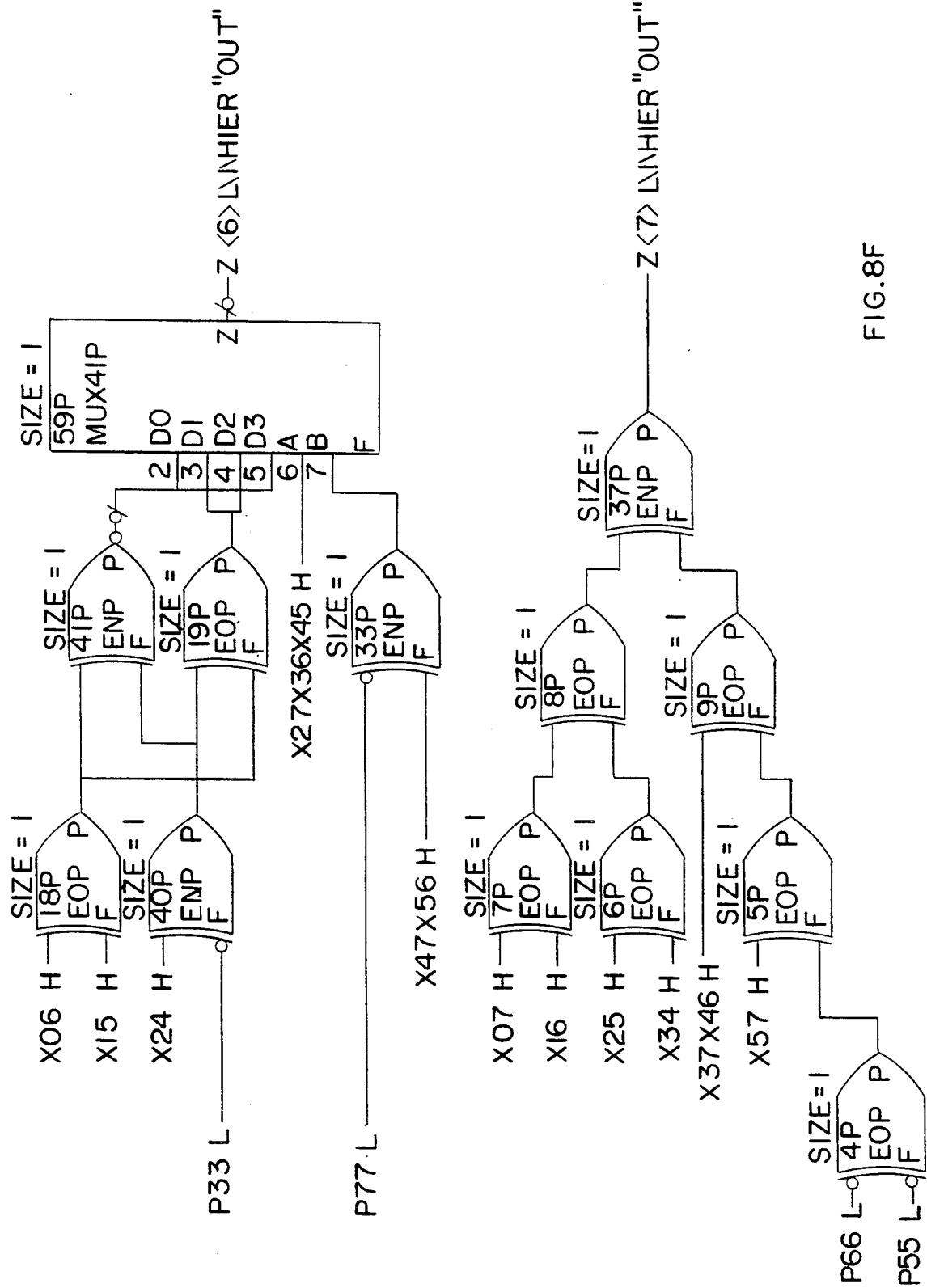

Referring now to FIG. 8 and FIGS. 8A and 8B an illustrative example of a multiplier circuit which can be adapted to provide a power circuit is shown to include a first bank 142 of here "nand" gates (for low level assertion logic) of which 8 of said gates are shown but it is to be understood that each gate shown represents a vector of 8 additional gates which can be viewed as coming out of the page towards the reader. The inputs to each of these gates are the bits of 2 polynomials A<7:0> and B<7:0>. Selective ones of each of the combinations of these bits accordingly are nand'ed together where here the function is used is for low level assertion corresponding to a logic level one, to provide a plurality of multiplicative bit-by-bit combinations as shown at the outputs of gates 142A. These multiplicative bit-by-bit combinations are fed to a bank 144 of exclusive or gates to form "exclusive or" sums of selected ones of the bit-by-bit multiplications. The outputs of these exclusive or gates are fed to a second bank of exclusive or gates 146 with said banks 146 being several levels deep of "exclusive or" gates, as shown to form an output polynomial Z<7:0>. This illustrative example of multiplication in $GF(2^8)$ can be adapted to provide other multipliers to form the other products required by the multiplier bank 122. Similarly, this multiplier circuit can be adapted to provide powers bank 124 by changing the inputs on the circuits.

Figure 9:
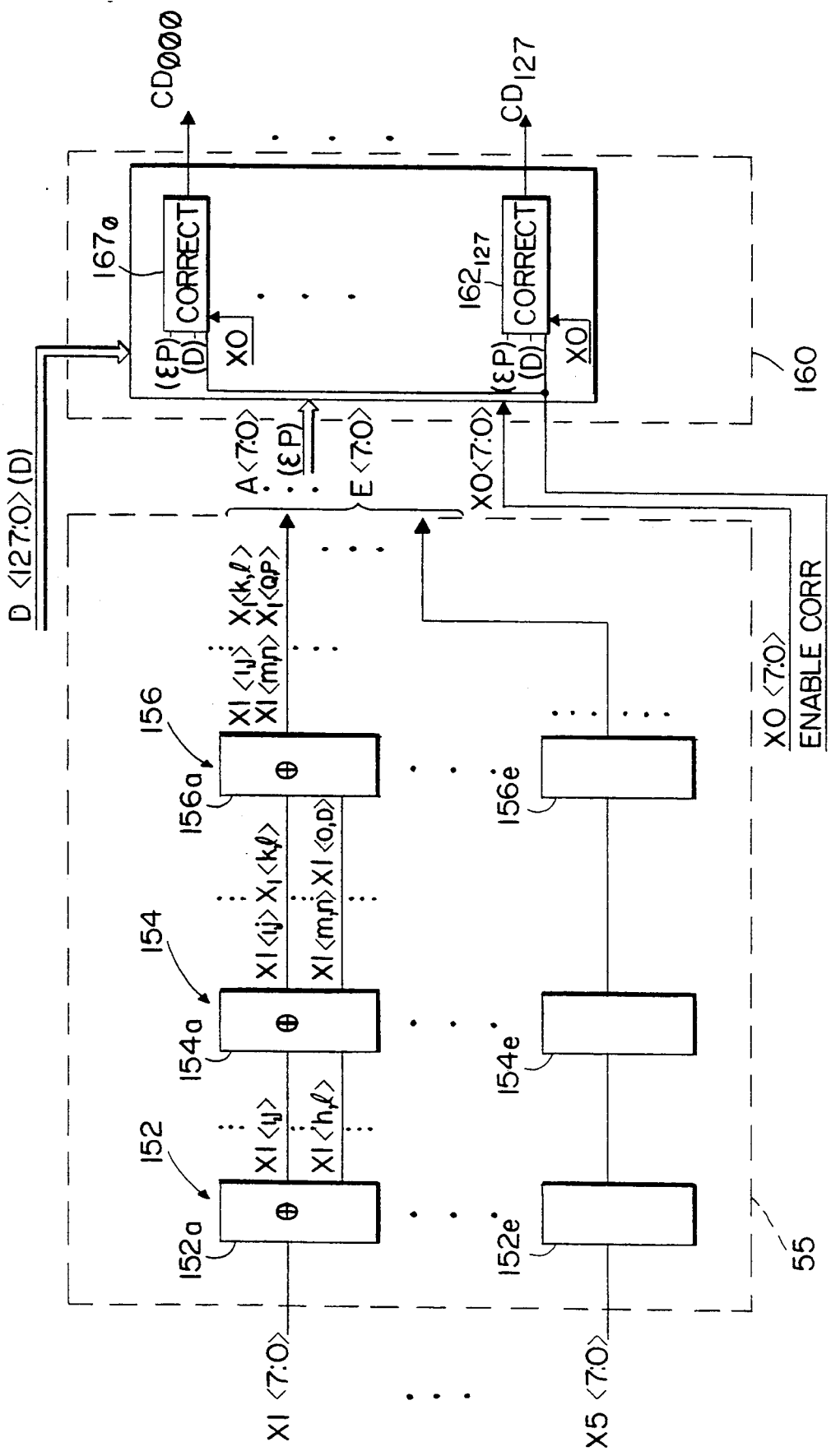
FIG. 9 is a block diagram of a circuit to provide exclusive or combinations of coefficients of an error location polynomial based on the number of errors in the data and a circuit to correct the errors in the raw data.

Referring now to FIG. 9, a circuit 55 to form an exclusive or combination of each of the coefficients X1<7:0> to X5<7:0> is shown to include here 3 levels 152, 154, 156 of exclusive or gates with each of said levels of exclusive or gates comprised of 5 banks of exclusive or gates 152a-152e, as for example for level 152. Such banks are provide for each of the coefficients X1–X5. At the last bank 156 of exclusive or gates are provided exclusive or'ed combinations of each of the preceding outputs from bank 154. These values are thus grouped together on a bit-by-bit basis for each of the error location polynomial coefficients $\alpha^N X1$, $\alpha^{2N} X2$, $\alpha^{3N} X3$, $\alpha^{4N} X4$, $\alpha^{5N} X5$ to provide the coefficients A<7:0>–E<7:0> corresponding to terms of equation $\sigma(X)$. These values as well as the coefficient X0<7:0> are fed to a bank of error correction circuits 162. Here bank 162 includes a plurality of circuits $162_0$–$162_{127}$. That is one correction circuit is provide for each bit of data in the data field. Here since the data field is 128-bits wide, 128 circuits are provided.

Figure 10:
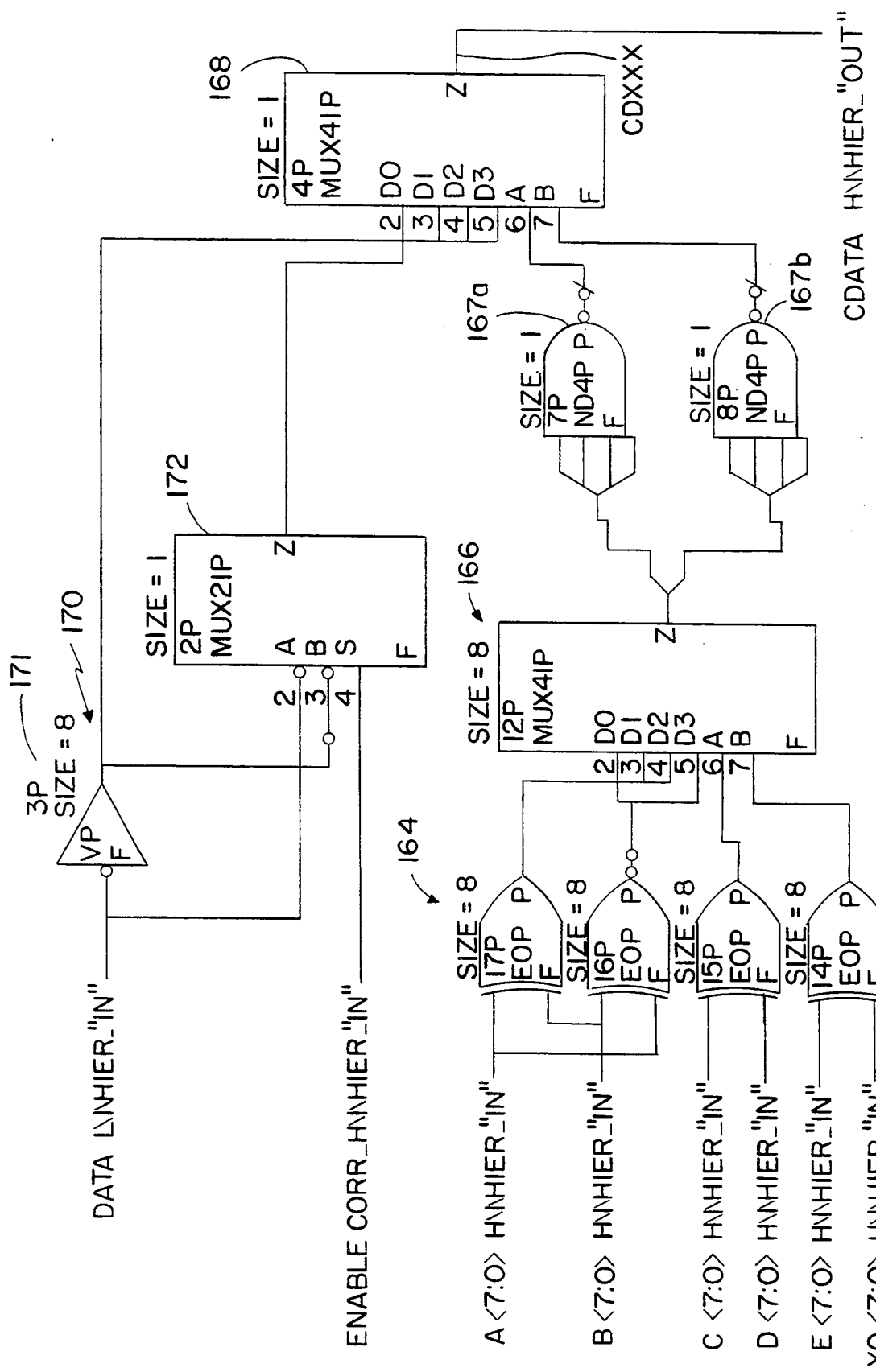
FIG. 10 is a schematic diagram of a typical error correction circuit used in the circuit of FIG. 9.

An illustrative one of those circuits $162_i$ is shown in FIG. 10 to include a first bank 164 of exclusive or gates which are fed the polynomials A<7:0>–E<7:0> as well as X0<7:0>. The bank 164 is comprised of 8 levels of exclusive or gates. Thus, it can be pictured that the "exclusive or" gates have 8 levels of gates coming out of the page towards the reader. Each one of the exclusive or gates has one of the bits A0–A7 and B0–B7 fed to the respective ones of the inputs of the gates as shown. Outputs of each of said exclusive or gates of which there are 32 here and of bank 164, are fed to corresponding inputs of one of here 8 multiplexers in a bank 166 of multiplexers. The each of the outputs of the eight multiplexers are fed to one input of two four input NAND gates 167a, 167b. Depending upon the evaluation of the exclusive or combinations of the coefficients A–E and X0 if an error occurs in the bit being corrected, the outputs of gates 167a and 167b will be 00 thus choosing path D0 of a multiplexer 168. Multiplexer 168 also has inputs D1 to D3 fed from a buffer 171 to feed the raw data from the memory. The raw data is also fed to a multiplexer 172 which provides a compliment of the data at its output. Multiplexer 172 provides the compliment of the data read from the memory. Accordingly for the situation where the outputs of nand gates 167a, 167b are both 0, the D0 position of the multiplexer 168 is chosen by the select inputs A,B coupling the output of the multiplexer 168 and thus the complimented version of the raw data from the memory through the multiplexer to line CDXXX, providing a corrected bit of data. If the evaluation at the nand gates 167a, 167b turns up either one or both of the outputs of said gates as being a logic 1 then the data is fed through lines D1, D2 or D3, and the true version of the data was read from the memory and is fed to the output.

It will now also become apparent to one of skill in the art that depending upon the degree of confidence desired in the memory system, the level of defects which may be tolerated in the memory devices, and the width of the data words, a larger number or smaller number of bits can be corrected and correspondingly detected by use of the above circuits using different values for the parameters. Thus, for example, if it is desired to provide a higher degree of confidence in the 128 bit wide field, a wider check bit field can be employed such as 49 bits to detect the presence of seven errors and correct six errors in data. Alternatively, a smaller check bit field can be provided such as 25 bits wide to correct three errors and detect the presence of four errors for the 128 bit wide data field given as the example. That is, in $GF(2^8)$ arithmetic eight bits per error plus an additional bit are needed to correct and detect errors. Thus, for 5 errors $5 \times 8 + 1$ or 41 bits are needed, as mentioned above. Alternatively, for wider data fields such as 256 data bits, $GF(2^9)$ arithmetic using 46 check bits to correct five errors $(5 \times 9 + 1 = 46)$ and detect six errors could be used. The exact scheme and hence logic network employed will thus be dependant upon the system requirements set out by the designer.

Figure 12:
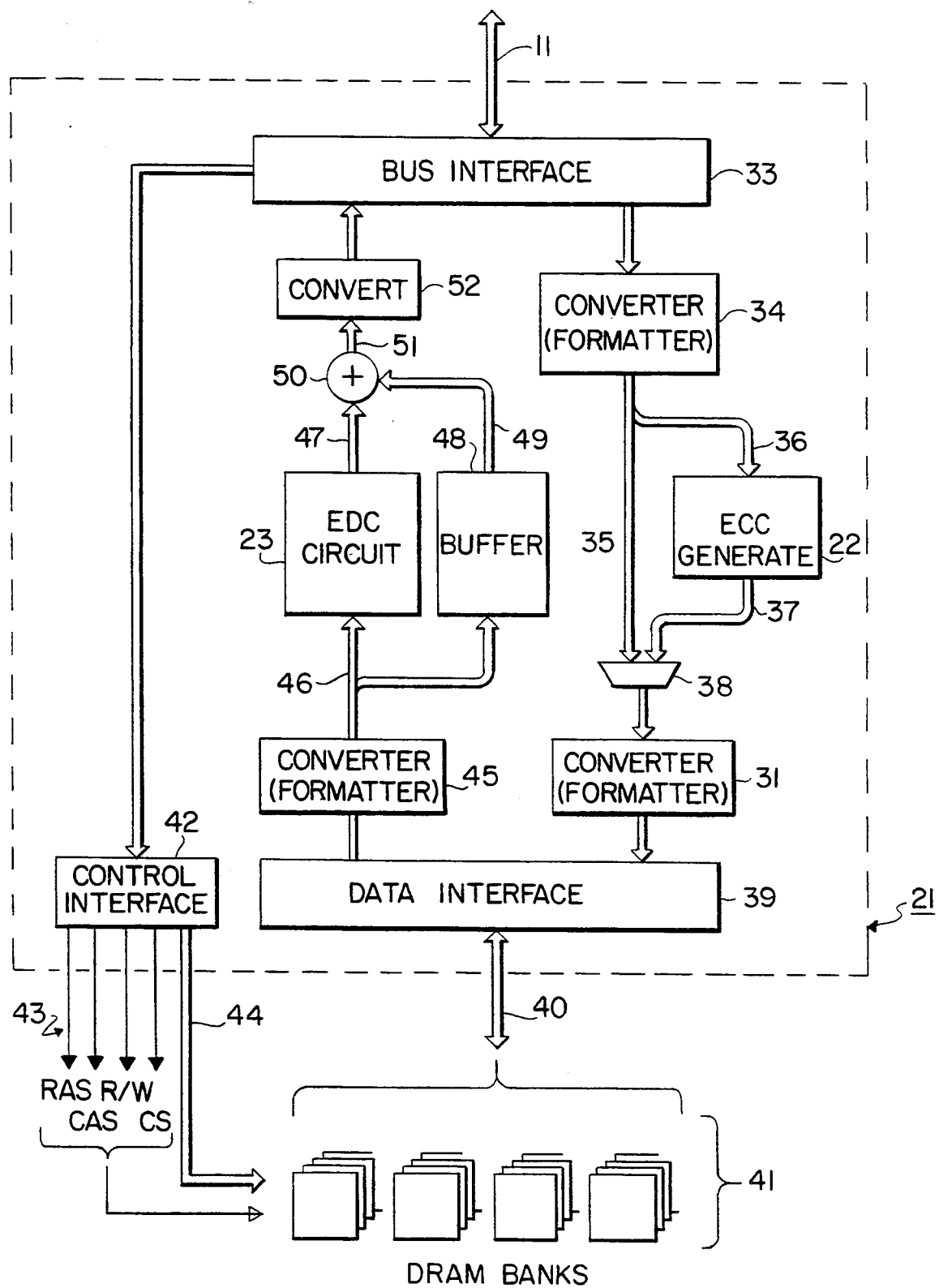
FIG. 12 is a block diagram of a memory controller for a solid state disk for use in the system of FIG. 1.

Referring to FIG. 12, a controller 21 for the solid state disk 22 is shown to include a bus interface 33 (modules 24a, 24b) which interfaces the controller to a system bus 11. A converter or data formatter 34 is provided and is used to receive illustratively 16-bit data words via the bus interface 33 and convert the 16-bit data words into 10-bit symbols for use in the error correction detection circuit 22. These 10 bit symbols are also fed to a first input of a multiplexer 38. The formatter 34 collects 10, 16-bit data words received through bus interface 33 and sequentially outputs 10-bits of data for each ordered position of the original 16-bit data word. Thus, each 10-bit symbol comprises the $I^{th}$ location of the 10, 16-bit data words fed to the formatter 34. These 10-bit symbols are fed to the ECC error correcting code check bit generator circuit 22 to produce error correcting code symbols of ten bits along bus 37 which are fed to a second input of the multiplexer 38. The 10-bit data symbols are also fed along bus data path 35 to the first input of the multiplexer 38, as mentioned above. The multiplexer 38 channels the data symbols to a converter 31 which converts the data words back from 10-bit symbols to 16-bit data words for storage in the DRAM banks 41 as will be described. Correspondingly, after all the data in a block has passed through the ECC circuit 22, the error correcting code check bit symbols provided from the error correcting code circuit 22 are likewise converted to 16-bit words in converter 31 and stored in DRAM's 41. It should be noted that the controller 21 operates on blocks of data. Illustratively, 512 BYTEs of data can comprise one block. A preferred circuit for generating the ECC check bits is described in the U.S. Pat. No. 5,107,503, mentioned above. Other error encoder and decoder circuits can be used such as a 8-error Correcting Reed-Solomon Codec, part number L64710 from LSI Logic, Inc. Milpitas, Calif.

As indicated above the symbol data and associated error correcting code check bits are then reformatted in formatter 31 into 16-bit or other suitable data words to be stored in the DRAM modules 41. During a read operation from the DRAM banks 41 data from the DRAMs banks 41 are fed through the data interface 39 to the formatter circuit 45. The formatter circuit 45 here converts 16-bit data words into 10-bit symbols as similarly described above for converter 34 that is the formatter 45 obtains 10 16-bit data words and outputs 16 10-bit symbols. The string of 10-bit symbols representing the block of data read from the DRAM bank 41 as well as its associated check bit symbols are applied to error detection and correction circuit 23 and to a buffer 48. The output of the error detection and correction circuit 23 is coupled via a data path 47 to an exclusive or circuit 50 as is the output of the buffer 48 via the data path 49. Corrected symbols if any are provide from the error correction detection circuit 23 and the original data symbols are provided on lines 49 sequentially to inputs of the exclusive or circuit 50. If the original data is correct as is the instance in the vast majority of cases, the output of the exclusive or circuit 51 will be unchanged. However, if an error was detected for the symbol it will be corrected by performing an "exclusive or" of the symbol in error provided from lines 49 with a correction vector provided by error correction circuit 23. Converter 52 is fed 10-bit correct symbol data via data path 51. The converter 52 converts the 10-bit symbol data into 16-bit or alternatively 32-bit, 64-bit, or 128-bit wide format to send to the bus interface 33 as was generally explained for converter 31. The exact conversion provided by converter 52 is dependant upon the bus width 11.

A preferred example of the formatter 52, formatter 34, ECC generator circuit 22, and EDC circuit 23 are described in U.S. Pat. No. 5,107,503 assigned to the assignee of the present invention and incorporated herein by reference. Using the above described patent, EDC circuit 23 would use a Reed-Solomon code on 10-bit symbols and associated error correcting code check bit symbols to correct errors from here a solid state disk. Further in the above patent only two formatters between the CPU bus and the controller are used. Here the circuit is modified somewhat to include two additional formatters between the DRAM banks 41 and the controller 21, since the patent describes and application using a magnetic disk which stores data serially, rather than semiconductor, DRAM's that generally store data in parrallel words. The outputs from the storage portion of the solid state disk (DRAM banks 41) and associated check bit symbols are fed to an syndrome generator (not shown here). The syndromes are applied to an error locator computer (not shown here) which calculates the error location and a correction vector for the data held in the buffer 48. The correction vector is exclusive or'ed with the buffered data in circuit 50 to provide correct data which are fed to a converter 52. Converter 52 converts the 10-bit symbol data into 16-bit wide data segments. As just mentioned, the described circuit in U.S. Pat. No. 5,107,503 does not however include the converters 31 and 45 which convert the 10-bit symbol data to 16-bit data for storage in the DRAMs and provide a conversion to take 16-bit data and convert it into 10-bit symbol data to be fed to the EDC circuit 23, respectively. These converters 31 and 45 however are similar to the converters 52 and 34, respectively. That is converter 31 provides an equivalent formatting function as converter 52 and converter 45 provides an equivalent formatting function as converter 34. The above described patent implements in sequential logic a Reed-Solomon code to correct and detect up to 32 symbols in error per block of data where a block is comprised of 413 data symbols. The circuit implements a symmetric, sequential Reed-Solomon code over the Galois Field $GF(2^{10})$. Alternatively, any error correcting block, non-binary code may alternatively be used to provide error correction detection in the controller 21.

Still referring to FIG. 12, the solid-state disk controller 21 has a bidirectional bus interface 33 for coupling to the system bus 11, from which write data is applied to converter 34 to form 10-bit symbols for use in the ECC generate circuit 22. The 10-bit symbols are applied by lines 35 to the input 36 of the ECC generate circuit 22. The ECC generate circuit 14 functions to produce sixty-seven 10-bit symbols of check bits on output 37 for each data block, which are associated with the original symbols of data on lines 35. The 10-bit wide data path 37 may be changed in a converter to 16-bits wide or other format if the DRAM storage uses something other than the 10-bit symbols as input/output. In any event, the write data is applied by data interface 39 to the read/write data lines 40 going to the DRAM memory banks 41 of the memory 12. Control circuit 42 generates memory control signals on Row Add (RAS), Col Add (CAS), Read/Write (R/W) and Chip Select (CS) lines 43 going to the banks of DRAMs. Also, row and column addresses are applied to the banks of DRAMs via the controller 42 and lines 44, based on the addresses delivered to the interface 33 from bus 11 as part of the read and write requests from the CPU. Conversion between sector addresses and memory bank addresses are made by the controller 21 (FIG. 1) using conventional techniques. A preferred technique for packing symbols in DRAMs is described in U.S. patent application Ser. No. 652,870 filed February 1991 and incorporated herein by reference.

The data processed in the ECC circuit 22 for storing in the solid-state disk 20, in one embodiment, results in sectors in the solid-state disk formatted as 512-bytes of data and 84-bytes of ECC check bits (plus 2-bits extra), but of course these have been converted from symbols of 10-bits processed in the ECC circuit 22 and on lines 35-37. This means 410-symbols (10-bits per symbol) of data, generating 67-symbols of ECC check bits, provide the content of a sector. This level of coverage can correct (in a sector) up to thirty-two symbols having errors.

A read request sent by the CPU 10 on bus 11 to the solid-state disk 20 via the storage adapter 24a and SCSI 24b is interpreted by the bus interface 33 and control circuit 42 to generate an address on lines 44 and controls on lines 43 to retrieve the sector requested, so data is returned on data I/O lines 40 and data interface 39 in whatever format used in the DRAM banks 41, then convened back to 10-bit symbols in converter 45, producing 10-bit wide symbols clocked in sequence onto lines 46. The EDC circuit 23 receives the 410-symbols of data followed by 67-symbols of ECC check bits of this sector from lines 46, and produces corrected symbols on lines 47 if errors are detected in the symbols. In the example for a data block of 410 symbols, 10-bits wide, 67 symbols, 10-bits wide of check bits can detect and correct up to 32 symbol errors if present. Ten bit wide symbols of a $GF(2^{10})$ Galois Field are used as an example. Alternatively smaller and hence less complicated symbols can be used to correct errors. For example, an 8-bit wide symbols using GF($2^8$) Galois Fields can be used to correct errors in a block of size of 128 symbols. Alternatively, three eight bit GF($2^8$) code word fields may be used to correct symbols in a block of up to 512 symbols including check bit symbols. This could be accomplished by interleaving the symbol data among the three code word fields such that each third symbol contributes to one of the three code word symbol fields. The above mentioned LSI, Inc circuit could here be used.

The 410-symbols of read data on lines 46 from the DRAM banks is also stored in a buffer 48 for the latency period (about 100-$\mu$sec as an example) of the EDC circuit 23 and then clocked out in sequence on lines 49. Corrected symbols from EDC circuit 23 on lines 47, and original data symbols on lines 49, are applied synchronously to inputs of the exclusive-OR circuit 50, so if the original data is correct (as will be true in the vast majority of cases) it is applied unchanged to output lines 51, while if an error was detected for a symbol it will be replaced by corrected data from the EDC circuit. Data on the output lines 51 of the exclusive-or circuit 50 is converted back to 32-bit (or 64-bit, or 128-bit) wide format in converter 52 before being returned to the system bus 11. It should also be noted at this juncture that these error correction techniques could be implemented in hardware as described or firmware under control of a microprocessor.

Referring back to FIG. 4, as with the main memory 38 described above, it is important to note that sectors (512-bytes of data, 84-bytes of check bits) stored in the DRAM banks 41' (FIG. 12) of the solid state disk 20 (FIG. 1) at address locations 43 are addressed by lines 44 to encompass the entire address space of the array of DRAM devices in the DRAM array. This address space 43 is shown in FIG. 4, going from 00000000 to xxxxxxxx, in linear fashion, where each address increment is populated by a sector location (not referenced) in the memory banks 41. There are no locations skipped or mapped around, even though faulty bits 43 might exist in various symbols in the sectors throughout the address space 41. These faulty bits can exist in locations where the data symbols and the check bit symbols are stored. This is in contrast to prior solid-state disks of this general construction. Ordinarily sectors having hard errors are mapped around, i.e., their addresses are stored in a table of bad sectors in non-volatile storage so that the location is never used but instead a substitute location is referenced whenever the address points to a faulty location identified from the table. Techniques which detect bad sectors and avoid using of these bad sectors maybe also advantageously employed in a solid state disk system incorporating the features of the invention. With the above arrangement, DRAMs having known bad bits may be used to provide the DRAM banks 41, and these DRAM devices need not be permanently mapped around or excluded from operating use.

Advantages of the present invention will now become apparent. For the main memory controller of FIG. 3, the array of memory devices associated with that memory may have bits which are known to be defective for any reason. Assuming a 5-bit correction, 6-bit detection EDC circuit 15 is used various levels of defective bits can be tolerated in a memory system depending on the distribution of errors and the degree of confidence needed in the manufacture of the main memory system. The distribution of faulty bits in 169-bit blocks of memory, assuming a certain level of bad bits, can be calculated. For example, if 0.100% of the bits are defective (1-of-1000), assuming random distribution, in 16 Meg code blocks 43 of 169-bits each, there would be a distribution of code blocks as seen in Table D. It is seen that there would be 14,167,310 code blocks with zero defects, 2,396,672 with two bad bits, etc. There is on average less than one bad code block with six bad bits in 16 Meg blocks. Six bad bits are not correctable in the example implementation given above. Thus, a memory system of 16 Meg blocks, 128-data-bits per block, i.e., 256-MBytes of main memory 12, would be marginally possible at this level of defects; about one of two boards would work. Still, this is an extremely high defect density, 0.100% of bits faulty is 4000 bad bits in a 4 Mbit DRAM, whereas DRAMs are ordinarily sold with zero bad bits (indeed, a 4 Mbit DRAM device with one bad bit is usually considered trash, unless sold as an "audio RAM").

Another example is illustrated in the data of Table E. Here the defect density is assumed to be 0.010%, or 400 bad bits in a 4 Mbit DRAM (one bad bit about every sixty 169-bit blocks), still a very large number of defects. The statistical prediction for this level of defect density is that there would be 16,496,049 code blocks with no defects (16 Meg is 16,777,216), 140,581 blocks with one bad bit, 590 with two bad bits, one with two bad bits, etc. Only one 256 MByte memory system in ten million such systems would exhibit a non-correctable hard error detection of 6-bits. This would of course be an acceptable level for economical production of such memory systems. Indeed, it is expected that defect densities of much lower than 0.010% can be produced by DRAM manufacturers at costs of substantially less than the current cost of DRAMs with zero bad bits.

The statistical dam of Table E shows that an EDC circuit 15 which produced 4-bit correction, 5-bit detection would be acceptable; only three of one thousand systems would have 4-bits faulty, and only five of a million systems would be fatally defective, exhibiting 6-bits faulty and thus uncorrectible. Of course, soft errors will occur due to alpha particles, and these will be in addition to the defect density assumed in the calculations. Therefore, to be assured of an adequate margin of error, it is expected that an EDC circuit 15 that will correct at least three errors will be needed for an economical large system.

Further advantages of the present invention will now become apparent. For the solid state disk memory controller of FIG. 12, the array of memory devices associated with that memory may have bits which are known to be defective for any reason.

TABLE D

ASSUME 0.100% BAD BITS IN 16Meg CODE BLOCKS OF 169 BITS

| NUMBER OF BAD BITS | BINOMIAL DISTRIBUTION |
|---|---|
| 0 | 14167310.29897149233148 |
| 1 | 2396672.11263882101048 |
| 2 | 201521.97944110206663 |
| 3 | 11229.28614169637785 |
| 4 | 466.48185673713682 |
| 5 | 15.40931058290842 |
| 6 | 0.42160943203153 |
| 7 | 0.00982730407853 |
| 8 | 0.00019920210970 |
| 9 | 0.00000356707148 |
| 10 | 0.00000005713027 |
| 11 | 0.00000000082662 |
| 12 | 0.00000000001089 |
| 13 | 0.00000000000013 |
| 14 | 0.00000000000000 |

TABLE E

ASSUME 0.010% BAD BITS IN 16Meg CODE BLOCKS OF 169 BITS

| NUMBER OF BAD BITS | BINOMIAL DISTRIBUTION |
|---|---|
| 0 | 16496049.53992908005603 |
| 1 | 278811.11833663511788 |
| 2 | 2342.24761878961397 |
| 3 | 13.03981572616813 |
| 4 | 0.05412064732833 |
| 5 | 0.00017861599778 |
| 6 | 0.00000048826589 |
| 7 | 0.00000000113708 |
| 8 | 0.00000000000230 |
| 9 | 0.00000000000000 |
| 10 | 0.00000000000000 |
| 11 | 0.00000000000000 |
| 12 | 0.00000000000000 |
| 13 | 0.00000000000000 |
| 14 | 0.00000000000000 |

Assuming that a certain level of error detection and correction is provided by the circuits of FIG. 12 a given level of defects can be tolerated in the memory devices of the solid state disk. The distribution of faulty bits in 512-symbol code blocks of memory, assuming a certain level of bad bits, can be calculated. For example, assume that a 204-Mbyte solid-state disk is to be constructed, using 16-Mbit DRAMs. Referring to Table F, assume that 1% of the symbols have a bad bit or bits, which is a rather high fault rate. This 204-Mbyte disk will have 417,792 code blocks of 512-symbols per code block. In this case, calculating the distribution, only 2433 code blocks will have zero bad symbols. 12,583 will have one bad symbol, 32,476 will have three, etc. As expected, the highest probability (73,563) is that of having five bad symbols in 512 symbols (1%). The probability of having more than thirty-two bad symbols in any code block of the 512 is very, very low, however (one per many billion system constructed) so systems could be economically manufactured using this level of faulty bits in DRAMs.

Another example is illustrated in Table G, where the defect density is assumed to be 0.1% bad symbols. This would be 400 bad bits in a 4-Mbit DRAM, or one bad bit about every 10,000 symbols. It is seen that 250,316 code blocks have no bad symbols, 128,290 have one bad symbol, etc. Virtually no blocks have more than ten bad symbols. Thus, at this level, a detecting and correcting mechanism which corrects much less than the 32-symbols mentioned above would be adequate for economical manufacture of systems. Indeed, a level of ten or twelve would seem to be acceptable.

The ability to use memory devices such as DRAMs having hard faults in either main memory 12 or the solid state disk 20, without a mapping mechanism for removing the bad location, sectors or symbols from the address space of the DRAM array 41, may make wafer-scale integration economically feasible. A wafer 60 as seen

TABLE F

ASSUME 1.000% BAD SYMBOLS IN 417792 CODE BLOCKS OF 512 SYMBOLS

| NUMBER OF BAD SYMBOLS | BINOMIAL DISTRIBUTION |
|---|---|
| 0 | 2433.21090213355205 |
| 1 | 12583.87860497352153 |
| 2 | 32476.57559162358302 |
| 3 | 55767.85707652534438 |
| 4 | 71681.41225240252606 |
| 5 | 73563.95439236461061 |
| 6 | 62789.43581974555127 |
| 7 | 45846.25472552849715 |
| 8 | 29232.77605605036752 |
| 9 | 16535.71170847293479 |
| 10 | 8401.47776703220802 |
| 11 | 3872.85751978895166 |
| 12 | 1633.25051970897707 |
| 13 | 634.51846142539901 |
| 14 | 228.44495833425260 |
| 15 | 76.60982441108269 |
| 16 | 24.03729970473996 |
| 17 | 7.08407644298932 |
| 18 | 1.96779901194148 |
| 19 | 0.51679570010584 |
| 20 | 0.12867690916777 |
| 21 | 0.03045167836005 |
| 22 | 0.00686491004352 |
| 23 | 0.00147729728648 |
| 24 | 0.00030403971931 |
| 25 | 0.00005994803355 |
| 26 | 0.00001134214931 |
| 27 | 0.00000206220897 |
| 28 | 0.00000036081217 |
| 29 | 0.00000006082657 |
| 30 | 0.00000000989200 |
| 31 | 0.00000000155358 |
| 32 | 0.00000000023588 |
| 33 | 0.00000000003466 |
| 34 | 0.00000000000493 |

TABLE G

ASSUME 1.00% BAD SYMBOLS IN 417792 CODE BLOCKS OF 512 SYMBOLS

| NUMBER OF BAD SYMBOLS | BINOMIAL DISTRIBUTION |
|---|---|
| 0 | 250316.85371417047645 |
| 1 | 128290.51962127655861 |
| 2 | 32811.03880203819972 |
| 3 | 5583.46005640289684 |
| 4 | 711.20649867594457 |
| 5 | 72.33091117665262 |
| 6 | 6.11808007450165 |
| 7 | 0.44269248072327 |
| 8 | 0.02797293578144 |
| 9 | 0.00156805245622 |
| 10 | 0.00007895199054 |
| 11 | 0.00000360668844 |
| 12 | 0.00000015072997 |
| 13 | 0.00000000580311 |
| 14 | 0.00000000020705 |
| 15 | 0.00000000000688 |
| 16 | 0.00000000000021 |
| 17 | 0.00000000000001 |
| 18 | 0.00000000000000 |
| 19 | 0.00000000000000 |
| 20 | 0.00000000000000 |

TABLE G-continued

ASSUME 1.00% BAD SYMBOLS IN 417792 CODE BLOCKS OF 512 SYMBOLS

Figure 11A:
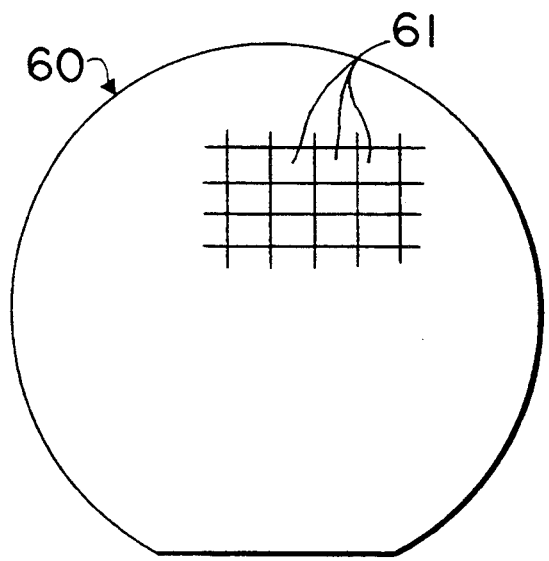
FIG. 11A is diagram of a wafer including a wafer-scale integrated memory which may be used in the system of FIG. 1.

| NUMBER OF BAD SYMBOLS | BINOMIAL DISTRIBUTION |
| --- | --- |
| 21 | 0.0000000000000 |
| 22 | 0.0000000000000 |
| 23 | 0.0000000000000 |
| 24 | 0.0000000000000 |
| 25 | 0.0000000000000 |
| 26 | 0.0000000000000 |
| 27 | 0.0000000000000 |
| 28 | 0.0000000000000 |
| 29 | 0.0000000000000 |
| 30 | 0.0000000000000 |
| 31 | 0.0000000000000 |
| 32 | 0.0000000000000 |
| 33 | 0.0000000000000 |
| 34 | 0.0000000000000 | in FIG. 11A contains a large number of DRAM memory arrays 61 in undivided form, each device containing perhaps a 4 Mbit or 16 Mbit array of cells. Thus, the entire wafer 60 may contain perhaps several hundred megabytes of DRAM memory. It has been previously proposed to utilize a wafer in undivided form, instead of scribing and breaking into individual chips which are then packaged. However, when the system requirement is that all bits be good, then some mechanism has to be provided to work around the inevitable bad bits or chips having bad bits. Such a mechanism results in added interconnections to the DRAM devices, in order to individually select devices so that bad devices may be deselected. The ability to use all of the devices radically changes the interconnection scheme needed, and thus changes the economics of manufacture of wafer-scale integrated DRAM memory systems for solid-state disk or the like.

Figure 11B:
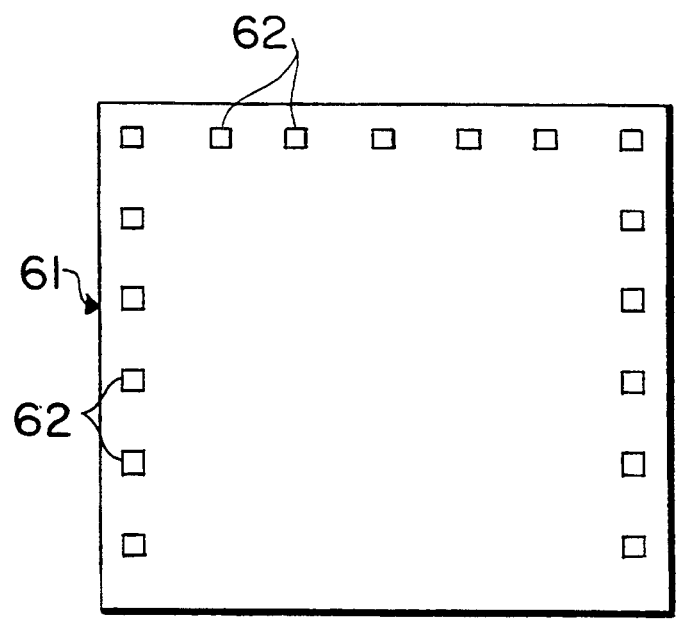
FIG. 11B is a top view of a chip or die in the wafer of FIG. 11A.

Referring to FIG. 11B, an individual die 61 in the wafer 60 has a number of pads 62 which in an individually packaged device are used for bonding to a lead frame, as by small gold wires. For a 4 Mbit DRAM, the number of address bits needed is eleven (multiplexed row and column addresses) and the number of control bits is usually five (RAS, CAS, R/W, CS, OE), plus power supply Vdd and Vss, and a data I/O connection (or separate data-in and data-out connections, or by-4 or by-8 parallel data I/O connections). The total connections to a 4 Mbit-by-1 device are thus nineteen or twenty. A 16 Mbit device needs one more address bit (multiplexed). In undivided form in the wafer 60, instead of bonded connections to a lead frame as used in conventional packaged DRAMs, buses must be provided on the wafer 60 to all of these nineteen pads 62 per die 61 by another level of metallization. The die 61 need not be individually selected by addressing lines, however, because the same 11-bit address may be applied to all 150-or-200 or so die on the wafer 60, and since the data input/output is perhaps 64-bits or 128-bits wide, then perhaps the only address selection is all of the die on a wafer 60, or half of the die on a wafer, for a given address. Individual chip-select signals thus need not be routed to every chip, but instead only a few chip select signals may be bussed to all die in common. This reduces the overhead of interconnections, compared to a situation where all bits must be good and certain die 61 must be mapped around.

Construction of a wafer-scale integrated DRAM unit for a solid-state disk 20 where a level of bad bits of perhaps 0.02% is present is therefore greatly simplified. The wafer 60 is tested at the probe stage, where the pads 61 are available (not yet covered) to see if all die on the wafer meet the 0.02% level (or whatever level is specified). This is quite likely to be almost all wafers. If there are 200 die per wafer, and the yield of die with all good bits is, say, 80%, then the likelihood of getting a wafer with all good die is minuscule, but if 32-symbols are bad per 512 is acceptable, and the most common failure (90% of bad die) is 1-bit or two bits bad, then the likelihood of a wafer being acceptable can be calculated to be reasonably high. A wafer-scale integrated memory device is thus practical and economical.

Figure 13:
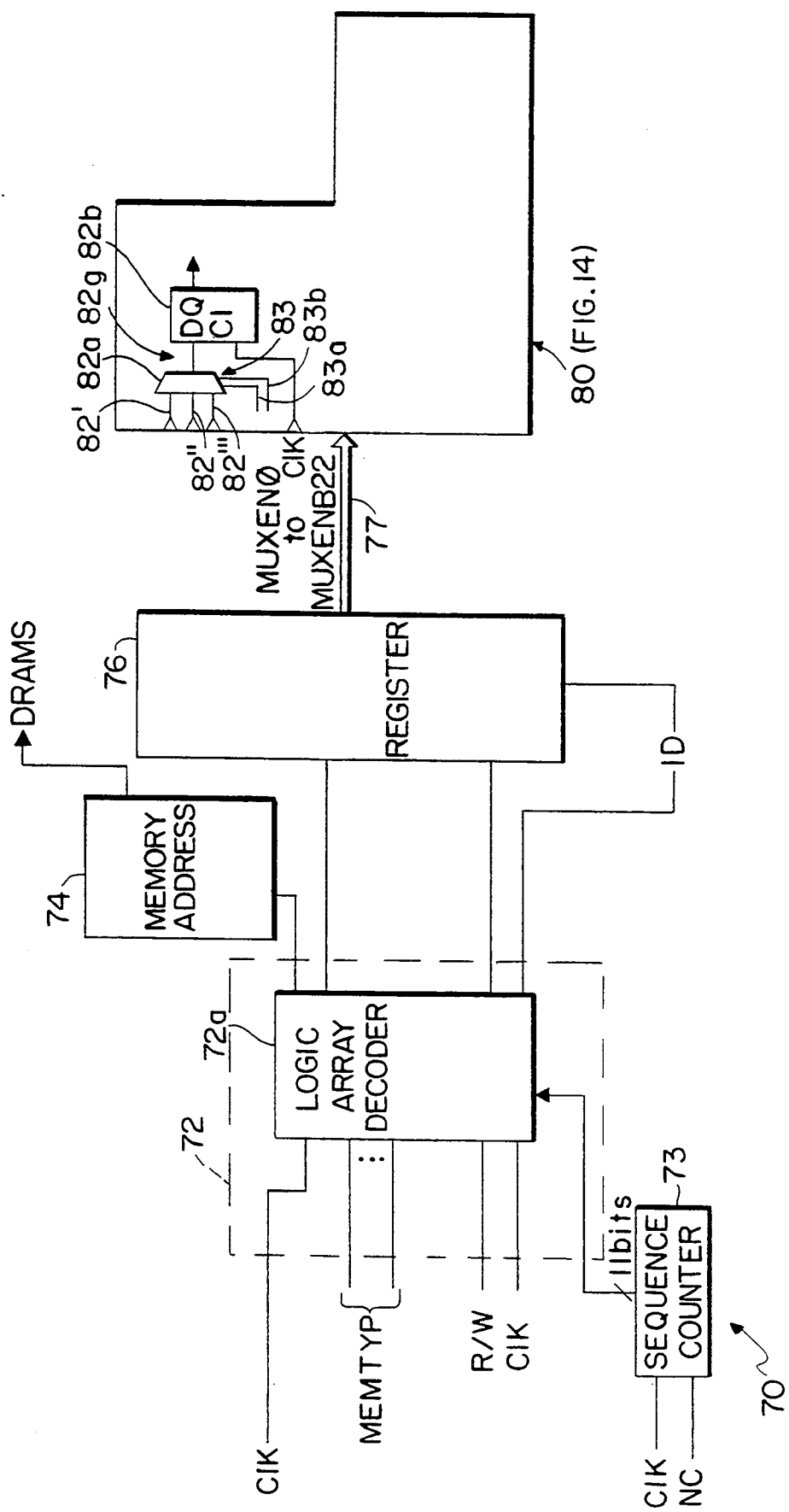
FIG. 13 is a block diagram of a data formatter for converting between symbol data format and memory data format.
Figure 14:
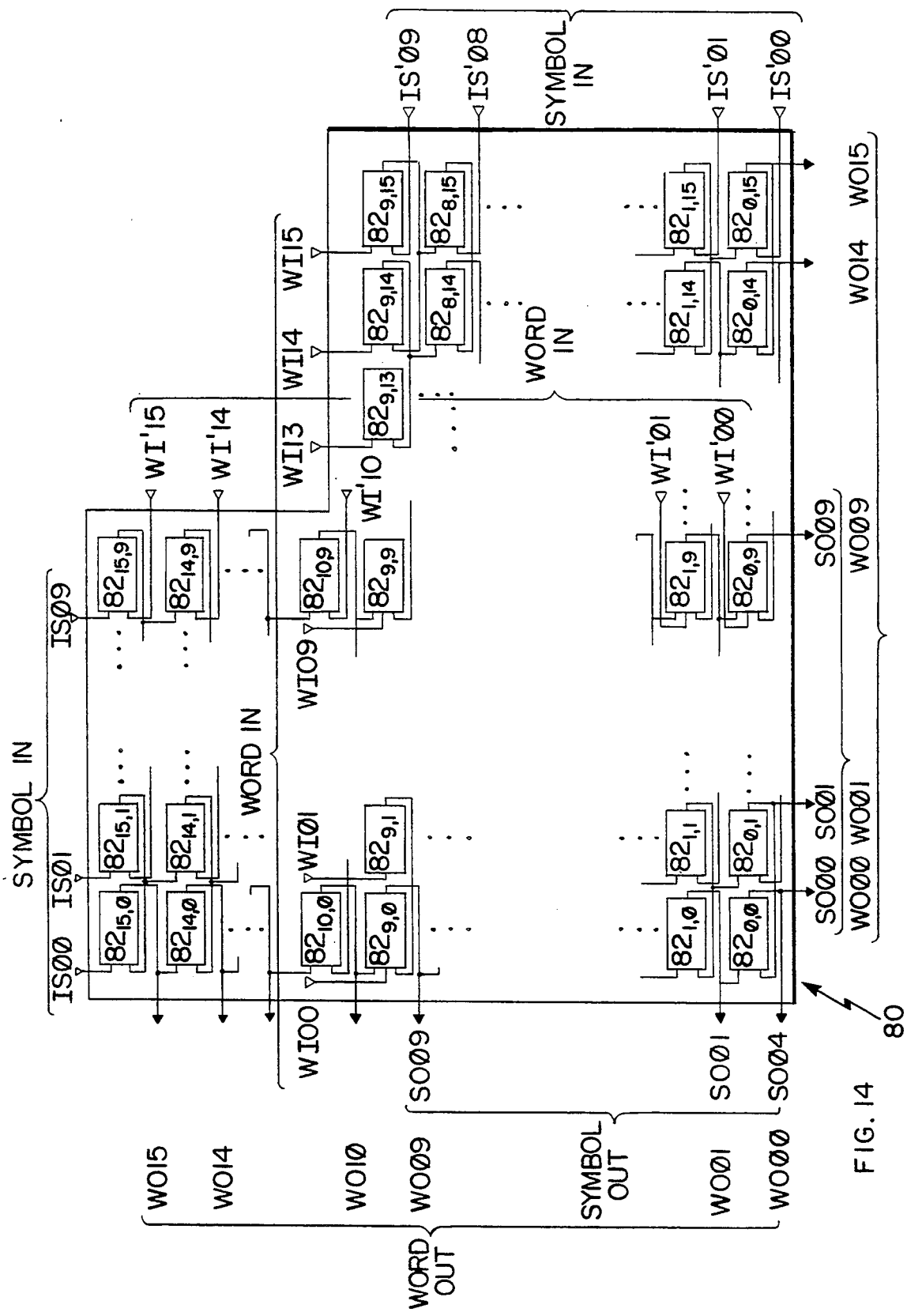
FIG. 14 is a block diagram of an array used with the formatter of FIG. 13.

Referring now to FIGS. 13 and 14, a data formatter 70 preferred for use in the memory controller 21 of the solid state disk memory 20 in particular for converters 31 and 45 is shown to include a control logic circuit 72 including a counter 73 and a logic array decoder 72a. Logic circuit 72 as well as a formatter array 80 are provided in a gate array circuit. The logic array decoder is fed by data MEMTYP which indicates the type of memory used in the DRAM banks 41 (FIG. 3). That is the decoder 72 is fed a code here from boards (not shown) of the memory banks 41 which indicate the configuration of the memory chips used in the memory bank 41. Illustrative examples include memory chips configured as X×1 bit, X×4 bits, and X×8 bits, for example. The described formatter 70 permits the memory controller 21 to be used with various configurations of DRAM. All that is necessary is to specify the memory type to the control logic of the formatter. Here data are fed into decoder 72 along lines MEMTYP. Three or four bits of data can be decoded to indicate the type of memory currently being serviced by the memory controller 21. The control logic 72 also is fed by a signal on line R/W which is used to indicate whether a read or write is occurring.

A clock signal is fed the logic array decoder 72a. The logic array decoder 72b in response to the decoded MEMTYP bits, R/W and clock signals provides multiplexer enable signals along lines MUXEN00 to MUXEN22. Selected ones of these lines are used to select data paths for elements of a formatter array 80. Counter 74 is used to keep track of the number of symbols or the number of words loaded or read from the array as will be described. The control logic 72 includes a second counter 73 which issues addresses to the control logic array 72. Logic array 72 uses these addresses to issue in a proper sequence the various MUXEN signals number of the word or symbol. Accordingly, it is noted that the formatter counter 73 counts symbols read or written in the array 80.

As illustrated in FIG. 13, a typical array element 82 includes a data selector or multiplexer 82a and a single bit storage element here a D flip-flop. The flip-flop changes state via the clock signal CLK and thus loads the output of the MUX 82a. Here a three input MUX 82a having inputs 82', 82'', and 82''' is shown, however most of the array elements in the array will have only two inputs that are selected between by the MUXEN signals. The MUXs are here used to permit the data in array 80 to be shifted left or down depending on the particular circumstance, although shifting right and up could have been provided by appropriate connection of the array elements 82. That is the MUXs permit multiple data paths to exist in the array. The MUXEN signals are issued synchronously with the clock, via the register 76.

Referring now to FIG. 14, the array 80 is shown with some of the elements $82_{ij}$ present and the data paths used to interconnect them. The array 80 is shown to include external lines IS00 to IS09 and IS'00 to IS'09 used in input symbol data during each of two phases of a symbol to data word conversion. The formatter array 80 also includes lines WO00 to WO15 and WO'00 to WO'15 used to output convert data words from the array 80 during each of two phases of the conversion. The formatter also includes lines WI00 to WI15 and WI'00 to WI'15 used to input data words and SO00 to SO09 and SO'00 to SO'09 used to output the convert symbols during each of two data word to symbol conversion. This permits data to be formatted from symbol data to memory data and vis-a-versa. It also permits data to be read from the array while the next burst of data is being written into the array 80.

In particular elements $82_{00}$ to $82_{15,0}$ of a first column "0" of the array 80 are shown having two data inputs. A first input to each element is from an adjacent element in its corresponding row on that element's right or the succeeding element, and the second is, for element $82_{15,0}$ from symbol line IS00, and for preceding elements $82_{0,0}$ to $82_{14,0}$, the second input is from the preceding one of the elements $82_{1,0}$ to $82_{15,0}$ in the same column. This permits symbols from line IS00 and for the remaining elements 82 of symbol lines IS01 to IS09 to be shifted down and to the left during a symbol to data word conversion. Correspondingly, elements $82_{0,0}$ to $82_{0,09}$ have two inputs one is lines IS0 to IS9, and the other inputs are the output of the succeeding one of said elements $82_{0,01}$ to $82_{0,09}$ for elements $82_{0,00}$ to $82_{0,08}$. For elements $82_{0,09}$ its second input in the data line WI'15. This arrangement permits left shifting during symbol to data word and data word to symbol conversions. The remaining array elements $82_{ij}$ are connected in a corresponding manner, as shown for exemplary ones of said array elements 82. Here, for conversion between 16 bit data words and 10 bit symbols, the array contains 220 elements. That is the array 80 is 16 array elements×16 array elements, with a section of 6 array elements×6 array elements omitted. This arrangement is less costly and saves space.

It is noted that elements $82_{0,9}$ to $82_{9,9}$ and elements $82_{9,0}$ to $82_{9,9}$ are elements having a three input MUX. The third input of these elements is from WI<15:0> and bits 0 to 9 of WI<15:0>.

In operation, the formatter receives data either from a memory bank 41 or as symbol data from the ECC 22. As an example, if symbol data is fed to the array 80 the array 80 under control of the logic circuit 72 reformats the data as words to be stored in memory. In particular, here 16, 10 bit symbols are loaded in the array by storing the first data symbol in elements $82_{15,0}$ to $82_{15,09}$. This symbol is then shifted down to the next row of ten elements i.e. $82_{14,0}$ to $82_{14,09}$, while the next symbol is loaded into the elements $82_{15,0}$ to $82_{15,09}$. This proceeds until the 16 symbols have been loaded. When all 16 symbols have been loaded, 10, 16 bit data words are shifted out along lines WO00 to WO15 by shifting left the data stored in the appropriate array elements 82. That is the stored data in the array elements 82 mentioned above are now shifted left by columns to a preceding one of the columns. As the data words are shifted out of the array 80, a new set of symbols can be loaded into the array along lines IS'00 to IS'09 and will in turn be read out along lines WO'00 to WO'15, during a subsequent formatter phase. The address counter 73 is incremented each time a symbol is loaded into the array 80 and thus during writing of that portion of the array the counter 73 keeps track of the number of symbols and addresses the logic circuit to provide the appropriate inputs to the circuit which forms the correct MUXEN signals as outputs to the array. This sets up the input path to said MUX for the next data shift sequence on the array. During read out the counter keeps track of the number of words read from the array 80.

Operation of the formatter 70 for converting from data words to symbol data is analogous. Memory words are loaded along lines WI00 to WI15, shifted down for 10 cycles and then shifted left and read out along lines SO00 to SO09 during a second phase while data after six periods are loaded into the array 80 during a second phase on lines WI'00 to WI'15. This data is read out on lines SO00 to SO09 while data again is written after six periods into the array via, lines WI00 to WI15.

For memory configured with 1-bit or 4 bit wide DRAM's the above arrangement can be used. They are pictorially illustrated in FIGS. 15A and 15B. As shown the term "phase" represents the operation cycle being performed on the array 80. In FIG. 15A block "A SYMBOLS" are written into the array 80 at "$\phi_1$ BLOCK A SYMBOLS IN" during phase 1, while data words from a previous block "B WORDS" written during a previous phase 2 write cycle are read out as data words at "$\phi_2$ BLOCK B WORDS OUT". Block "B SYMBOLS" are written during phase 2 at "$\phi_2$ BLOCK B SYMBOLS IN" while data words written from a previous block "A WORDS" written during a previous phase 1 write cycle are read out at "$\phi_1$ BLOCK A WORDS OUT".

Similarly, as shown in FIG. 15B, block "A WORDS" are written in during phase 1 at "$\phi_1$ BLOCK A WORDS IN" are read out as BLOCK A SYMBOLS during phase 2 at "$\phi_2$ BLOCK A SYMBOLS OUT. BLOCK B WORDS are written in during phase 2 and are read out as BLOCK B SYMBOLS during the next phase 1 cycle at "$\phi_1$ BLOCK B SYMBOLS OUT".

For memory systems configured with by 8-bit DRAM's, the storage and reading from the array 80 is different. It takes 10 clock intervals to load the array from memory with a burst of 16 symbols while reading data from memory FIG. 15D. It takes however 16 clock periods to unload the symbols from the array 80. As shown in FIGS. 15C and 15D, a block 88 of 3×8 additional array elements are added to the array 80. The sixteen symbols are stored in two sections 91, 92. The symbol outputs of these sections are alternately selected to provide eight symbols for EDC 23. Because eight clock intervals are required to empty 91, the contents of 92 need to be held for three clock intervals before being sent out of the EDC23. The holding register 88 coupled to the array provides this delay. During writes to memory, symbols are loaded in via symbol lines IS00-IS09 (FIG. 8). This loading requires 8 clock intervals. The symbols in the array are then shifted left by columns. The symbol data is shifted 3 clock intervals left and then read out from the array 80 to the memory, as data words during five (5) clock cycles. Data words appear on lines (not referenced) corresponding to the location of WD 1 Out and WD 2 Out. That is the words are taken at the end of the extended bank of array elements and at column 01 of the original array. Thus additional external connections are needed for array elements $82_{15,1}$ through $82_{6,1}$. The array is also configured to permit symbols to be loaded in a second phase along lines IS'00 to IS'09 and read out along phase 1 WD 1 and phase 1 WD2. Provision is thus made for external connection for array elements $82_{5,8}$ to $82_{5,15}$ for $\phi_1$ WD1. Existing outputs WD08 to WD15 provide outputs for WD2.

A similar arrangement is used for converting from data words to symbols. Data words are fed in along elements $82_{6,8}$ $82_{6,15}$ and also $82_{11,8}$ to $82_{11,15}$. Symbols are taken from the array along array elements $82_{6,8}$ to $82_{15,8}$. A similar arrangement is provide for the second phase. Words are read in along array elements $82_{15,4}$ to $82_{8,4}$ and $82_{15,9}$ to $82_{8,9}$, and taken out along array elements $82_{-03,07}$ (where the index "−3" indicates the index of the $3^{rd}$ column of the extended array bank 88) to $82_{06,07}$.

With this formatter array 80, when used to handle 8 bit wide DRAM's there is an area of overlap 89. This overlap area 89 is compensated for by providing 4 additional array elements $82_{8,9}'$; $82_{9,10}'$; $82_{10,9}'$; and $82_{10,10}'$ which are used for one of buffer spaces 91 or 92. Thus with minor modifications the array 80 can also be used to format data from eight bit wide memory devices. These modifications include providing external connection for the additional array elements from which data or symbols are written or read, using 3-input mux's at those additional elements which are connected to an external input, and providing the additional array elements for the delay block 88 and the overlap block 89. Because the memory transfer requires only ten clock intervals out of the sixteen required to transfer the symbol data, six clock intervals are available for the refresh time slot and address multiplexing required to use DRAM components as storage for the memory. Preferably, data are fed out of the array 80 synchronously. Thus, the data (shown as formatter data) are stored in a register (shown as array data) before it is presented to the memory or the ECC circuit (FIG. 12).

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

Appendix I

TABLE A-1

| BIT | CHECK(40:34) contributions of DATA bits | | | | | | |
|---|---|---|---|---|---|---|---|
|  | C40 | C39 | C38 | C37 | C36 | C35 | C34 |
| D0 | x | x | x | x | x |   | x |
| D1 |   |   |   |   | x | x | x |
| D2 |   |   |   | x | x | x | x |
| D3 |   |   | x | x | x | x |   |
| D4 |   | x | x | x | x |   | x |
| D5 | x | x | x | x |   | x |   |
| D6 |   |   |   |   | x |   |   |
| D7 |   |   |   | x |   |   | x |
| D8 |   | x |   |   |   | x |   |
| D9 | x |   |   |   | x |   |   |
| D10 | x |   | x |   | x |   | x |
| D11 |   |   | x |   | x | x | x |
| D12 |   | x |   | x | x | x |   |
| D13 | x |   | x | x | x |   | x |
| D14 | x |   |   |   | x | x | x |
| D15 | x | x | x |   |   | x | x |
| D16 |   |   | x | x |   | x |   |
| D17 |   | x | x |   | x |   |   |
| D18 | x | x |   | x |   |   |   |
| D19 |   | x |   |   | x | x |   |
| D20 | x |   | x | x |   |   | x |
| D21 | x |   |   | x | x | x | x |
| D22 | x | x |   |   |   | x | x |
| D23 |   | x | x | x |   | x |   |
| D24 | x | x | x |   | x |   | x |
| D25 |   |   | x |   | x | x |   |
| D26 |   | x |   |   | x |   | x |
| D27 | x |   | x | x |   | x | x |
| D28 | x |   |   | x |   | x | x |
| D29 | x | x |   | x | x |   |   |
| D30 |   | x |   | x |   |   |   |
| D31 | x |   | x |   |   |   |   |
| D32 | x |   | x |   | x |   | x |
| D33 | x |   |   |   | x | x | x |
| D34 | x | x | x |   |   | x |   |
| D35 |   |   | x | x |   |   |   |
| D36 |   | x | x |   |   |   |   |
| D37 | x | x |   |   |   |   | x |
| D38 |   | x | x | x | x | x |   |
| D39 | x | x | x | x |   | x | x |
| D40 |   |   |   |   | x | x | x |
| D41 |   |   |   | x | x | x | x |
| D42 |   |   | x | x | x | x | x |
| D43 |   | x | x | x | x | x |   |
| D44 | x | x | x | x | x |   |   |
| D45 |   |   |   |   |   | x |   |
| D46 |   |   |   |   | x |   |   |
| D47 |   |   |   | x |   |   |   |
| D48 |   | x |   |   |   |   |   |
| D49 | x |   |   |   |   |   |   |
| D50 | x | x | x | x | x |   | x |
| D51 |   |   |   |   | x | x | x |
| D52 |   |   |   | x | x | x | x |
| D53 |   |   | x | x | x | x |   |
| D54 |   | x | x | x | x |   |   |
| D55 | x | x | x | x |   |   |   |
| D56 |   |   |   |   | x | x |   |
| D57 |   |   |   | x | x |   |   |
| D58 |   | x | x |   |   |   | x |
| D59 | x | x |   |   |   | x | x |
| D60 |   | x | x | x |   | x | x |
| D61 | x | x | x |   | x |   | x |
| D62 |   |   | x |   |   |   | x |
| D63 |   | x |   |   |   | x | x |
| D64 | x |   |   |   | x | x |   |
| D65 | x |   | x |   |   |   | x |
| D66 |   |   | x | x | x |   |   |
| D67 |   | x | x | x | x |   | x |

TABLE A-1-continued

CHECK(40:34) contributions of DATA bits

| BIT | C40 | C39 | C38 | C37 | C36 | C35 | C34 |
|---|---|---|---|---|---|---|---|
| D68 | x | x | x | x |  | x | x |
| D69 |  |  |  | x |  | x | x |
| D70 |  |  | x |  | x | x | x |
| D71 |  | x |  | x | x | x |  |
| D72 | x |  | x | x | x |  |  |
| D73 | x |  |  |  | x |  |  |
| D74 | x | x | x |  | x |  |  |
| D75 |  |  | x |  | x |  | x |
| D76 |  | x |  | x |  | x | x |
| D77 | x |  | x |  | x | x | x |
| D78 | x |  | x |  |  | x | x |
| D79 | x |  | x | x |  | x |  |
| D80 | x |  |  | x |  |  |  |
| D81 | x | x |  | x | x |  | x |
| D82 |  | x |  |  | x | x | x |
| D83 | x |  |  | x | x | x |  |
| D84 | x | x |  |  |  |  |  |
| D85 |  | x | x | x | x |  | x |
| D86 | x | x | x | x |  | x |  |
| D87 |  |  |  | x |  |  | x |
| D88 |  | x |  |  |  | x | x |
| D89 |  | x |  |  | x | x |  |
| D90 | x |  |  | x | x |  |  |
| D91 | x | x |  |  | x |  |  |
| D92 |  | x | x |  | x |  | x |
| D93 | x | x |  | x |  | x | x |
| D94 |  | x |  | x |  | x |  |
| D95 | x |  | x |  | x |  | x |
| D96 | x | x |  | x | x |  |  |
| D97 | x | x |  |  |  |  |  |
| D98 | x |  | x | x | x |  |  |
| D99 | x |  |  |  | x |  |  |
| D100 | x | x | x |  | x |  | x |
| D101 |  | x |  | x | x | x |  |
| D102 |  | x |  | x | x | x | x |
| D103 | x |  | x | x | x | x | x |
| D104 | x |  |  |  |  | x |  |
| D105 | x | x | x | x |  | x | x |
| D106 |  |  | x |  | x | x | x |
| D107 |  | x |  | x | x | x |  |
| D108 |  | x |  | x | x |  |  |
| D109 | x |  | x | x |  | x |  |
| D110 | x |  |  | x |  |  | x |
| D111 | x | x |  | x | x | x | x |
| D112 |  | x |  |  |  | x | x |
| D113 | x |  |  |  | x |  | x |
| D114 | x | x | x |  |  | x |  |
| D115 |  |  | x | x |  |  |  |
| D116 |  | x | x |  |  |  |  |
| D117 | x | x |  |  |  |  | x |
| D118 |  | x |  | x | x | x |  |
| D119 | x | x | x | x | x |  | x |
| D120 |  |  |  |  | x | x | x |
| D121 |  |  |  | x | x | x | x |
| D122 |  | x |  | x | x | x | x |
| D123 |  | x | x | x | x | x |  |
| D124 | x | x | x | x | x |  | x |
| D125 |  |  |  |  | x | x |  |
| D126 |  |  |  | x | x |  | x |
| D127 |  | x | x |  | x |  | x |

TABLE A-2

CHECK(33:27) contributions of DATA bits

| BIT | C33 | C32 | C31 | C30 | C29 | C28 | C27 |
|---|---|---|---|---|---|---|---|
| D0 |  | x | x |  |  | x |  |
| D1 | x |  | x |  |  | x | x |
| D2 |  | x |  | x | x | x | x |
| D3 | x |  | x | x | x | x |  |
| D4 |  | x | x | x | x |  |  |
| D5 | x | x | x | x |  |  |  |
| D6 | x |  |  |  |  | x | x |
| D7 |  |  |  |  | x | x | x |
| D8 |  |  |  | x | x | x |  |
| D9 |  |  | x | x | x |  | x |
| D10 |  |  | x |  |  |  | x |
| D11 |  | x |  |  |  |  |  |
| D12 | x |  |  |  |  |  |  |
| D13 |  |  |  |  |  |  |  |
| D14 |  | x | x |  |  | x |  |
| D15 | x |  | x |  | x | x |  |
| D16 |  | x | x | x | x |  |  |
| D17 |  | x | x | x | x |  | x |
| D18 | x | x | x | x |  | x |  |
| D19 | x |  |  |  | x | x |  |
| D20 |  |  |  | x | x |  | x |
| D21 |  | x |  | x |  |  |  |
| D22 | x | x |  |  |  | x |  |
| D23 | x | x | x |  | x | x |  |
| D24 | x | x |  |  | x | x | x |
| D25 | x | x |  | x |  |  |  |
| D26 | x |  | x |  |  |  | x |
| D27 |  | x |  |  |  | x | x |
| D28 | x | x | x |  | x |  |  |
| D29 | x |  | x | x |  | x | x |
| D30 |  |  |  |  | x |  | x |
| D31 |  |  |  | x |  | x | x |
| D32 |  | x |  |  | x |  |  |
| D33 | x | x | x | x |  | x |  |
| D34 | x |  |  |  | x | x | x |
| D35 |  | x | x | x | x |  |  |
| D36 | x | x | x | x |  |  | x |
| D37 | x | x | x |  |  | x | x |
| D38 | x |  |  |  | x |  | x |
| D39 |  | x |  | x |  | x | x |
| D40 | x | x |  |  | x |  | x |
| D41 | x |  |  | x |  | x | x |
| D42 |  |  | x |  | x | x |  |
| D43 |  | x |  |  | x | x |  |
| D44 | x |  | x | x |  |  | x |
| D45 |  |  |  |  |  |  |  |
| D46 |  |  |  |  |  |  |  |
| D47 |  |  |  |  |  |  | x |
| D48 |  |  |  |  |  | x |  |
| D49 |  |  |  |  | x |  |  |
| D50 |  | x | x | x | x | x | x |
| D51 | x |  |  |  | x |  |  |
| D52 |  |  | x |  |  |  |  |
| D53 |  | x |  |  |  |  |  |
| D54 |  | x |  |  |  |  |  |
| D55 | x |  |  |  |  |  |  |
| D56 |  | x | x |  |  | x |  |
| D57 | x | x |  |  | x |  | x |
| D58 | x |  |  | x |  | x | x |
| D59 |  | x |  | x | x |  |  |
| D60 |  | x | x | x | x |  |  |
| D61 |  | x | x | x | x |  |  |
| D62 | x |  |  | x |  | x | x |
| D63 |  | x |  | x |  | x | x |
| D64 |  | x |  | x | x | x |  |
| D65 | x | x |  | x | x | x |  |
| D66 | x | x |  | x | x | x | x |
| D67 | x |  | x | x | x | x | x |
| D68 |  | x | x | x | x | x |  |
| D69 | x |  | x | x | x | x | x |
| D70 |  | x | x | x | x | x |  |
| D71 |  | x | x | x | x | x | x |
| D72 | x | x | x | x | x | x |  |
| D73 | x |  |  | x | x | x | x |
| D74 |  | x |  | x | x |  | x |
| D75 | x | x |  | x |  |  |  |
| D76 | x |  | x |  |  |  |  |
| D77 |  | x |  |  |  |  |  |
| D78 | x |  | x |  |  | x |  |
| D79 | x |  | x |  | x | x |  |
| D80 |  | x |  | x | x | x | x |
| D81 |  |  |  | x | x |  | x |
| D82 |  | x |  | x |  |  |  |
| D83 | x |  | x |  |  | x |  |
| D84 |  | x |  | x | x |  |  |
| D85 |  | x | x | x | x |  |  |
| D86 | x | x | x | x | x |  | x |
| D87 | x |  |  | x |  |  | x |
| D88 |  | x |  |  | x |  |  |
| D89 |  | x |  | x | x |  |  |
| D90 | x |  |  | x |  |  | x |
| D91 |  | x |  |  |  |  | x |

TABLE A-2-continued

CHECK(33:27) contributions of DATA bits

| BIT | C33 | C32 | C31 | C30 | C29 | C28 | C27 |
|---|---|---|---|---|---|---|---|
| D92 | x | x | x |   |   |   | x |
| D93 | x | x |   |   |   | x | x |
| D94 | x | x | x |   | x |   |   |
| D95 | x | x |   | x |   |   |   |
| D96 | x | x |   |   |   | x |   |
| D97 | x | x | x |   |   | x |   |
| D98 | x |   | x | x | x | x | x |
| D99 |   |   |   | x | x |   |   |
| D100 | · | x |   | x |   | x |   |
| D101 | x | x |   |   | x |   | x |
| D102 | x |   |   | x |   | x | x |
| D103 |   |   | x |   | x | x | x |
| D104 |   |   | x | x | x |   | x |
| D105 |   |   |   | x |   |   |   |
| D106 |   | x |   |   |   | x | x |
| D107 | x |   |   |   | x | x | x |
| D108 |   |   | x | x | x |   |   |
| D109 |   | x | x | x |   |   |   |
| D110 |   |   |   | x |   | x |   |
| D111 |   | x |   |   | x | x | x |
| D112 | x | x | x | x | x |   | x |
| D113 | x | x | x | x |   | x |   |
| D114 | x |   |   |   | x | x |   |
| D115 |   | x | x | x | x |   |   |
| D116 | x | x | x | x |   |   | x |
| D117 | x | x | x |   |   | x |   |
| D118 | x |   | x |   | x | x |   |
| D119 |   | x |   | x | x | x |   |
| D120 | x | x |   | x | x | x |   |
| D121 | x |   | x | x | x |   | x |
| D122 |   | x | x | x |   |   | x |
| D123 | x | x | x |   | x | x | x |
| D124 | x | x |   | x | x | x |   |
| D125 | x | x |   | x | x | x | x |
| D126 | x |   | x | x | x | x |   |
| D127 |   | x | x | x | x |   | x |

TABLE A-3

CHECK(26:20) contributions of DATA bits

| BIT | C26 | C25 | C24 | C23 | C22 | C21 | C20 |
|---|---|---|---|---|---|---|---|
| D0 | X |   |   |   |   | x | x |
| D1 | x |   |   |   | x |   |   |
| D2 |   |   |   | x |   |   | x |
| D3 |   |   | x |   |   | x | x |
| D4 |   | x |   |   | x | x | x |
| D5 | x |   |   | x | x | x |   |
| D6 | x |   | x | x | x | x |   |
| D7 |   | x | x | x | x |   |   |
| D8 | x | x | x | x |   |   | x |
| D9 | x | x | x |   |   | x |   |
| D10 |   | x |   |   | x | x |   |
| D11 |   |   |   | x | x |   |   |
| D12 |   |   | x | x |   |   |   |
| D13 |   | x | x |   |   | x |   |
| D14 |   | x |   |   |   |   | x |
| D15 |   |   |   |   |   |   |   |
| D16 | x |   |   |   |   | x | x |
| D17 |   |   |   | x | x |   |   |
| D18 |   |   | x | x |   |   | x |
| D19 | x |   | x | x |   |   |   |
| D20 |   | x | x |   |   |   |   |
| D21 |   | x |   |   |   | x | x |
| D22 |   |   |   |   | x |   | x |
| D23 | x |   |   | x |   |   |   |
| D24 |   |   | x |   |   |   | x |
| D25 | x | x |   |   |   |   | x |
| D26 | x |   |   |   |   |   | x |
| D27 |   |   |   |   |   | x | x |
| D28 | x |   |   |   | x |   |   |
| D29 | x |   |   |   | x | x |   |
| D30 | x |   | x |   | x |   |   |
| D31 |   | x |   | x |   |   | x |
| D32 |   | x |   |   | x | x | x |
| D33 | x | x |   | x | x |   |   |
| D34 |   |   | x |   |   | x | x |
| D35 | x |   |   | x | x |   |   |
| D36 | x | x |   | x |   |   |   |

TABLE A-3-continued

CHECK(26:20) contributions of DATA bits

| BIT | C26 | C25 | C24 | C23 | C22 | C21 | C20 |
|---|---|---|---|---|---|---|---|
| D37 | x |   | x |   |   |   |   |
| D38 | x | x |   |   |   | x |   |
| D39 | x |   |   |   | x |   |   |
| D40 | x |   |   | x |   | x | x |
| D41 |   |   | x |   | x | x |   |
| D42 |   | x |   | x | x |   |   |
| D43 | x |   | x | x |   |   | x |
| D44 |   | x | x |   |   | x |   |
| D45 |   | x |   |   | x | x | x |
| D46 | x |   |   | x | x | x |   |
| D47 |   | x | x | x |   |   |   |
| D48 |   | x | x | x |   |   |   |
| D49 | x | x | x |   |   |   | x |
| D50 |   | x |   |   |   |   | x |
| D51 |   |   |   |   |   |   | x |
| D52 |   |   |   |   | x |   |   |
| D53 |   |   |   | x |   |   |   |
| D54 |   |   | x |   |   |   | x |
| D55 |   | x |   |   | x |   |   |
| D56 | x | x |   |   |   | x | x |
| D57 | x |   |   | x | x |   |   |
| D58 |   |   | x | x |   |   |   |
| D59 |   | x | x |   |   |   | x |
| D60 |   | x |   |   |   |   | x |
| D61 | x |   |   |   |   |   | x |
| D62 | x |   |   |   |   |   | x |
| D63 |   |   |   |   | x |   |   |
| D64 |   |   |   | x |   |   |   |
| D65 | x |   |   | x |   | x | x |
| D66 | x |   | x |   | x |   | x |
| D67 |   | x |   | x |   | x |   |
| D68 | x |   | x | x | x |   |   |
| D69 | x | x |   |   |   | x | x |
| D70 | x |   |   | x | x | x |   |
| D71 |   | x |   | x | x |   |   |
| D72 | x |   | x | x |   |   |   |
| D73 | x | x | x |   |   | x | x |
| D74 |   | x |   |   | x |   | x |
| D75 |   |   | x |   |   |   |   |
| D76 |   | x |   |   |   |   | x |
| D77 | x |   |   |   |   | x |   |
| D78 |   |   |   |   | x |   |   |
| D79 | x |   |   | x |   | x | x |
| D80 | x |   | x |   | x |   |   |
| D81 | x | x |   | x |   | x |   |
| D82 |   | x |   | x |   | x |   |
| D83 |   | x |   | x | x |   |   |
| D84 |   |   | x | x |   | x |   |
| D85 | x | x | x |   |   | x | x |
| D86 | x | x |   |   | x |   | x |
| D87 |   |   | x | x |   |   |   |
| D88 |   | x | x |   |   |   | x |
| D89 | x | x |   |   |   | x |   |
| D90 | x |   |   |   | x |   |   |
| D91 | x |   |   | x |   | x | x |
| D92 | x |   |   | x |   | x | x |
| D93 |   | x |   | x |   | x | x |
| D94 |   |   | x | x |   | x |   |
| D95 |   | x |   | x |   |   | x |
| D96 |   | x |   |   |   |   |   |
| D97 | x | x |   |   |   | x |   |
| D98 |   |   |   |   | x | x |   |
| D99 | x |   |   | x |   | x | x |
| D100 | x |   | x |   | x |   | x |
| D101 | x | x | x | x |   |   |   |
| D102 | x | x | x |   |   |   |   |
| D103 | x | x |   |   |   |   | x |
| D104 |   |   |   |   |   |   | x |
| D105 | x |   |   |   |   |   | x |
| D106 | x |   |   |   |   |   | x |
| D107 |   |   |   |   |   | x | x |
| D108 |   |   |   |   | x | x |   |
| D109 |   |   |   | x |   | x | x |
| D110 | x |   |   | x | x |   | x |
| D111 | x | x | x | x |   |   |   |
| D112 |   | x | x |   |   | x | x |
| D113 | x | x |   |   |   | x | x |
| D114 |   |   |   | x | x |   | x |
| D115 | x |   | x | x |   |   | x |

TABLE A-3-continued

| BIT | C26 | C25 | C24 | C23 | C22 | C21 | C20 |
|---|---|---|---|---|---|---|---|
| D116 | | x | x | | | x | x |
| D117 | x | x | | | x | x | x |
| D118 | | | | x | x | x | x |
| D119 | | | x | x | | x | |
| D120 | x | x | x | | | x | x |
| D121 | x | x | | x | x | x | x |
| D122 | x | | x | x | x | x | |
| D123 | | x | x | x | x | | |
| D124 | x | x | x | x | | | x |
| D125 | | x | x | | | | x |
| D126 | x | x | | | | x | |
| D127 | x | | | | x | | x |

CHECK(26:20) contributions of DATA bits

TABLE A-4

CHECK(19:13) contributions of DATA bits

| BIT | C19 | C18 | C17 | C16 | C15 | C14 | C13 |
|---|---|---|---|---|---|---|---|
| D0 | | x | | x | | x | |
| D1 | x | x | x | | x | x | x |
| D2 | x | x | | x | x | x | x |
| D3 | x | | x | x | x | x | |
| D4 | | x | x | x | x | | |
| D5 | x | x | x | x | | | |
| D6 | | x | | | | x | |
| D7 | x | | | x | | | x |
| D8 | | | x | | x | | |
| D9 | | | x | | x | | |
| D10 | x | x | x | x | | x | x |
| D11 | | x | | | x | | |
| D12 | x | | | x | | | |
| D13 | | x | | | | | |
| D14 | x | x | x | | | x | x |
| D15 | | x | x | | x | | x |
| D16 | | x | x | x | | | |
| D17 | x | x | x | | | | x |
| D18 | x | x | | | | x | x |
| D19 | | x | | x | | x | |
| D20 | | x | | x | | x | |
| D21 | | | | x | x | | |
| D22 | x | | x | x | | | |
| D23 | x | x | | x | | x | x |
| D24 | x | | x | | x | x | x |
| D25 | x | x | x | x | x | | x |
| D26 | x | x | x | x | | x | x |
| D27 | x | x | x | | | x | x |
| D28 | | x | x | x | x | x | x |
| D29 | | x | | x | x | x | x |
| D30 | | | | x | x | | |
| D31 | | x | x | x | | x | x |
| D32 | x | x | | | x | | |
| D33 | | x | | | x | | x |
| D34 | x | x | | | x | | |
| D35 | | x | x | | | | |
| D36 | | x | x | | | | |
| D37 | x | x | | | | | x |
| D38 | | x | | | | | |
| D39 | | x | | | | | |
| D40 | | x | | | x | | |
| D41 | | x | | | x | | x |
| D42 | x | | | x | x | x | |
| D43 | | x | | | x | x | |
| D44 | | x | | x | x | | |
| D45 | | x | | x | x | | |
| D46 | | x | | x | x | | x |
| D47 | | x | | x | x | x | |
| D48 | x | | | x | x | x | |
| D49 | | x | x | x | | | |
| D50 | | x | | | | x | |
| D51 | | x | | x | x | | |
| D52 | x | | | x | x | | |
| D53 | x | | | x | | | x |
| D54 | | x | | x | | x | |
| D55 | x | x | | | x | | |
| D56 | | | x | x | | | |
| D57 | x | x | | | | | |
| D58 | x | x | | | | x | |
| D59 | x | | | | | | |
| D60 | x | | x | | | x | x |

TABLE A-4-continued

CHECK(19:13) contributions of DATA bits

| BIT | C19 | C18 | C17 | C16 | C15 | C14 | C13 |
|---|---|---|---|---|---|---|---|
| D61 | | x | | x | x | x | |
| D62 | | | x | x | x | | x |
| D63 | | x | | x | x | x | x |
| D64 | | x | x | x | x | x | x |
| D65 | | x | | x | x | | |
| D66 | | | x | | x | | |
| D67 | | x | | x | | | x |
| D68 | | x | | x | | x | x |
| D69 | | | | | x | x | x |
| D70 | | | x | | x | | |
| D71 | | x | | x | | | |
| D72 | | x | | x | | | |
| D73 | | | | | | x | x |
| D74 | x | | | x | | x | |
| D75 | x | x | x | x | | x | x |
| D76 | x | x | x | | x | | |
| D77 | x | x | | | x | | x |
| D78 | | | | x | | | |
| D79 | x | | | | | x | x |
| D80 | x | | x | | x | | x |
| D81 | x | x | x | x | | | |
| D82 | | x | | | | x | |
| D83 | x | | | | x | | |
| D84 | x | | x | x | | x | x |
| D85 | x | x | | | x | | x |
| D86 | x | | | x | | x | x |
| D87 | x | | | | x | | |
| D88 | | | x | | | | x |
| D89 | | | x | | | x | x |
| D90 | | x | | | x | x | |
| D91 | | x | x | x | x | | |
| D92 | x | x | | x | x | | |
| D93 | x | | x | x | | | x |
| D94 | x | x | | | | | x |
| D95 | x | | | | | x | x |
| D96 | x | | x | | x | | x |
| D97 | x | x | x | x | | | |
| D98 | | x | | | | x | |
| D99 | | | x | | x | x | |
| D100 | x | x | x | x | x | x | |
| D101 | | x | | x | x | x | |
| D102 | x | | x | x | x | | |
| D103 | | x | x | x | | | x |
| D104 | | x | | | | | x |
| D105 | | x | | | | | |
| D106 | x | x | x | | | x | |
| D107 | x | x | | | x | x | |
| D108 | x | | | x | x | x | |
| D109 | | | x | x | x | | x |
| D110 | x | x | | x | | | x |
| D111 | | | | | | | |
| D112 | x | | x | | | x | x |
| D113 | | x | | | x | x | |
| D114 | | | x | x | x | | |
| D115 | x | x | | x | | x | |
| D116 | x | | x | | x | | x |
| D117 | | x | | x | | x | |
| D118 | | | | | x | x | |
| D119 | | | | x | x | | |
| D120 | x | | | x | | x | x |
| D121 | | x | | | x | x | |
| D122 | | x | | x | x | | |
| D123 | x | | x | x | | | |
| D124 | | x | x | | | | x |
| D125 | | x | x | | | | |
| D126 | x | x | | | | | |
| D127 | x | | | | | | |

TABLE A-5

CHECK(12:6) contributions of DATA bits

| BIT | C12 | C11 | C10 | C9 | C8 | C7 | C6 |
|---|---|---|---|---|---|---|---|
| D0 | x | | | | | | |
| D1 | x | | | | | | |
| D2 | | | | | | | |
| D3 | | | | | | | x |
| D4 | | | | | | x | x |
| D5 | | | | | | x | x |

TABLE A-5-continued

| BIT | C12 | C11 | C10 | C9 | C8 | C7 | C6 |
|---|---|---|---|---|---|---|---|
| D6 | x | | | x | x | x | |
| D7 | | x | x | x | | | x |
| D8 | | | x | x | x | | x |
| D9 | x | x | x | | x | | x |
| D10 | | x | | x | | x | |
| D11 | | | x | | x | | x |
| D12 | | x | | x | | x | x |
| D13 | x | | x | | x | x | x |
| D14 | x | x | | x | x | x | x |
| D15 | | | x | x | x | x | x |
| D16 | x | x | x | x | x | x | |
| D17 | x | x | x | x | x | | |
| D18 | x | x | x | x | | x | |
| D19 | | x | x | | | x | |
| D20 | x | x | | | x | | |
| D21 | | | x | | | | |
| D22 | x | | x | | | | |
| D23 | x | x | | | | | |
| D24 | x | | | | | | |
| D25 | x | | | | | | |
| D26 | | | | | | | |
| D27 | | | | | | | |
| D28 | x | | | | | | x |
| D29 | x | | | | | x | x |
| D30 | x | | | x | x | x | |
| D31 | | | x | x | x | | |
| D32 | x | | x | x | x | | x |
| D33 | x | x | x | x | x | x | |
| D34 | | x | x | | x | | |
| D35 | | x | | x | | x | |
| D36 | x | | x | | | x | |
| D37 | | x | | | x | | |
| D38 | | | x | | | x | |
| D39 | | x | | | x | | |
| D40 | x | x | | x | | | |
| D41 | x | | x | | | | |
| D42 | | | x | | | | |
| D43 | | x | | | | | |
| D44 | x | | | | | | x |
| D45 | x | | | | | x | x |
| D46 | | | | | x | x | x |
| D47 | | | | x | x | x | |
| D48 | | | x | x | x | | x |
| D49 | | x | x | x | | x | |
| D50 | | x | | x | | x | |
| D51 | | x | | x | | x | x |
| D52 | x | | x | | x | x | |
| D53 | | x | | | x | x | x |
| D54 | x | x | x | x | | x | x |
| D55 | | x | x | | x | x | x |
| D56 | | x | | x | x | x | |
| D57 | x | | x | x | x | | x |
| D58 | | x | x | x | | x | |
| D59 | x | x | x | x | | x | |
| D60 | | x | | x | | x | |
| D61 | x | | x | | x | | x |
| D62 | x | x | | x | | x | x |
| D63 | x | | x | x | x | x | |
| D64 | | x | | x | x | x | |
| D65 | | x | x | x | | | |
| D66 | x | x | x | x | | | x |
| D67 | x | x | x | | | x | x |
| D68 | x | x | | | x | x | |
| D69 | | | | x | x | | x |
| D70 | | x | x | | x | x | |
| D71 | | x | x | | x | x | |
| D72 | x | x | | x | x | | |
| D73 | | | x | x | | | |
| D74 | x | x | x | | | | x |
| D75 | | x | | | x | x | |
| D76 | x | | | x | x | x | |
| D77 | | | x | x | x | x | |
| D78 | x | | x | x | x | | |
| D79 | x | x | x | x | x | | |
| D80 | | x | x | x | | | |
| D81 | | x | x | | | | |
| D82 | | x | | | | | |
| D83 | x | | | x | | | |
| D84 | x | | | x | | | x |
| D85 | x | | | x | | x | x |
| D86 | | | x | | x | x | |
| D87 | x | x | | x | x | | x |
| D88 | x | | x | x | | x | |
| D89 | | x | x | | x | | x |
| D90 | x | x | | x | | x | x |
| D91 | | | x | | x | x | x |
| D92 | x | x | | x | x | x | x |
| D93 | x | | x | x | x | x | x |
| D94 | x | x | x | x | x | x | x |
| D95 | x | x | x | x | x | x | x |
| D96 | | x | x | x | x | x | x |
| D97 | | x | x | x | x | x | x |
| D98 | | x | x | x | x | x | x |
| D99 | | x | x | x | x | x | |
| D100 | | x | x | x | x | | |
| D101 | | x | x | x | | | |
| D102 | x | x | x | | | | x |
| D103 | x | x | | | | x | x |
| D104 | | | | x | x | x | |
| D105 | x | | | x | x | x | |
| D106 | x | | x | x | x | | |
| D107 | | x | x | x | | | |
| D108 | x | x | x | | | | x |
| D109 | x | x | | | | x | |
| D110 | | | | x | | | |
| D111 | x | | | x | | | |
| D112 | x | | x | | | | x |
| D113 | | x | | | | x | x |
| D114 | | | | x | x | x | |
| D115 | x | | | x | x | x | |
| D116 | | x | x | x | | | |
| D117 | | x | x | | | | x |
| D118 | | x | x | | | x | |
| D119 | x | x | | x | | x | |
| D120 | | | x | | x | | |
| D121 | | x | | x | | | |
| D122 | | x | | x | | | |

TABLE A-6

| BIT | C5 | C4 | C3 | C2 | C1 | C0 |
|---|---|---|---|---|---|---|
| D0 | | | x | | x | x |
| D1 | | x | x | x | | x |
| D2 | x | x | x | | x | |
| D3 | x | x | | x | | |
| D4 | x | | x | | | |
| D5 | | x | | | | |
| D6 | x | | x | | x | x |
| D7 | | x | | | x | x |
| D8 | x | | | x | x | |
| D9 | | x | x | | | |
| D10 | x | x | x | | x | x |
| D11 | x | x | x | x | | x |
| D12 | x | x | x | | x | |
| D13 | x | x | | x | | |
| D14 | x | | | | x | x |
| D15 | | x | x | | | x |
| D16 | | x | | | | x |
| D17 | x | | | | x | |
| D18 | | | | x | | |
| D19 | | | | | x | x |
| D20 | | | | x | x | |
| D21 | | | | x | x | x |
| D22 | | | | x | | x |
| D23 | | | | | | x |
| D24 | | | | x | | |
| D25 | | x | x | x | x | |
| D26 | x | x | x | x | | |
| D27 | x | x | x | x | | |
| D28 | x | x | | | x | x |
| D29 | x | | x | x | | x |
| D30 | | x | | | | x |
| D31 | x | | | | x | |
| D32 | | x | x | x | x | |
| D33 | | x | | x | | |
| D34 | x | | | | | x |

TABLE A-6-continued

CHECK(5:0) contributions of DATA bits

| BIT | C5 | C4 | C3 | C2 | C1 | C0 |
|---|---|---|---|---|---|---|
| D35 | | | x | | | x |
| D36 | | x | | | x | |
| D37 | x | | | x | | |
| D38 | | | | | x | x |
| D39 | | | | x | x | |
| D40 | | | | x | x | x |
| D41 | | | x | x | x | |
| D42 | | x | x | x | | |
| D43 | x | x | x | | | |
| D44 | x | x | | | | |
| D45 | x | | | x | x | x |
| D46 | | x | | x | x | |
| D47 | x | | | x | x | |
| D48 | | x | x | | | |
| D49 | x | x | | | | |
| D50 | x | | | x | | x |
| D51 | | x | x | x | | x |
| D52 | x | x | x | | x | |
| D53 | x | x | | x | | |
| D54 | x | | x | | | |
| D55 | | x | | | | |
| D56 | x | | x | | x | x |
| D57 | | x | | x | x | |
| D58 | x | | x | x | | |
| D59 | | x | x | | | |
| D60 | x | x | x | | x | x |
| D61 | x | x | | | x | x |
| D62 | x | | | x | x | x |
| D63 | | x | x | x | | |
| D64 | | x | x | x | | |
| D65 | x | x | | | x | x |
| D66 | x | | x | x | | x |
| D67 | | x | | x | x | |
| D68 | x | x | | x | | |
| D69 | x | | | | x | x |
| D70 | | | | x | x | |
| D71 | | | x | x | | |
| D72 | | x | x | | | |
| D73 | x | x | x | | x | x |
| D74 | x | x | x | x | | x |
| D75 | x | x | | | | x |
| D76 | x | | | | x | |
| D77 | | | x | | | |
| D78 | | | | x | x | x |
| D79 | | | x | x | | x |
| D80 | | x | | | | x |
| D81 | x | | x | | | x |
| D82 | | x | x | | | x |
| D83 | x | x | | | x | |
| D84 | x | | x | x | x | x |
| D85 | | x | | x | x | |
| D86 | x | | x | | x | |
| D87 | | x | x | x | x | x |
| D88 | x | x | x | x | | |
| D89 | x | x | x | | | |
| D90 | x | x | x | | | |
| D91 | x | x | x | | x | x |
| D92 | x | x | x | x | | x |
| D93 | x | x | x | | x | |
| D94 | x | x | x | x | x | x |
| D95 | x | x | x | x | x | |
| D96 | x | x | | x | x | x |
| D97 | x | | | x | | x |
| D98 | | | | | | x |
| D99 | | x | | | | x |
| D100 | | x | x | | | x |
| D101 | x | x | x | | | x |
| D102 | x | x | | | x | |
| D103 | x | | | x | | |
| D104 | | | | x | | x |
| D105 | | x | x | | | x |
| D106 | | x | | | | x |
| D107 | x | | | | x | |
| D108 | | | x | | | |
| D109 | | x | | | | |
| D110 | | x | | | x | x |
| D111 | x | x | x | | | x |
| D112 | x | x | | | | x |
| D113 | x | | | x | | |
| D114 | | | x | x | x | x |
| D115 | | x | | x | | x |
| D116 | x | | | x | | x |
| D117 | | x | | x | | |
| D118 | x | | | | x | x |
| D119 | | | | x | x | |
| D120 | | | | x | x | x |
| D121 | | | x | x | x | |
| D122 | | x | x | x | | |
| D123 | x | x | x | | | |
| D124 | x | x | | | | |
| D125 | x | | x | | x | x |
| D126 | | x | | x | x | |
| D127 | x | | x | x | | |

Appendix II

TABLE C-1

Syndrome S1 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| C0 | | | | | | | | x |
| C1 | | | | | | | x | |
| C2 | | | | | | x | | |
| C3 | | | | | x | | | |
| C4 | | | | x | | | | |
| C5 | | | x | | | | | |
| C6 | | x | | | | | | |
| C7 | x | | | | | | | |
| C8 | | | | x | | x | x | x |
| C9 | | x | | x | x | | x | |
| C10 | x | | | x | x | | x | |
| C11 | | x | | | | x | | x |
| C12 | x | | | | x | | x | |
| C13 | | | x | x | x | | | x |
| C14 | | x | | x | x | | x | |
| C15 | x | x | x | | | x | | |
| C16 | x | x | x | | | x | | x |
| C17 | x | x | x | | | x | x | x |
| C18 | x | x | x | | | | x | x |
| C19 | x | x | x | | x | | x | x |
| C20 | x | x | x | x | x | | x | x |
| C21 | x | x | | | x | x | x | x |
| C22 | x | | | | x | x | x | x |
| C23 | | | | x | x | | x | x |
| C24 | | | x | | x | | x | x |
| C25 | | x | x | | | x | x | |
| C26 | x | x | | | x | x | | |
| C27 | x | | | | x | x | | x |
| C28 | | | | x | | x | x | x |
| C29 | | | x | | x | x | x | |
| C30 | | x | | | x | x | x | |
| C31 | x | | x | | x | x | | |
| C32 | | x | | x | x | x | | x |
| C33 | x | | | x | x | | x | |
| C34 | | x | | x | x | | | x |
| C35 | x | | x | x | | | x | |
| C36 | | x | | | x | | x | |
| C37 | x | | | x | | | x | |
| C38 | | | | | x | | | x |
| C39 | | | x | | | x | | |
| C40 | | x | | | x | | | |
| D0 | | x | | | x | | | |
| D1 | x | | | x | | | | |
| D2 | | | | | | x | x | x |
| D3 | | | | x | x | | x | |
| D4 | | | x | | x | | | |
| D5 | | x | x | x | | | | |
| D6 | x | x | | x | | | | |
| D7 | x | | | | | x | x | x |
| D8 | | | x | | x | | x | x |
| D9 | | x | x | | x | | x | |
| D10 | x | x | | | x | x | x | |
| D11 | x | | | x | | x | | x |
| D12 | | | | | | x | x | x |
| D13 | | | | x | x | | x | |
| D14 | | | x | x | x | | | |
| D15 | | | x | x | x | | | |

TABLE C-1-continued
Syndrome S1 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| D16 |   | x | x | x |   |   |   |   |
| D17 | x | x | x |   |   |   |   |   |
| D18 | x | x | x |   | x | x |   | x |
| D19 | x | x | x | x |   | x | x | x |
| D20 | x | x |   |   |   |   | x | x |
| D21 | x |   | x |   | x |   | x | x |
| D22 |   | x | x | x | x |   | x | x |
| D23 | x | x | x | x |   | x | x |   |
| D24 | x | x |   |   |   |   |   | x |
| D25 | x |   | x |   | x | x | x | x |
| D26 |   | x | x | x |   |   | x | x |
| D27 | x | x | x |   |   | x | x |   |
| D28 | x | x | x |   |   |   |   | x |
| D29 | x | x | x |   | x | x | x | x |
| D30 | x | x | x | x |   |   | x | x |
| D31 | x | x |   |   | x |   | x | x |
| D32 | x |   | x | x | x |   | x | x |
| D33 |   | x |   | x | x |   | x | x |
| D34 | x |   | x | x |   | x | x |   |
| D35 |   | x |   |   |   |   |   | x |
| D36 | x |   |   |   |   |   | x |   |
| D37 |   |   | x |   | x |   |   | x |
| D38 |   | x |   | x |   |   | x |   |
| D39 | x |   | x |   |   | x |   |   |
| D40 |   | x | x |   |   | x |   | x |
| D41 | x | x |   |   | x |   | x |   |
| D42 | x |   |   | x | x |   |   | x |
| D43 |   | x |   | x | x | x | x | x |
| D44 | x |   | x | x | x | x | x |   |
| D45 |   | x |   | x |   |   |   | x |
| D46 | x |   | x |   |   |   | x |   |
| D47 |   | x | x |   | x |   | x | x |
| D48 | x |   | x | x |   |   | x | x |
| D49 | x |   |   | x |   |   | x |   |
| D50 |   |   | x | x | x | x | x | x |
| D51 |   | x | x | x | x | x | x |   |
| D52 | x | x | x |   | x | x | x |   |
| D53 | x | x |   | x |   | x |   | x |
| D54 | x |   |   |   |   | x | x | x |
| D55 |   |   | x |   |   |   | x | x |
| D56 |   | x |   |   |   | x | x |   |
| D57 | x |   |   |   | x | x |   |   |
| D58 |   |   | x | x |   | x | x |   |
| D59 |   | x | x |   | x |   | x |   |
| D60 | x |   |   | x |   | x |   |   |
| D61 | x |   |   |   |   | x |   | x |
| D62 |   | x |   |   |   | x | x | x |
| D63 |   | x |   |   | x | x | x |   |
| D64 | x |   |   | x | x | x |   |   |
| D65 |   |   |   | x |   |   |   | x |
| D66 |   | x |   | x |   | x |   |   |
| D67 |   | x |   | x |   | x |   |   |
| D68 | x |   | x |   | x |   |   |   |
| D69 |   | x | x | x | x | x |   | x |
| D70 | x | x | x |   | x | x | x |   |
| D71 | x | x |   |   | x | x |   | x |
| D72 | x |   |   |   | x | x | x | x |
| D73 |   |   | x |   |   |   | x | x |
| D74 |   | x |   |   |   | x | x |   |
| D75 |   | x |   |   |   | x | x |   |
| D76 | x |   |   | x | x |   |   |   |
| D77 |   |   | x | x | x |   | x |   |
| D78 |   | x | x |   | x | x |   |   |
| D79 |   | x | x | x |   | x |   |   |
| D80 | x | x | x |   | x |   |   |   |
| D81 | x | x | x | x | x | x |   | x |
| D82 | x | x |   | x |   | x |   | x |
| D83 | x |   |   |   |   |   | x | x |
| D84 |   | x |   | x |   | x |   | x |
| D85 |   | x |   | x |   | x | x |   |
| D86 | x |   | x |   | x |   | x |   |
| D87 |   | x | x |   | x |   | x |   |
| D88 | x | x | x |   | x |   | x |   |
| D89 | x | x | x | x |   | x |   |   |
| D90 | x | x |   | x | x | x | x | x |
| D91 | x |   |   | x |   |   | x |   |
| D92 |   |   |   |   | x |   | x | x |
| D93 |   |   | x |   |   | x | x |   |
| D94 |   | x |   |   | x | x |   |   |
| D95 |   | x |   | x | x |   |   |   |
| D96 | x |   |   | x | x |   |   |   |
| D97 |   | x |   |   | x | x |   | x |
| D98 | x |   |   | x | x |   | x |   |
| D99 |   |   |   | x | x |   |   | x |
| D100 |   |   | x |   |   |   | x |   |
| D101 |   | x | x |   |   | x |   |   |
| D102 | x | x |   |   | x |   |   |   |
| D103 | x |   | x | x | x | x |   | x |
| D104 |   | x |   |   |   | x | x |   |
| D105 | x |   | x |   | x | x | x |   |
| D106 |   | x | x | x |   |   |   | x |
| D107 | x | x | x |   |   | x |   |   |
| D108 | x | x | x |   | x |   |   | x |
| D109 | x | x | x | x | x | x | x | x |
| D110 | x | x |   | x |   |   | x | x |
| D111 | x |   |   | x |   | x | x |   |
| D112 |   |   | x | x | x |   | x | x |
| D113 |   | x | x | x |   | x | x |   |
| D114 | x | x | x |   | x | x |   |   |
| D115 | x | x | x | x |   | x |   | x |
| D116 | x | x |   |   |   | x | x | x |
| D117 | x |   |   | x |   |   | x | x |
| D118 |   | x |   | x |   | x |   | x |
| D119 | x |   |   | x |   |   | x | x |
| D120 | x |   |   |   |   |   |   | x |
| D121 |   |   | x |   | x | x | x | x |
| D122 |   | x |   | x |   | x | x |   |
| D123 | x |   | x |   | x | x | x |   |
| D124 |   | x |   | x |   | x |   | x |
| D125 | x |   | x |   | x | x |   |   |
| D126 |   | x | x |   | x |   |   | x |
| D127 | x | x | x | x |   |   | x |   |

TABLE C-2
Syndrome S3 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| C0 |   |   |   |   |   |   |   | x |
| C1 |   |   |   |   |   | x |   |   |
| C2 |   | x |   |   |   |   |   |   |
| C3 |   |   | x |   | x |   | x |   |
| C4 | x |   |   |   | x |   | x |   |
| C5 | x | x | x |   |   | x |   |   |
| C6 | x | x | x |   |   |   | x | x |
| C7 | x | x |   |   | x | x |   | x | x |
| C8 |   |   | x | x |   | x |   | x |
| C9 | x |   |   |   | x | x | x | x |
| C10 |   | x |   |   | x | x | x |   |
| C11 | x |   | x | x | x |   | x |   |
| C12 |   | x |   |   | x |   |   | x |
| C13 |   |   |   | x |   | x |   |   |
| C14 | x |   |   | x |   |   |   |   |
| C15 |   |   | x | x |   | x |   |   |
| C16 | x |   |   |   | x | x |   | x |
| C17 | x | x |   |   | x | x |   |   |
| C18 |   |   |   |   | x | x | x |   |
| C19 |   | x | x | x |   |   |   |   |
| C20 | x | x | x |   | x | x | x | x |
| C21 |   | x | x | x | x | x | x | x |
| C22 | x |   | x |   | x | x | x | x |
| C23 | x | x | x |   |   |   |   | x |
| C24 | x | x |   |   | x |   | x | x |
| C25 | x |   |   | x | x |   | x | x |
| C26 |   |   | x |   | x |   |   | x |
| C27 |   | x | x |   |   |   | x | x |
| C28 |   | x |   | x |   | x |   | x |
| C29 | x |   | x |   |   |   | x |   |
| C30 | x |   |   |   | x |   |   | x |
| C31 | x |   | x | x | x | x |   |   |
| C32 |   | x |   |   |   |   | x | x |
| C33 |   |   | x |   | x |   |   | x |
| C34 | x |   |   |   | x |   |   | x |
| C35 | x |   |   |   | x | x |   |   |
| C36 |   | x |   | x |   | x |   |   |
| C37 | x |   |   | x | x |   | x |   |
| C38 |   |   |   |   | x |   | x | x |
| C39 | x |   |   | x |   | x |   |   |

TABLE C-2-continued

Syndrome S3 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| C40 |  | x | x | x |  | x |  |  |
| D0 | x | x |  | x |  | x | x | x |
| D1 |  | x |  | x |  | x | x |  |
| D2 | x | x | x |  | x |  | x |  |
| D3 | x |  |  | x |  |  | x | x |
| D4 |  |  | x |  | x | x |  |  |
| D5 |  | x |  |  | x | x |  | x |
| D6 |  |  | x | x |  |  | x |  |
| D7 | x |  | x | x | x | x |  | x |
| D8 |  | x | x | x |  |  |  | x |
| D9 | x | x | x |  | x | x | x | x |
| D10 |  |  | x | x | x |  |  | x |
| D11 | x | x | x |  |  | x |  | x |
| D12 |  | x | x |  | x |  | x | x |
| D13 |  | x |  | x | x | x | x |  |
| D14 |  | x |  | x |  | x |  | x |
| D15 | x | x | x | x |  |  |  | x |
| D16 |  | x |  | x |  |  | x | x |
| D17 | x | x |  |  |  |  | x |  |
| D18 | x | x |  | x | x | x | x |  |
| D19 |  |  | x | x |  |  | x | x |
| D20 | x |  | x | x |  | x |  | x |
| D21 |  |  | x | x |  |  |  | x |
| D22 | x |  | x |  |  | x |  | x |
| D23 | x |  | x |  | x |  |  |  |
| D24 |  |  |  | x |  |  | x | x |
| D25 | x |  |  |  | x |  |  |  |
| D26 | x | x | x | x |  | x |  |  |
| D27 |  | x | x |  |  |  | x |  |
| D28 |  | x | x |  |  | x | x | x |
| D29 |  |  |  | x | x | x | x |  |
| D30 |  | x |  | x | x | x |  |  |
| D31 | x |  |  | x |  | x | x | x |
| D32 |  |  | x |  |  |  |  | x |
| D33 |  |  | x |  |  | x |  |  |
| D34 |  |  |  |  | x |  |  | x |
| D35 |  |  | x |  | x |  |  |  |
| D36 |  | x |  | x | x | x |  | x |
| D37 |  |  | x | x | x | x |  | x |
| D38 | x | x | x | x | x |  |  |  |
| D39 |  |  |  |  |  | x | x |  |
| D40 |  |  |  | x | x |  |  |  |
| D41 | x | x |  |  |  |  |  |  |
| D42 | x | x | x |  | x | x | x |  |
| D43 | x |  | x | x |  |  | x |  |
| D44 |  |  |  |  |  |  | x |  |
| D45 |  |  |  |  | x |  |  |  |
| D46 |  | x |  |  |  |  |  |  |
| D47 |  | x |  | x | x |  | x |  |
| D48 | x |  |  | x | x |  |  |  |
| D49 | x | x | x |  |  | x |  |  |
| D50 | x | x | x |  |  |  | x | x |
| D51 | x | x |  | x | x |  | x | x |
| D52 |  | x |  |  | x | x |  |  |
| D53 | x |  |  | x | x | x |  |  |
| D54 |  | x |  |  | x | x | x |  |
| D55 | x |  | x |  | x | x |  | x |
| D56 |  | x |  |  | x |  |  | x |
| D57 |  |  | x |  |  |  | x |  |
| D58 | x |  |  | x |  |  |  |  |
| D59 |  | x | x |  | x |  |  |  |
| D60 | x |  |  |  | x | x |  | x |
| D61 | x | x |  |  | x | x | x |  |
| D62 |  |  |  |  | x | x | x |  |
| D63 |  | x | x | x |  |  |  |  |
| D64 | x |  |  | x | x | x | x | x |
| D65 |  | x |  | x | x | x | x | x |
| D66 | x |  | x |  | x | x | x | x |
| D67 | x | x | x |  |  |  | x | x |
| D68 | x | x |  |  |  | x | x | x |
| D69 | x |  |  | x | x | x |  |  |
| D70 |  | x |  | x |  |  |  | x |
| D71 |  | x | x |  |  | x |  | x |
| D72 |  | x |  | x |  | x | x | x |
| D73 | x |  | x |  |  |  | x |  |
| D74 | x |  |  |  | x |  |  | x |
| D75 | x | x | x |  | x |  |  |  |
| D76 |  | x |  |  |  |  | x |  |
| D77 |  | x |  | x | x |  |  | x |
| D78 | x |  |  |  |  | x |  | x |
| D79 | x |  |  | x | x | x |  |  |
| D80 |  | x |  | x |  | x |  |  |
| D81 | x | x | x | x | x |  | x |  |
| D82 |  |  |  | x |  |  | x | x |
| D83 | x |  |  | x | x |  |  |  |
| D84 |  | x | x | x |  | x |  |  |
| D85 | x | x |  | x |  | x | x | x |
| D86 |  | x |  | x |  | x | x |  |
| D87 | x | x | x |  | x |  | x |  |
| D88 | x |  |  | x |  |  | x | x |
| D89 |  |  | x |  |  | x | x |  |
| D90 |  | x |  |  | x |  |  | x |
| D91 |  |  | x | x |  |  | x |  |
| D92 | x |  |  | x | x | x | x |  |
| D93 |  | x | x |  |  |  |  | x |
| D94 | x |  | x | x | x | x | x | x |
| D95 |  |  | x | x | x | x | x | x |
| D96 | x | x | x | x |  | x |  | x |
| D97 |  | x |  | x |  | x | x | x |
| D98 |  | x |  | x | x |  | x | x |
| D99 |  | x |  | x |  | x |  | x |
| D100 | x | x | x | x |  |  | x |  |
| D101 |  | x |  | x |  |  | x | x |
| D102 | x | x |  |  |  |  | x |  |
| D103 | x | x |  | x | x | x | x | x |
| D104 |  |  | x | x |  |  | x | x |
| D105 | x |  |  | x |  | x |  | x |
| D106 |  | x |  | x |  |  |  | x |
| D107 | x |  | x |  |  | x |  | x |
| D108 | x |  | x | x |  |  |  | x |
| D109 |  |  | x |  | x |  |  | x |
| D110 | x |  |  |  | x |  |  |  |
| D111 | x | x | x | x |  | x |  |  |
| D112 |  | x | x |  |  |  | x | x |
| D113 |  | x | x |  | x | x | x | x |
| D114 |  |  |  |  | x | x |  | x |
| D115 |  | x | x | x | x |  |  |  |
| D116 | x |  | x | x |  | x |  | x |
| D117 |  | x |  |  |  |  |  | x |
| D118 |  | x |  |  |  | x |  |  |
| D119 |  |  |  |  |  | x |  | x |
| D120 |  |  | x |  | x |  |  |  |
| D121 |  | x | x |  |  | x | x |  |
| D122 |  |  |  | x | x | x | x | x |
| D123 | x | x | x | x | x |  |  |  |
| D124 |  |  |  |  |  |  | x | x |
| D125 |  |  |  | x | x |  |  |  |
| D126 | x | x |  |  |  |  |  |  |
| D127 | x | x | x |  |  | x |  | x |

TABLE C-3

Syndrome S5 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| C0 |  |  |  |  |  |  |  | x |
| C1 |  | x |  |  |  |  |  |  |
| C2 | x |  | x | x |  | x |  |  |
| C3 | x | x | x |  |  | x |  |  |
| C4 | x | x | x | x | x |  | x | x |
| C5 |  | x | x |  |  | x | x |  |
| C6 |  | x |  | x | x | x |  |  |
| C7 | x |  |  | x | x |  | x |  |
| C8 |  |  | x |  |  | x |  |  |
| C9 |  |  | x | x |  | x |  |  |
| C10 |  | x |  |  | x | x |  |  |
| C11 |  |  |  | x | x | x |  |  |
| C12 | x | x | x | x |  | x |  | x |
| C13 | x | x |  |  |  |  |  | x |
| C14 | x |  |  | x |  | x | x | x |
| C15 | x |  | x |  | x |  | x |  |
| C16 | x |  | x |  | x |  |  |  |
| C17 | x |  | x | x | x |  | x |  |
| C18 | x |  |  |  | x |  |  | x |
| C19 | x |  |  |  |  | x | x | x |
| C20 |  | x |  | x |  | x |  |  |
| C21 | x |  |  | x | x | x |  |  |
| C22 |  | x |  |  |  |  |  | x |

TABLE C-3-continued

Syndrome S5 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| C23 | | | x | | | x | x | |
| C24 | | x | x | x | | x | | |
| C25 | | | x | | x | | x | x |
| C26 | x | x | x | x | x | | | x |
| C27 | | | x | | | x | x | |
| C28 | | | | x | x | | | x |
| C29 | | x | | x | | x | x | x |
| C30 | x | x | x | x | x | x | x | x |
| C31 | x | x | x | | x | x | x | |
| C32 | x | x | | x | | x | x | |
| C33 | | x | | x | | x | | x |
| C34 | x | | x | x | x | x | | x |
| C35 | x | | x | | x | | | x |
| C36 | | x | x | | | | x | x |
| C37 | x | | | | x | x | x | x |
| C38 | | x | x | | | x | x | x |
| C39 | | | | x | | | | x |
| C40 | | x | x | | x | | x | |
| D0 | x | x | | | | | x | x |
| D1 | | | | x | x | x | x | |
| D2 | x | x | | | x | x | | |
| D3 | | x | | | | | x | |
| D4 | | | | | | x | | x |
| D5 | x | | x | | | | | |
| D6 | | x | x | x | x | x | | |
| D7 | | | | | | x | x | x |
| D8 | | x | x | | | | | |
| D9 | x | x | x | x | | | x | |
| D10 | | | | | | | | x |
| D11 | | | x | | | | | |
| D12 | x | | | x | x | | x | |
| D13 | x | x | x | | | | x | |
| D14 | x | x | x | x | x | | x | x |
| D15 | | | x | x | | x | x | |
| D16 | | x | | | x | x | | |
| D17 | x | | x | x | | | x | |
| D18 | | | x | | | | x | |
| D19 | | | x | x | | x | | |
| D20 | | x | x | | x | x | x | |
| D21 | | | | x | x | | | |
| D22 | x | x | x | x | | x | x | x |
| D23 | x | x | | | | | | x |
| D24 | x | x | x | | x | x | x | x |
| D25 | x | | x | x | | x | x | |
| D26 | x | | x | | | x | | |
| D27 | x | | x | x | x | x | | |
| D28 | x | | | | x | | | x |
| D29 | x | | | | | x | x | |
| D30 | | x | x | | x | x | | |
| D31 | x | | | x | x | x | | |
| D32 | | x | x | x | x | x | | x |
| D33 | | | x | | | | x | x |
| D34 | | x | x | x | | x | | |
| D35 | | | x | | x | | x | x |
| D36 | x | x | x | x | x | | | x |
| D37 | | | x | | x | x | | |
| D38 | | | | x | x | | | x |
| D39 | | x | | x | | x | x | x |
| D40 | x | x | x | x | x | x | x | x |
| D41 | x | x | x | | | x | x | |
| D42 | x | x | | | x | x | | |
| D43 | | x | | | | x | | x |
| D44 | x | | x | | x | x | x | x |
| D45 | x | | x | | x | | | x |
| D46 | | | x | x | | | x | x |
| D47 | x | | | | x | x | | x |
| D48 | | x | x | | | x | x | |
| D49 | | | | x | | | | x |
| D50 | | x | x | x | x | | x | |
| D51 | x | x | | | | x | x | |
| D52 | | | | | x | x | | x |
| D53 | x | x | | | x | x | | |
| D54 | | x | | | | | x | |
| D55 | | | | | x | | | x |
| D56 | x | | x | | | | | |
| D57 | | x | x | x | | x | | |
| D58 | | | | | | x | x | |
| D59 | | x | x | | | | | |
| D60 | x | x | x | x | | | | x |
| D61 | | | | | | | | x |
| D62 | | x | | | | | | |
| D63 | x | | x | x | | x | | |
| D64 | x | x | x | | | x | | |
| D65 | x | x | x | x | x | | x | x |
| D66 | | x | x | | | x | x | |
| D67 | | x | | x | x | x | | |
| D68 | x | | x | x | | | x | |
| D69 | | | x | | | | x | |
| D70 | | | x | x | | | x | |
| D71 | | x | x | | | x | x | x |
| D72 | | | | x | x | x | | |
| D73 | x | x | x | x | | | x | x |
| D74 | x | x | | | | | | x |
| D75 | x | x | x | | x | x | x | x |
| D76 | x | | x | x | | | x | x |
| D77 | x | | x | | | x | | |
| D78 | | x | | x | x | x | | |
| D79 | x | | | | x | | | x |
| D80 | x | | | | | x | x | x |
| D81 | | x | x | | x | | x | |
| D82 | x | | | x | x | x | | |
| D83 | | x | x | x | x | x | | x |
| D84 | | | x | | | x | x | |
| D85 | | x | x | x | | x | | |
| D86 | | x | | | x | | x | x |
| D87 | x | | x | x | x | | | x |
| D88 | | x | | x | x | | | |
| D89 | | | x | x | | | | x |
| D90 | | x | | | | x | x | |
| D91 | x | x | x | x | x | x | x | x |
| D92 | x | x | x | | x | x | | |
| D93 | x | x | | x | | x | x | |
| D94 | | x | | x | | x | | |
| D95 | x | | x | | x | x | | x |
| D96 | x | | x | | x | | | x |
| D97 | | | x | x | | | x | |
| D98 | x | | | | x | x | x | |
| D99 | | x | x | | | x | x | x |
| D100 | | | | x | | | | x |
| D101 | | x | x | x | x | | x | |
| D102 | x | x | | | | x | x | |
| D103 | | | | | x | x | | x |
| D104 | x | x | | | x | x | | |
| D105 | | x | | | | | x | |
| D106 | | | | | | x | | x |
| D107 | x | | x | | | | | |
| D108 | | x | x | x | x | | x | |
| D109 | | | | | | | x | x |
| D110 | | x | x | | | | | |
| D111 | x | x | x | x | | | x | |
| D112 | | | | | | | | x |
| D113 | | | x | | | | | |
| D114 | x | | | x | x | | x | |
| D115 | x | x | x | | | x | | |
| D116 | x | x | x | | x | | x | x |
| D117 | | x | | | | x | x | |
| D118 | | x | | x | | x | x | |
| D119 | x | | | x | x | | | x |
| D120 | | x | | | | x | | |
| D121 | | x | | | | | x | |
| D122 | | | x | x | | x | x | |
| D123 | | | | x | x | | | |
| D124 | x | x | x | x | | x | x | x |
| D125 | x | x | | | | | | x |
| D126 | x | x | x | | x | x | x | x |
| D127 | x | | x | x | x | | | |

TABLE C-4

Syndrome S7 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| C0 | | | | | | | | x |
| C1 | x | | | | | | | |
| C2 | | x | x | x | | | x | |
| C3 | x | x | | | x | x | | x |
| C4 | | | | | x | | x | x |
| C5 | x | | | x | x | | | x |

TABLE C-4-continued

Syndrome S7 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| C6  | x |   |   | x |   |   |   |   |
| C7  |   | x |   | x |   | x | x | x |
| C8  |   | x | x |   | x |   |   |   |
| C9  |   | x | x | x | x |   | x | x |
| C10 | x | x | x |   | x | x | x | x |
| C11 | x |   |   |   |   |   |   | x |
| C12 |   | x |   | x | x | x | x | x |
| C13 |   |   | x | x | x | x | x | x |
| C14 | x |   |   |   | x | x |   |   |
| C15 | x |   |   | x | x | x |   |   |
| C16 | x | x |   | x | x |   |   | x |
| C17 |   |   | x | x | x |   | x |   |
| C18 |   | x |   | x |   | x | x |   |
| C19 |   |   |   |   | x |   | x | x |
| C20 |   |   |   | x | x |   |   | x |
| C21 |   | x | x | x |   |   |   | x |
| C22 |   | x | x | x |   | x | x |   |
| C23 | x |   |   |   |   |   |   | x |
| C24 | x | x | x | x |   |   | x |   |
| C25 | x |   | x | x |   | x |   | x |
| C26 | x | x |   |   | x | x |   |   |
| C27 | x |   | x |   |   | x |   | x |
| C28 |   |   | x |   |   | x |   |   |
| C29 | x |   | x |   |   | x | x | x |
| C30 |   |   |   |   | x | x | x | x |
| C31 |   | x |   |   |   |   | x | x |
| C32 | x |   |   | x |   | x |   |   |
| C33 |   | x | x |   |   | x | x | x |
| C34 | x | x |   | x | x |   | x |   |
| C35 |   | x | x |   |   |   |   |   |
| C36 | x |   | x | x |   |   | x | x |
| C37 |   |   |   | x |   |   |   |   |
| C38 |   | x |   |   |   | x |   | x |
| C39 | x | x | x |   |   | x |   |   |
| C40 |   | x | x |   | x | x |   |   |
| D0  |   | x |   | x | x |   |   | x |
| D1  |   |   |   | x |   | x |   |   |
| D2  |   | x | x |   | x |   |   |   |
| D3  |   |   |   |   | x | x | x |   |
| D4  | x | x | x | x |   | x | x | x |
| D5  |   | x | x | x |   |   | x | x |
| D6  |   | x | x | x |   |   |   | x |
| D7  |   | x | x |   | x |   |   | x |
| D8  |   | x | x |   | x |   |   | x |
| D9  | x |   |   |   | x | x | x |   |
| D10 | x |   |   |   | x |   | x |   |
| D11 | x |   | x |   | x |   |   |   |
| D12 |   | x |   |   | x | x |   |   |
| D13 | x | x |   | x |   | x | x | x |
| D14 | x | x | x | x | x |   |   | x |
| D15 | x | x |   | x | x |   |   |   |
| D16 | x | x |   | x | x |   | x |   |
| D17 | x | x |   | x |   |   | x | x |
| D18 | x | x |   |   |   |   | x | x |
| D19 |   | x | x |   | x |   | x |   |
| D20 | x |   | x |   |   | x | x |   |
| D21 | x |   |   |   | x | x | x | x |
| D22 |   |   | x | x |   |   |   | x |
| D23 |   | x |   |   | x | x |   | x |
| D24 |   |   | x | x | x |   | x | x |
| D25 |   | x | x | x |   | x | x |   |
| D26 | x | x | x | x |   |   |   |   |
| D27 | x |   |   |   |   | x |   |   |
| D28 |   |   | x |   | x |   |   |   |
| D29 |   |   | x | x | x | x |   |   |
| D30 |   |   |   |   | x | x |   |   |
| D31 | x | x | x |   | x | x | x |   |
| D32 |   |   |   |   |   | x |   |   |
| D33 |   |   | x |   | x | x |   | x |
| D34 | x |   | x | x |   | x |   |   |
| D35 | x |   |   | x | x |   | x | x |
| D36 |   |   | x |   | x | x |   | x |
| D37 |   | x |   |   | x |   | x |   |
| D38 |   |   |   |   | x | x |   | x |
| D39 |   | x | x |   | x |   | x | x |
| D40 |   | x | x | x |   |   |   |   |
| D41 | x | x | x |   |   | x |   | x |
| D42 | x | x | x | x |   |   |   | x |
| D43 |   |   | x |   | x |   |   | x |
| D44 | x |   | x | x | x | x | x |   |
| D45 |   | x | x | x | x | x | x |   |
| D46 |   |   | x |   | x |   | x | x |
| D47 |   |   |   | x |   | x |   | x |
| D48 | x |   |   | x | x |   | x | x |
| D49 |   | x | x | x |   | x |   |   |
| D50 | x |   |   | x |   | x | x |   |
| D51 |   |   |   | x |   | x | x |   |
| D52 |   | x |   | x |   |   | x |   |
| D53 | x | x | x |   |   |   | x |   |
| D54 | x | x | x |   |   | x | x |   |
| D55 |   |   | x |   | x | x | x | x |
| D56 | x | x |   |   | x |   |   | x |
| D57 |   | x | x | x | x | x | x | x |
| D58 | x |   | x | x |   |   | x | x |
| D59 |   | x | x |   |   | x | x |   |
| D60 |   | x |   |   |   |   | x |   |
| D61 |   | x | x |   |   |   | x | x |
| D62 |   |   | x | x | x | x |   |   |
| D63 | x |   |   |   |   |   | x | x |
| D64 |   |   |   |   |   | x |   | x |
| D65 | x | x |   | x | x |   | x |   |
| D66 | x |   |   | x |   | x | x | x |
| D67 | x | x |   |   |   |   |   |   |
| D68 |   | x |   |   | x |   | x | x |
| D69 |   |   | x |   |   |   |   |   |
| D70 | x |   |   |   | x |   | x |   |
| D71 | x | x | x |   | x |   | x | x |
| D72 | x | x |   | x | x |   |   |   |
| D73 | x |   | x | x |   |   | x |   |
| D74 |   |   | x |   |   | x |   |   |
| D75 | x | x |   | x |   |   |   |   |
| D76 |   |   |   |   | x | x | x |   |
| D77 | x | x |   |   |   |   | x | x |
| D78 | x | x | x |   |   | x | x |   |
| D79 | x |   | x | x |   | x | x |   |
| D80 | x | x |   | x |   | x | x |   |
| D81 | x | x |   | x |   |   | x |   |
| D82 |   |   | x |   |   | x | x | x |
| D83 |   |   | x |   | x | x |   | x |
| D84 |   | x | x | x | x | x |   | x |
| D85 | x |   |   | x | x |   | x |   |
| D86 | x |   |   |   |   | x | x |   |
| D87 | x | x |   | x | x | x | x | x |
| D88 |   |   | x |   | x | x | x |   |
| D89 |   |   | x | x |   | x | x |   |
| D90 | x |   |   |   | x | x | x |   |
| D91 |   | x | x |   | x |   | x |   |
| D92 | x |   | x |   | x |   | x |   |
| D93 |   |   | x | x |   |   |   | x |
| D94 |   |   | x | x |   |   | x | x |
| D95 |   | x | x |   |   | x |   |   |
| D96 | x |   |   | x | x | x | x |   |
| D97 | x | x | x | x |   | x | x |   |
| D98 | x | x |   | x | x | x | x |   |
| D99 | x | x |   |   |   | x | x | x |
| D100 |   |   | x |   |   | x |   | x |
| D101 |   |   | x |   | x |   |   |   |
| D102 |   |   | x | x | x | x | x |   |
| D103 |   |   |   |   | x | x |   |   |
| D104 | x | x | x | x |   |   |   | x |
| D105 |   |   |   |   |   | x |   |   |
| D106 |   | x |   | x | x |   | x |   |
| D107 | x | x | x |   |   | x |   | x |
| D108 |   |   |   | x | x |   | x | x |
| D109 |   | x |   | x | x |   |   |   |
| D110 | x |   |   | x |   |   | x |   |
| D111 |   |   |   | x | x |   | x |   |
| D112 | x | x |   | x | x |   | x |   |
| D113 | x | x | x |   |   |   |   |   |
| D114 | x | x |   |   |   |   |   | x |
| D115 | x | x |   |   | x |   | x | x |
| D116 |   | x |   |   | x |   | x |   |
| D117 |   | x |   | x |   |   |   | x |
| D118 | x | x | x | x | x | x |   |   |
| D119 |   | x | x |   | x |   | x |   |
| D120 |   |   | x |   | x |   |   | x |
| D121 |   |   |   | x |   |   |   | x |
| D122 | x | x | x |   | x |   |   |   |

TABLE C-4-continued

Syndrome S7 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| D123 |   | x | x | x |   | x |   | x |
| D124 |   |   | x |   | x | x |   |   |
| D125 |   | x | x |   |   | x |   |   |
| D126 | x | x | x |   |   | x |   | x |
| D127 | x | x | x | x |   | x |   | x |

TABLE C-5

Syndrome S9 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| C0 |   |   |   |   |   |   |   | x |
| C1 |   | x |   | x | x |   | x |   |
| C2 | x | x | x |   |   |   | x | x |
| C3 | x |   |   | x | x | x |   | x |
| C4 |   | x |   | x |   |   |   | x |
| C5 |   |   | x | x |   | x |   |   |
| C6 |   |   |   | x | x | x |   |   |
| C7 |   | x | x | x | x |   | x | x |
| C8 | x | x |   | x |   |   | x | x |
| C9 |   | x | x |   |   | x |   | x |
| C10 | x |   |   |   | x |   |   | x |
| C11 |   |   | x | x |   | x |   | x |
| C12 |   | x |   | x |   | x |   |   |
| C13 | x |   |   | x | x |   |   |   |
| C14 |   | x |   | x |   |   | x | x |
| C15 |   |   | x | x | x |   |   |   |
| C16 | x |   | x | x | x | x |   | x |
| C17 |   |   | x | x |   | x | x | x |
| C18 |   |   | x | x | x | x | x | x |
| C19 |   | x |   | x |   | x | x | x |
| C20 |   |   | x | x |   | x |   | x |
| C21 | x |   | x |   |   | x |   | x |
| C22 | x |   |   |   | x |   |   |   |
| C23 |   | x | x |   | x | x | x | x |
| C24 | x |   | x | x |   | x | x | x |
| C25 |   |   |   |   | x |   |   | x |
| C26 |   |   | x | x | x |   |   | x |
| C27 |   |   |   | x | x |   |   |   |
| C28 | x |   | x | x |   |   | x | x |
| C29 |   | x |   |   |   |   |   |   |
| C30 | x | x | x |   |   |   | x |   |
| C31 |   |   | x | x |   | x | x |   |
| C32 | x |   | x | x | x |   | x |   |
| C33 | x |   |   | x |   |   |   |   |
| C34 | x | x |   | x | x | x |   |   |
| C35 | x | x | x | x |   | x | x |   |
| C36 | x | x | x |   |   |   |   | x |
| C37 |   |   | x |   | x |   |   | x |
| C38 | x |   | x |   |   |   | x | x |
| C39 |   |   | x |   |   |   | x | x |
| C40 | x |   |   | x | x | x |   |   |
| D0 |   |   | x |   |   | x |   | x |
| D1 | x | x |   | x |   | x | x | x |
| D2 | x |   | x |   |   | x |   | x |
| D3 |   | x | x |   |   | x |   | x |
| D4 | x | x | x | x | x | x |   | x |
| D5 |   | x | x |   | x |   | x | x |
| D6 | x | x | x | x |   |   | x | x |
| D7 | x | x | x | x | x | x | x |   |
| D8 |   |   | x | x |   |   |   | x |
| D9 |   |   | x |   |   |   |   | x |
| D10 |   | x | x |   |   |   | x | x |
| D11 |   | x | x | x | x |   |   |   |
| D12 |   |   | x |   |   | x |   | x |
| D13 |   | x | x |   |   | x | x | x |
| D14 |   |   |   |   |   | x | x | x |
| D15 | x |   | x | x |   | x | x | x |
| D16 |   |   |   |   |   | x |   |   |
| D17 | x |   |   |   | x |   | x |   |
| D18 | x | x |   |   | x |   | x | x |
| D19 |   | x |   | x | x |   |   | x |
| D20 |   |   |   | x |   |   | x |   |
| D21 | x |   |   | x |   | x |   | x |
| D22 |   | x | x | x |   |   |   |   |
| D23 | x |   | x |   | x | x | x | x |
| D24 | x |   |   | x |   | x | x | x |
| D25 |   | x |   | x |   | x | x | x |
| D26 | x | x |   | x | x | x |   |   |

TABLE C-5-continued

Syndrome S9 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| D27 | x |   |   |   |   | x |   | x |
| D28 | x |   | x | x | x | x | x |   |
| D29 |   | x | x | x |   | x |   |   |
| D30 | x | x | x |   |   | x |   |   |
| D31 |   | x |   |   | x |   | x | x |
| D32 |   | x | x | x |   |   |   | x |
| D33 | x | x | x | x |   | x |   | x |
| D34 |   | x |   | x |   | x |   | x |
| D35 | x | x |   |   |   |   | x |   |
| D36 | x |   |   | x |   | x |   | x |
| D37 | x |   |   | x | x |   |   | x |
| D38 | x | x |   | x | x |   | x |   |
| D39 |   |   |   | x | x | x | x |   |
| D40 |   | x |   |   |   |   |   | x |
| D41 |   |   | x |   | x |   |   |   |
| D42 | x | x | x | x | x |   |   |   |
| D43 | x | x |   |   |   |   |   |   |
| D44 |   |   |   |   |   |   |   | x |
| D45 |   | x |   | x |   |   | x |   |
| D46 | x | x | x |   |   |   | x | x |
| D47 | x |   |   | x | x |   | x |   |
| D48 |   | x |   |   | x |   |   | x |
| D49 |   |   | x | x |   | x |   |   |
| D50 |   |   |   |   | x | x |   |   |
| D51 |   | x | x | x | x |   | x | x |
| D52 | x | x |   |   | x |   | x | x |
| D53 |   | x | x |   |   | x |   | x |
| D54 | x |   |   |   | x |   |   | x |
| D55 |   | x | x |   | x |   |   | x |
| D56 |   | x |   | x |   | x |   |   |
| D57 | x |   |   |   |   | x | x |   |
| D58 |   | x |   |   | x |   | x | x |
| D59 |   | x |   | x | x |   |   |   |
| D60 | x |   | x | x | x |   |   | x |
| D61 |   | x | x | x |   |   | x | x |
| D62 |   | x |   | x |   |   | x | x |
| D63 |   | x |   | x |   |   | x | x |
| D64 |   |   | x | x |   |   | x | x |
| D65 | x |   | x |   |   | x |   | x |
| D66 | x |   |   |   |   | x |   |   |
| D67 |   | x |   |   | x | x | x | x |
| D68 | x |   | x |   | x |   | x | x |
| D69 |   |   |   |   |   | x | x | x |
| D70 |   |   |   | x | x | x | x | x |
| D71 |   |   |   |   | x | x |   |   |
| D72 | x |   | x |   | x |   |   | x | x |
| D73 |   | x |   |   |   |   |   |   |
| D74 | x | x | x |   |   | x |   |   |
| D75 |   |   | x | x |   | x | x |   |
| D76 | x |   | x | x | x |   | x |   |
| D77 | x |   |   | x |   |   |   |   |
| D78 | x | x |   |   | x | x | x |   |
| D79 | x | x | x | x |   | x | x | x |
| D80 | x | x | x |   |   |   |   | x |
| D81 |   |   | x |   | x |   |   | x |
| D82 | x |   | x |   |   |   | x |   |
| D83 |   |   | x |   |   |   | x | x |
| D84 | x |   |   |   | x | x | x |   |
| D85 |   |   |   | x |   |   | x | x |
| D86 | x | x |   | x |   |   | x | x |
| D87 | x |   |   | x |   |   | x | x |
| D88 |   |   | x | x |   |   | x |   |
| D89 |   | x | x | x | x | x | x | x |
| D90 |   |   | x | x |   | x | x | x |
| D91 | x |   | x | x | x |   |   | x |
| D92 | x |   | x | x | x | x |   |   |
| D93 |   |   | x | x |   |   |   | x |
| D94 |   |   | x |   | x |   |   |   |
| D95 |   | x | x |   |   |   | x |   |
| D96 |   | x | x | x | x |   |   |   |
| D97 |   |   |   | x |   |   | x |   |
| D98 |   | x |   |   |   | x | x |   |
| D99 |   |   |   |   |   |   | x | x |
| D100 | x | x | x |   |   | x | x |   |
| D101 |   |   |   |   |   | x |   |   |
| D102 | x |   |   |   |   | x |   | x |
| D103 | x | x |   |   | x |   | x | x |
| D104 |   | x |   |   | x | x |   |   |
| D105 |   |   |   |   | x |   |   | x |

TABLE C-5-continued

Syndrome S9 contributions of CHECK and DATA bits in GF($2^8$)

| BIT | $\alpha^7$ | $\alpha^6$ | $\alpha^5$ | $\alpha^4$ | $\alpha^3$ | $\alpha^2$ | $\alpha$ | 1 |
|---|---|---|---|---|---|---|---|---|
| D106 | x |   |   |   | x | x |   | x |
| D107 |   | x | x | x |   |   |   |   |
| D108 | x |   | x |   | x | x | x | x |
| D109 | x |   | x | x |   | x | x |   |
| D110 |   | x |   | x | x | x | x | x |
| D111 | x | x | x | x | x | x |   |   |
| D112 | x |   |   |   |   | x |   | x |
| D113 | x | x | x | x | x |   | x |   |
| D114 |   | x | x | x |   | x |   |   |
| D115 | x | x | x |   | x |   | x |   |
| D116 |   | x |   |   | x | x |   | x |
| D117 |   | x | x | x |   |   |   | x |
| D118 | x | x | x | x |   | x |   | x |
| D119 |   | x |   | x |   | x |   | x |
| D120 | x | x |   |   |   |   | x |   |
| D121 |   |   | x | x |   | x |   | x |
| D122 | x |   | x | x |   |   |   | x |
| D123 | x | x | x | x |   | x |   |   |
| D124 |   |   |   |   | x | x | x | x |
| D125 |   |   | x |   |   |   |   | x |
| D126 |   |   | x |   | x |   |   |   |
| D127 | x | x | x | x | x |   |   |   |

What is claimed is:

1. A data formatting apparatus comprising:
an array of a plurality of memory elements arranged in a first plurality of rows and a second plurality of columns, each of said memory elements further comprising:
a memory cell; and
a multiplexer having at least two inputs, an output terminal coupled to the memory cells and a control terminal fed by control signals for selectively coupling one of said inputs to said output;
wherein cells of said array of memory elements in a first column of said second plurality of columns have one of the inputs of each multiplexer of said cells coupled to an external terminal of said array and with succeeding columns of said cells having one of the inputs of the multiplexer of each element coupled to a corresponding cell in a succeeding one of said columns of cells, and with cells in a first row of said first plurality of rows having one of the inputs of the multiplexer of each of said cells coupled to an external terminal of said array and with succeeding rows of said cells having an input of the multiplexer of each of said cells coupled to a corresponding cell in a succeeding one of said rows of cells; and
means for providing said control signals to the multiplexer of each element to chose which input of said multiplexer is coupled to the memory cell.

2. The data formatter apparatus according to claim 1 wherein said array has a first portion of said first plurality of rows of said elements having elements in all of said second plurality of columns of said elements and a second portion of said first plurality of rows not having any elements in a portion of said second plurality of columns.

3. The data formatting apparatus as recited in claim 1, wherein the memory cell is a flip-flop circuit.

4. The data formatting apparatus as recited in claim 1, wherein a portion of said multiplexers have at least three inputs, with one of said inputs being coupled to an external terminal of the array, a second one of said inputs coupled to a succeeding cell in the same column of cells as said element, and a third one of said inputs coupled to a preceding cell in the same row of cells of said element.

5. The array as recited in claim 1 wherein said control means further comprises:
means responsive to control signals representing the width of the data buses coupled to inputs and outputs of said array for providing said control signals to the multiplexer in each of said memory elements.

6. The array as recited in claim 5, wherein the means comprises:
a sequence counter;
a register coupled to outputs of said sequence counter; and
a programmable logic array responsive to said control signals representing the width of data buses coupled to said array, wherein said programmable logic array is controlled by said sequence counter which provides output signals that are sequentially clocked into said register to provide said control signals to the multiplexer of each memory element.

* * * * *